United States Patent
Wang et al.

(10) Patent No.: US 12,438,041 B2
(45) Date of Patent: Oct. 7, 2025

(54) INTERCONNECT STRUCTURE AND METHOD OF FORMING THE SAME

(71) Applicant: Taiwan Semiconductor Manufacturing Co., Ltd., Hsinchu (TW)

(72) Inventors: Wei-Ren Wang, New Taipei (TW); Jen Hung Wang, Zhubei (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 604 days.

(21) Appl. No.: 17/720,899

(22) Filed: Apr. 14, 2022

(65) Prior Publication Data
US 2023/0335436 A1   Oct. 19, 2023

(51) Int. Cl.
*H01L 21/768* (2006.01)
*H01L 23/522* (2006.01)
*H01L 23/532* (2006.01)

(52) U.S. Cl.
CPC .... *H01L 21/76832* (2013.01); *H01L 23/5226* (2013.01); *H01L 23/5329* (2013.01)

(58) Field of Classification Search
CPC ........... H01L 21/76832; H01L 23/5226; H01L 23/5329
See application file for complete search history.

(56) References Cited

U.S. PATENT DOCUMENTS

| | | | |
|---|---|---|---|
| 11,929,281 B2 * | 3/2024 | Chou | H01L 21/76816 |
| 2017/0140979 A1 * | 5/2017 | Lin | H01L 23/5222 |
| 2017/0358481 A1 * | 12/2017 | Lin | H01L 21/76834 |
| 2018/0005876 A1 | 1/2018 | Tung et al. | |
| 2021/0265264 A1 * | 8/2021 | Chou | H01L 23/5226 |
| 2022/0189818 A1 * | 6/2022 | Al-Amoody | H01L 23/485 |
| 2022/0199516 A1 * | 6/2022 | Chebiam | H01L 23/528 |
| 2022/0238689 A1 * | 7/2022 | Yoon | H01L 29/0649 |
| 2022/0262738 A1 * | 8/2022 | Lee | H01L 23/53266 |
| 2022/0310441 A1 * | 9/2022 | Su | H01L 21/7682 |
| 2022/0310814 A1 * | 9/2022 | Hsiung | H01L 21/76897 |
| 2022/0319989 A1 * | 10/2022 | Li | H01L 23/53238 |
| 2022/0319990 A1 * | 10/2022 | Huang | H01L 21/7682 |
| 2022/0406720 A1 * | 12/2022 | Hinoue | H01L 29/40117 |
| 2022/0415781 A1 * | 12/2022 | Yan | H01L 21/76802 |
| 2022/0415782 A1 * | 12/2022 | Choi | H01L 27/092 |
| 2023/0012516 A1 * | 1/2023 | Hwang | H01L 29/42392 |
| 2023/0022545 A1 * | 1/2023 | Lee | H01L 21/76832 |
| 2023/0033803 A1 * | 2/2023 | Fukuzumi | H01L 21/76897 |
| 2023/0047679 A1 * | 2/2023 | Park | H01L 23/5226 |

(Continued)

FOREIGN PATENT DOCUMENTS

TW     I608582 B     12/2017

*Primary Examiner* — Nathan W Ha
(74) *Attorney, Agent, or Firm* — Slater Matsil, LLP

(57) ABSTRACT

A semiconductor device includes a first conductive feature, a first dielectric layer over the first conductive feature, a second conductive feature extending through the first dielectric layer, an air gap between the first dielectric layer and the second conductive feature, and an etch stop layer over the second conductive feature and the first dielectric layer. The etch stop layer covers the air gap, and the air gap extends above a bottommost surface of the etch stop layer.

20 Claims, 47 Drawing Sheets

(56) References Cited

U.S. PATENT DOCUMENTS

| | | | |
|---|---|---|---|
| 2023/0090951 A1* | 3/2023 | Rajashekhar | H01L 23/5329 257/253 |
| 2023/0110073 A1* | 4/2023 | Xie | H01L 27/0886 257/288 |
| 2023/0197603 A1* | 6/2023 | Chen | H01L 21/76804 257/758 |
| 2023/0253245 A1* | 8/2023 | Hsu | H01L 21/76831 257/774 |

* cited by examiner

INTERCONNECT STRUCTURE AND METHOD OF FORMING THE SAME

BACKGROUND

High-density integrated circuits, such as Very Large Scale Integration (VLSI) circuits, are typically formed with multiple metal interconnects to serve as three-dimensional wiring line structures. The purpose of the multiple interconnects is to properly link densely packed devices together. With increasing levels of integration, a parasitic capacitance effect between the metal interconnects, which leads to RC delay and cross-talk, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

As feature sizes continue to shrink in advanced semiconductor manufacturing process, new challenges arise for semiconductor manufacturing. There is a need in the art for structures and methods for interconnect structures that are suitable for advanced semiconductor manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
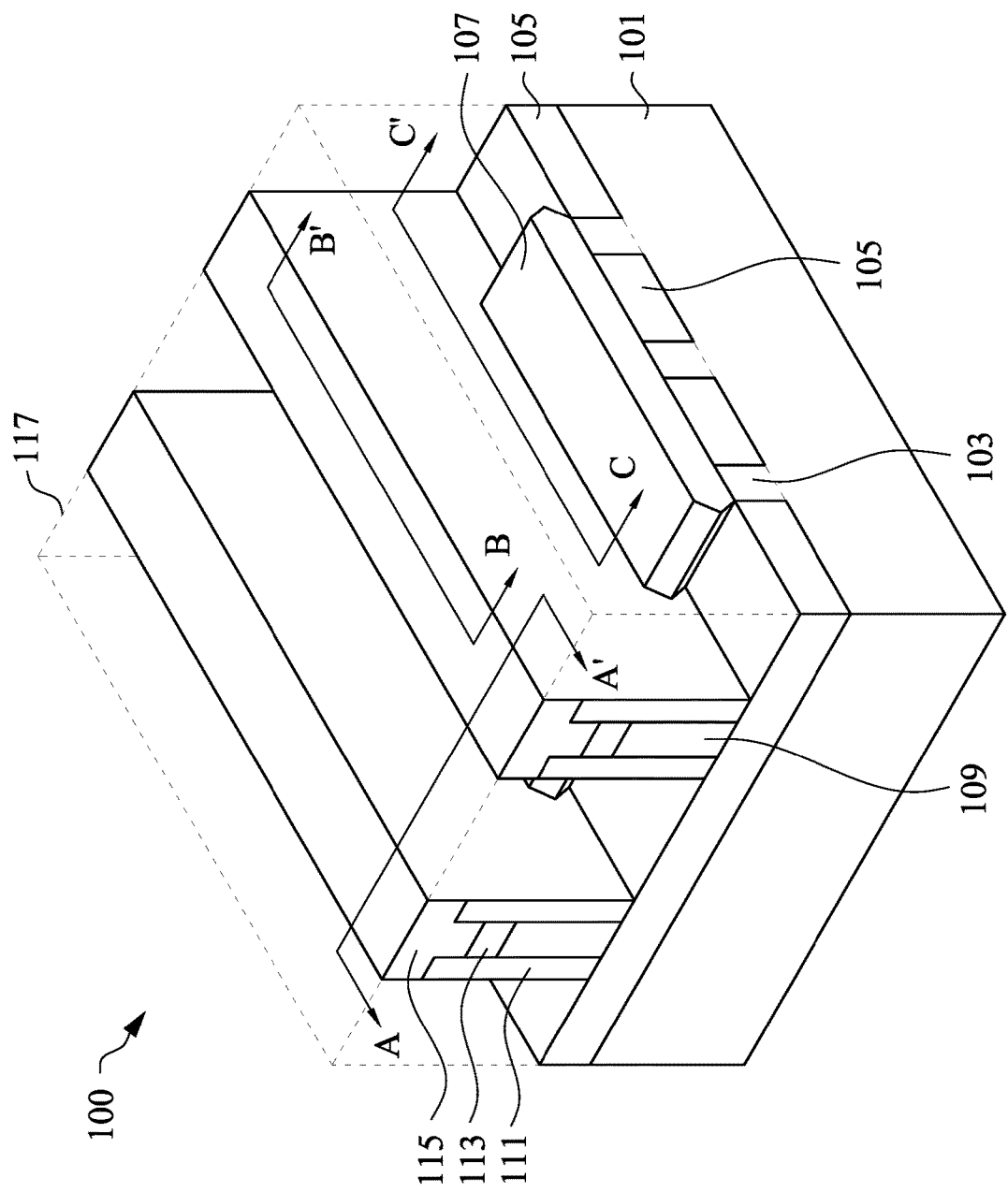
FIG. 1A illustrates a three-dimensional view of a semiconductor device at an intermediate stage of manufacturing, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of interconnect structures include air gaps formed over or adjacent to conductive features. Including air gaps between adjacent conductive features is beneficial to decrease coupling capacitance between the conductive features because the dielectric constant of air (e.g., around 1) is significantly less than the dielectric constant of solid low-k dielectric materials (e.g., around 3 to 4). The air gaps may be formed over or adjacent to conductive features by the selective deposition of inhibitor caps on the conductive features that are removed after a subsequent deposition of dielectric material (e.g., etch stop layer material) that seals the air gaps. Reduction of coupling capacitance may improve device performance by reducing RC delay.

Embodiments are described below in a particular context, a die comprising fin field effect transistors (FinFETs). Various embodiments may be applied, however, to dies comprising other types of transistors (e.g., nano-FETs, planar transistors, or the like), or other types of integrated circuit devices (e.g., resistors, capacitors, diodes, or the like), in lieu of or in combination with the FinFETs.

Figure 1B:
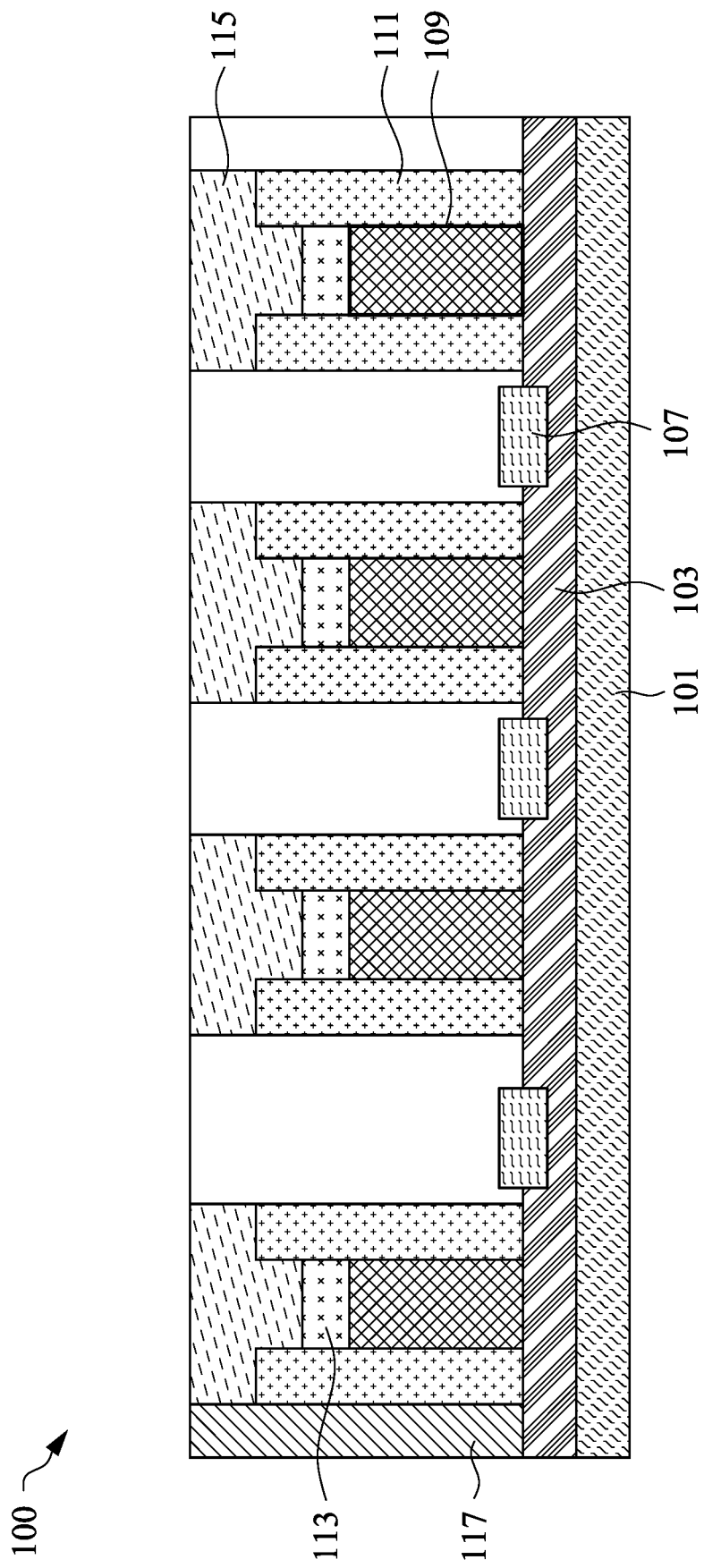
FIGS. 1B, 1C, and 1D illustrate cross-sectional views of a semiconductor device at an intermediate stage of manufacturing, in accordance with some embodiments.
Figure 1C:
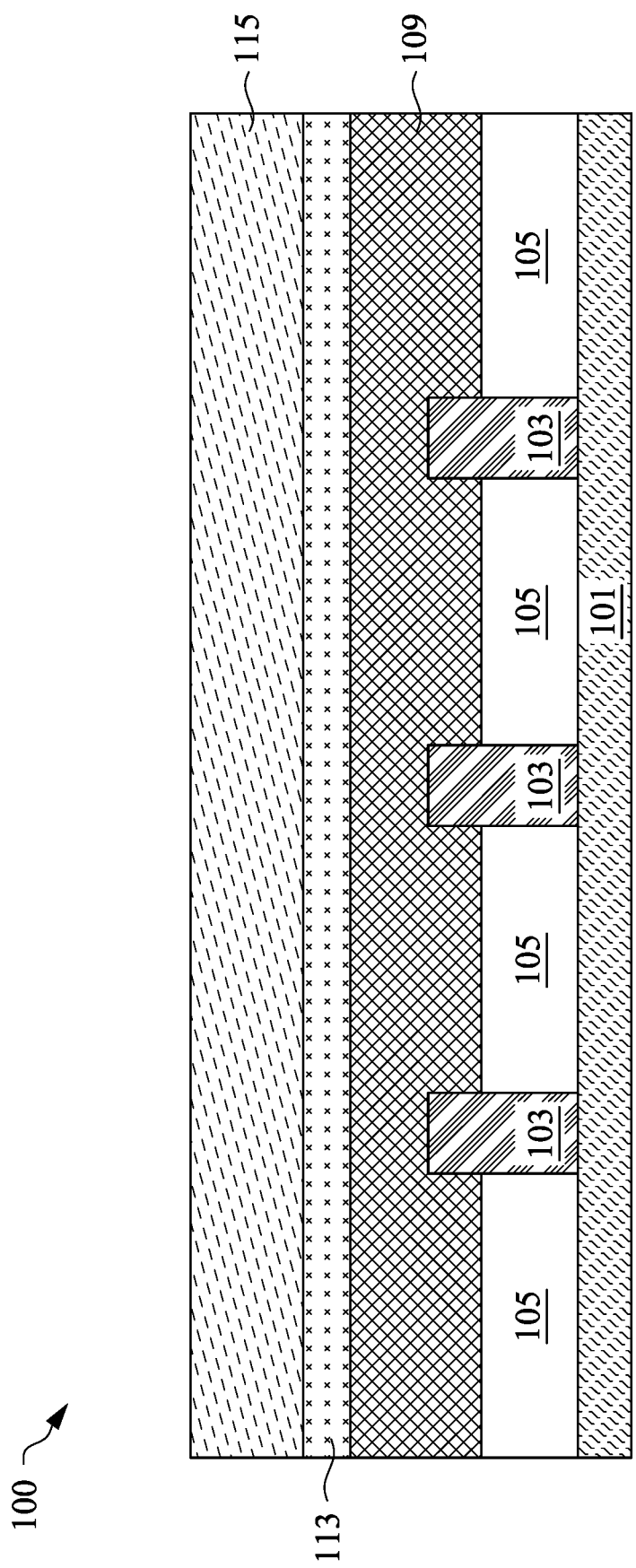
Figure 1D:
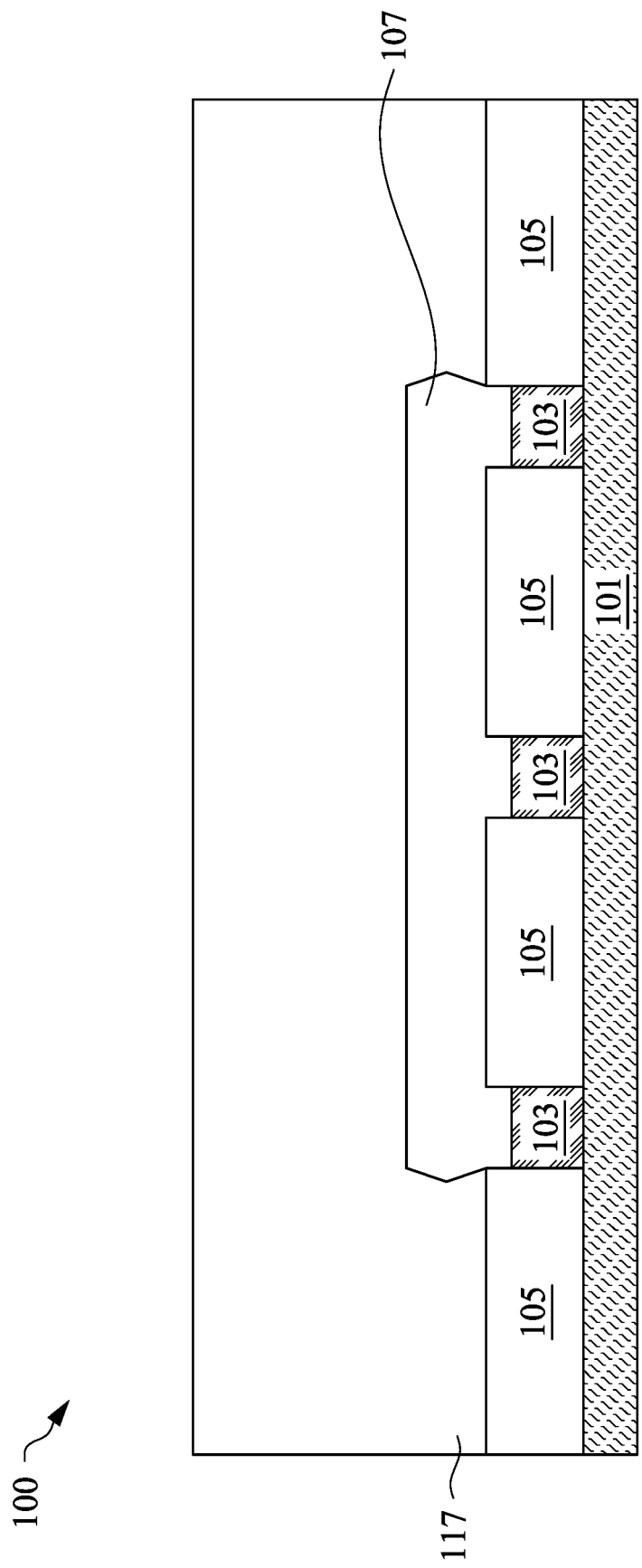
Figure 1E:
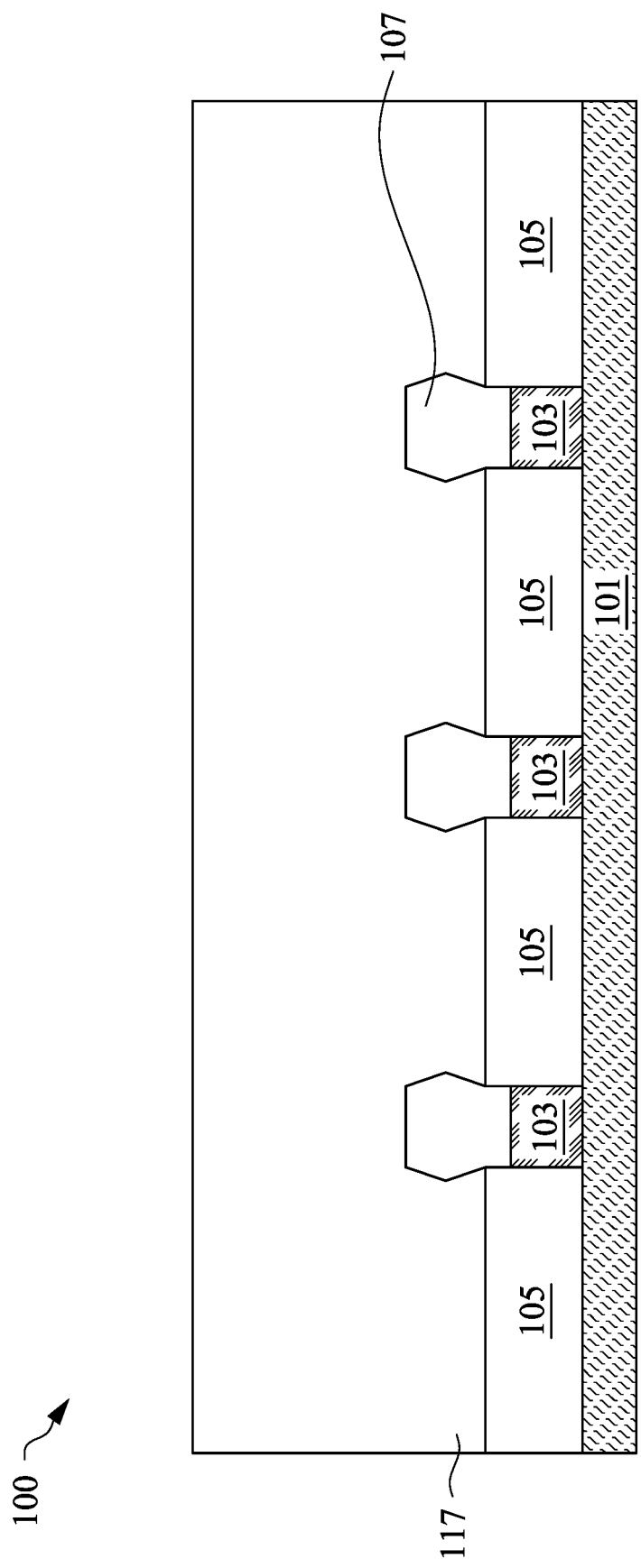
FIG. 1E illustrates a cross-sectional view of a semiconductor device at an intermediate stage of manufacturing, in accordance with some embodiments.

FIG. 1A illustrates a perspective view of a semiconductor device 100 such as a FinFET device, in accordance with some embodiments. FIG. 1B illustrates a cross-sectional view of the semiconductor device 100 along line A-A', FIG. 1C illustrates a cross-sectional view of the semiconductor device 100 along line B-B', and FIGS. 1D and 1E illustrate cross-sectional views of the semiconductor device 100 along line C-C', in accordance with some embodiments. The semiconductor device 100 may be a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

In the embodiments in which the device wafer is utilized, the semiconductor device 100 includes a semiconductor substrate 101 (also referred to as a substrate). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium, gallium arsenic phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used.

Electrical components, such as transistors, resistors, capacitors, inductors, diodes, or the like, are formed in or on the semiconductor substrate 101, e.g., in the front-end-of-line (FEOL) processing of semiconductor manufacturing. In the example of FIGS. 1A-1D, semiconductor fins 103 (also referred to as fins) are formed protruding above the semiconductor substrate 101. Isolation regions 105, such as shallow-trench isolation (STI) regions, are formed between or around the semiconductor fins 103 using, for example, a deposition process followed by a planarization process and recessing of the deposited material.

After the isolation regions 105 have been formed, a dummy gate dielectric (not explicitly illustrated), a dummy gate electrode (not explicitly illustrated) over the dummy gate dielectric, and gate spacers 111 may be formed over each of the semiconductor fins 103. In some embodiments, the dummy gate dielectric may be formed by thermal oxidation, chemical vapor deposition, sputtering, or any other methods known and used in the art for forming a gate dielectric. The dummy gate dielectric may comprise a material such as silicon dioxide, silicon oxynitride, and/or a high-k material. However, any suitable material may be used for the dummy gate dielectric. The dummy gate electrode may comprise a conductive material and may be selected from a group comprising of polysilicon, tungsten, aluminum, copper, titanium, titanium aluminum nitride, tantalum carbide, tantalum carbonitride, tantalum silicon nitride, manganese, zirconium, titanium nitride, tantalum, tantalum nitride, cobalt, nickel, combinations of these, or the like. The dummy gate electrode may be deposited by chemical vapor deposition (CVD), sputter deposition, or other techniques known and used in the art for depositing conductive materials.

Once formed, the dummy gate dielectric and the dummy gate electrode may be patterned to form a series of stacks over the semiconductor fins 103. The stacks define multiple channel regions located on each side of the semiconductor fins 103 beneath the dummy gate dielectric. The stacks may be formed by depositing and patterning a gate mask on the dummy gate electrode using, for example, deposition and photolithography techniques known in the art. The gate mask may incorporate masking and sacrificial materials, such as (but not limited to) silicon oxide, silicon oxynitride, silicon oxycarbonitride, silicon carbide, silicon oxycarbide, and/or silicon nitride. The dummy gate electrode and the dummy gate dielectric may be etched using a dry etching process to form the patterned stacks.

Once the stacks have been patterned, the gate spacers 111 may be formed. The gate spacers 111 may be formed on opposing sides of the stacks. The gate spacers 111 may be formed, for example, by blanket depositing a spacer layer (not separately illustrated in FIGS. 1A and 1B) on the previously formed structure. The spacer layer may comprise silicon oxide, silicon oxynitride, silicon oxycarbonitride, silicon carbide, silicon oxycarbide, silicon nitride, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the isolation regions 105. In some embodiments, the gate spacers 111 comprise multiple spacer layers, such as e.g. gate seal spacers and one or more gate spacer layers. The gate spacers 111 may then be patterned, such as by one or more etches to remove the spacer layer from the horizontal surfaces of the structure, to form the gate spacers 111.

After the formation of the gate spacers 111, portions of the semiconductor fins 103 from those areas not protected by the stacks and the gate spacers 111 are removed. The removal of the semiconductor fins 103 from those areas not protected by the stacks and the gate spacers 111 may be performed by a reactive ion etch (RIE) using the stacks and the gate spacers 111 as hard masks, or by any other suitable removal process. The removal may be continued until the semiconductor fins 103 are either planar with (as illustrated in FIG. 1A or below the surface of the isolation regions 105 (as illustrated in FIGS. 1D and 1E).

Subsequently, source/drain region 107 may be formed in removed portions of the semiconductor fins 103 (see FIGS. 1D and 1E). In some embodiments, the source/drain regions 107 are grown to form a stressor that will impart a stress to the channel regions of the semiconductor fins 103 located underneath the stacks. In some embodiments wherein the semiconductor fins 103 comprise silicon and the FinFET is a p-type device, the source/drain regions 107 are grown through a selective epitaxial process with a material, such as silicon or silicon germanium, that has a different lattice constant than the channel regions.

As a result of the epitaxy processes used to form the source/drain regions 107, upper surfaces of the source/drain regions 107 have facets which expand laterally outward beyond sidewalls of the fins 103. In some embodiments, these facets cause adjacent source/drain regions 107 of a same FinFET to merge as illustrated by FIGS. 1A and 1D. In other embodiments, adjacent source/drain regions 107 remain separated after the epitaxy process is completed as illustrated by FIG. 1E.

Next, a first inter-layer dielectric (ILD) layer 117 (illustrated in dashed lines in FIG. 1A in order to more clearly illustrate the underlying structures) may be formed over the stacks and the source/drain regions 107. The first ILD layer 117 may comprise a material such as silicon oxide, phosphosilicate glass (PSG), borosilicate glass (BSG), boron-doped phosphosilicate glass (BPSG), fluorine-doped silicate glass (FSG), silicon oxide formed using a tetraethyl orthosilicate (TEOS) precursor, or the like. The first ILD layer 117 may be formed using spin coating, Flowable Chemical Vapor Deposition (FCVD), Plasma Enhanced Chemical Vapor Deposition (PECVD), Low Pressure Chemical Vapor Deposition (LPCVD), or the like, although any suitable dielectrics may be used. Once formed, the first ILD layer 117 may be planarized with the gate spacers 111 using, e.g., a planarization process such as a chemical mechanical polishing process, although any suitable process may be utilized.

After the planarization of the first ILD layer 117, the material of the dummy gate electrode and the dummy gate dielectric may be removed, forming openings between the gate spacers 111 exposing the channel regions of semiconductor fins 103. In some embodiments the dummy gate electrode and the dummy gate dielectric may be removed using, e.g., wet or dry etching processes that utilizes etchants that are selective to the material of the dummy gate electrode and the dummy gate dielectric. In one embodiment the dummy gate electrode may be removed using a wet etchant such as dilute hydrofluoric acid and hydrogen peroxide. However, any suitable removal process may be utilized.

Next, gate structures 109 are formed over the channel regions of the semiconductor fins 103 in the openings between the gate spacers 111. Each of the gate structures 109 may be, e.g., a metal gate structure that includes a gate electrode, work function layer(s) around the gate electrode, and a gate dielectric layer around the work function layer(s). In some embodiments, the gate dielectric layers comprise one or more dielectric layers, such as one or more layers of silicon oxide, silicon nitride, metal oxide, metal silicate, or the like. The gate electrodes may include a metal-containing material such as titanium nitride, titanium oxide, tantalum nitride, tantalum carbide, copper, cobalt, ruthenium, aluminum, tungsten, combinations thereof, or multi-layers thereof. For example, although a single layer gate electrode is illustrated in FIGS. 1A-1C, the gate electrode may comprise any number of liner layers, any number of work function tuning layers, a fill material, and a capping layer 113.

A capping layer 113 (e.g., a layer of tungsten) may be formed over the liner layer(s) (if present), the work function tuning layer(s) (if present), and the fill material. The capping layer 113 can be formed using a selective deposition process that deposits the capping layer 113 on metallic surfaces of previously deposited portions of the gate structures 109 but does not significantly deposit on dielectric surfaces (e.g, on the gate spacers 111 or first ILD layer 117).

In some embodiments, the selective deposition is a fluorine-free tungsten deposition, and hence, the capping layer 113 can be free of fluorine. In some embodiments, the selective deposition process, which further is a fluorine-free tungsten deposition, is an ALD process that uses a hydrogen ($H_2$) precursor and a tungsten chloride precursor. In other embodiments, the selective deposition process is a CVD process such as an MOCVD process using a tungsten chloride precursor. The tungsten chloride precursor can be tungsten pentachloride, tungsten hexachloride, another tungsten chloride, or a combination thereof.

Each feature of the gate structures 109 (including the capping layer 113) may be deposited and then planarized, such as by a Chemical Mechanical Polish (CMP), to level the top surfaces of the features of the gate structures 109 with the top surfaces of the gate spacers 111. Once planarized, the materials of the gate structures 109 may then be recessed by an etch back using, e.g., one or more wet or dry etching processes.

Further referring to FIGS. 1A-1C, a mask layer 115 (e.g., silicon nitride or the like), also referred to as a sacrificial layer, is formed over the capping layer 113. In some embodiments, the mask layer 115 is deposited in recesses formed by an etch back of the gate structures 109. The mask layer 115 may be used to cover the capping layer 113 during a subsequent deposition of an etch stop layer (see below, FIG. 2). The mask layer 115 may be deposited by any suitable process, such as physical vapor deposition (PVD), CVD, sputter deposition, or other techniques for depositing the selected material. In some embodiments, the mask layer 115 extends below a top surface of the gate spacers 111. In some embodiments (not illustrated), a topmost surface of the mask layer 115 is level with or below a topmost surface of the gate spacers 111. In some embodiments, the mask layer 115 extends over the gate spacers 111. In some embodiments (not illustrated), a bottommost surface of the mask layer 115 is level with or above a topmost surface of the gate spacers 111.

FIGS. 2 through 12 illustrate cross-sectional views of FIG. 1A along line A-A' showing intermediate stages in the manufacture of the semiconductor device 100. Multiple additional gates structures 109 are illustrated in this cross-section for clarity.

Figure 2:
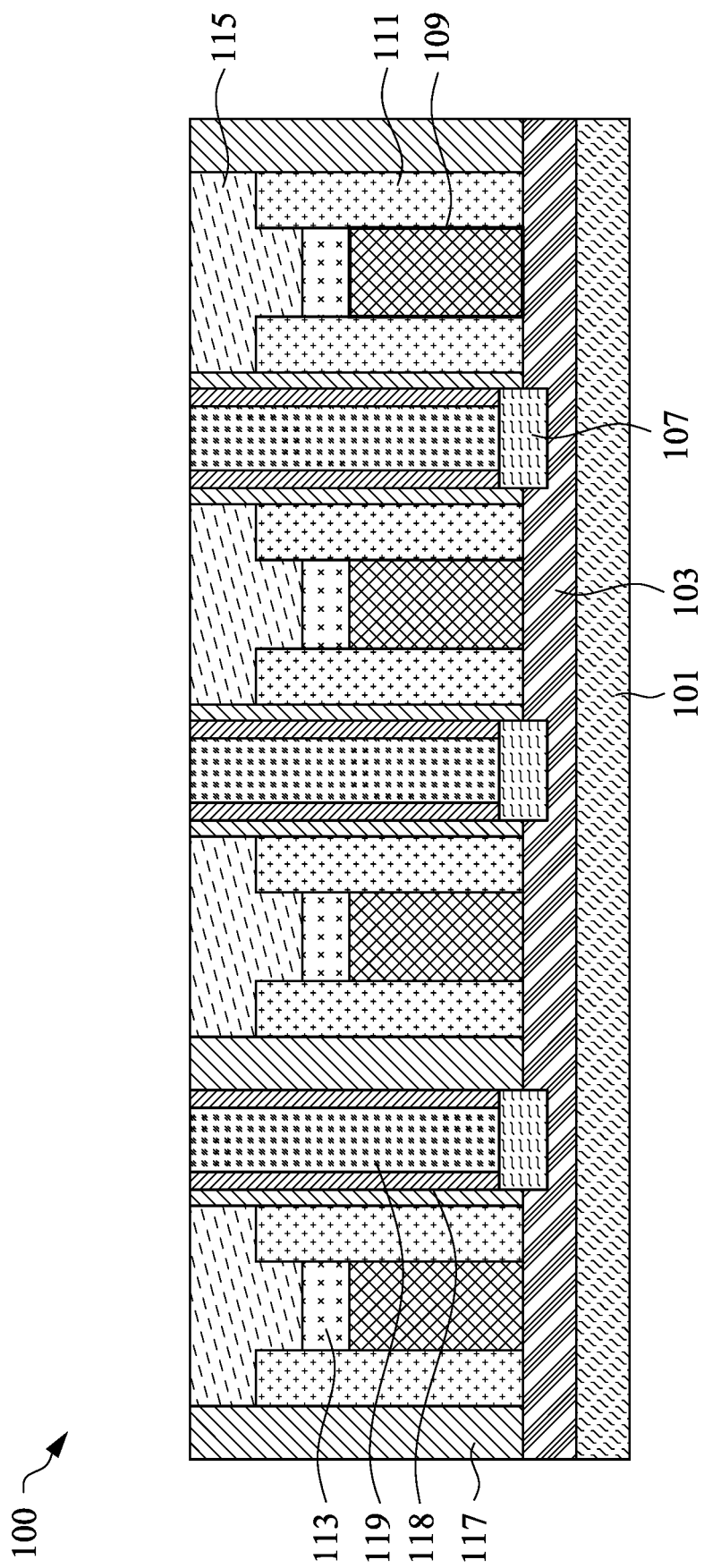
FIGS. 2 through 12 illustrate cross-sectional views of a semiconductor device at intermediate stages of manufacturing, in accordance with some embodiments.

FIG. 2 illustrates contact plugs 119, such as source/drain contacts, formed in the first ILD layer 117. The contact plugs 119 electrically couple the source/drain regions 107 to subsequently formed conductive features such as metal lines, vias, and conductive pillars over the source/drain regions 107. An anneal process may be performed to form a silicide at the interface between the source/drain regions 107 and the contact plugs 119. In some embodiments, the contact plugs 119 are formed of a conductive material such as cobalt, tungsten, aluminum, copper, titanium, tantalum, titanium nitride, tantalum nitride, the like, or a combination thereof. The formation of the contact plugs 119 may include forming contact openings in the first ILD layer 117 to expose the source/drain region 107, forming one or more conductive material(s) in the contact openings, and performing a planarization process, such as a Chemical Mechanical Polish (CMP), to level the top surface of the contact plugs 119 with the top surface of the first ILD layer 117. In some embodiments, a contact spacer 118 is formed around the contact plugs 119 in the contact openings. For example, a layer of an acceptable dielectric material may be deposited in the contact openings and anisotropically etched to form the contact spacers 118. The contact plugs 119 may then be formed in the contact openings.

The disclosed FinFET embodiments may also be applied to nanostructure devices such as nanostructure (e.g., nanosheet, nanowire, gate-all-around, or the like) field effect transistors (nano-FETs). In a nano-FET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the nano-FET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 3:
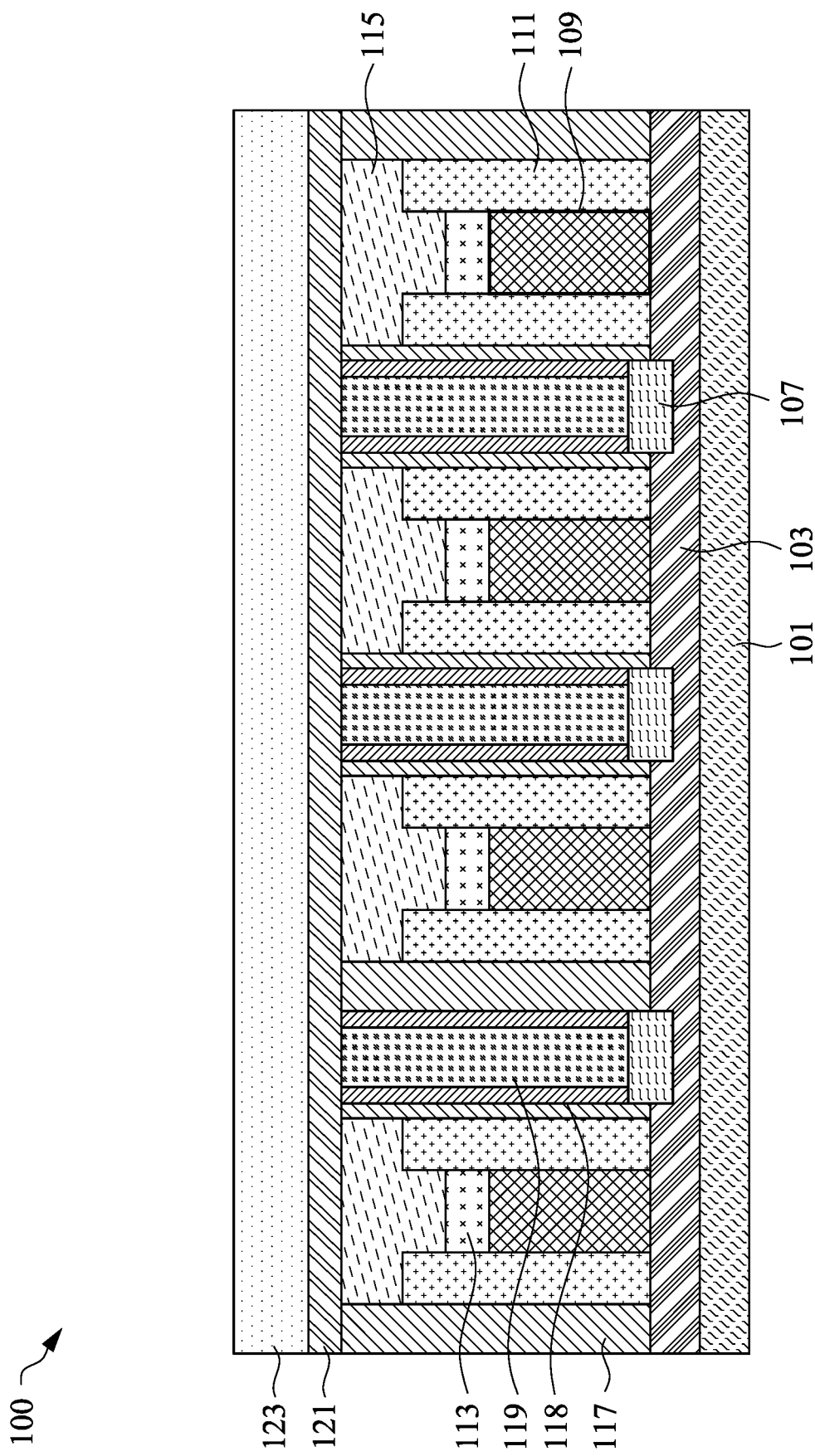

In FIG. 3, an etch stop layer (ESL) 121 and a second ILD layer 123 are formed over the first ILD layer 117, the contact plugs 119, the gate spacers 111, and the mask layer 115. In some embodiments, the ESL 121, also referred to as a middle contact ESL or MCESL, comprises silicon nitride formed by PECVD, although other dielectric materials such as nitride, carbide, combinations thereof, or the like, and other techniques of forming the ESL 121, such as LPCVD, PVD, or the like, could be used.

Next, a second ILD layer 123 is formed over the ESL 121 and over the first ILD layer 117. The second ILD layer 123 may be formed of a dielectric material such as silicon oxide, silicon nitride, silicon carbide, silicon carbonitride, silicon oxynitride, silicon oxycarbide, silicon boron nitride, silicon boron carbonitride, boron nitride, a low-k dielectric material having a dielectric constant (k-value) lower than 3.0 (e.g. about 2.5, about 2.0, or even lower), a carbon-containing low-k dielectric material such as silicon oxycarbide doped with hydrogen, Hydrogen SilsesQuioxane (HSQ), Methyl-SilsesQuioxane (MSQ), the like, or a combination thereof. The formation of the second ILD layer 123 may include CVD, PVD, ALD, or a process such as depositing a porogen-containing dielectric material over the first ILD layer 117, and then performing a curing process to drive out the porogen, thereby forming the second ILD layer 123 that is porous, as an example. However, any suitable materials and methods may be used to form the second ILD layer 123.

Figure 4:
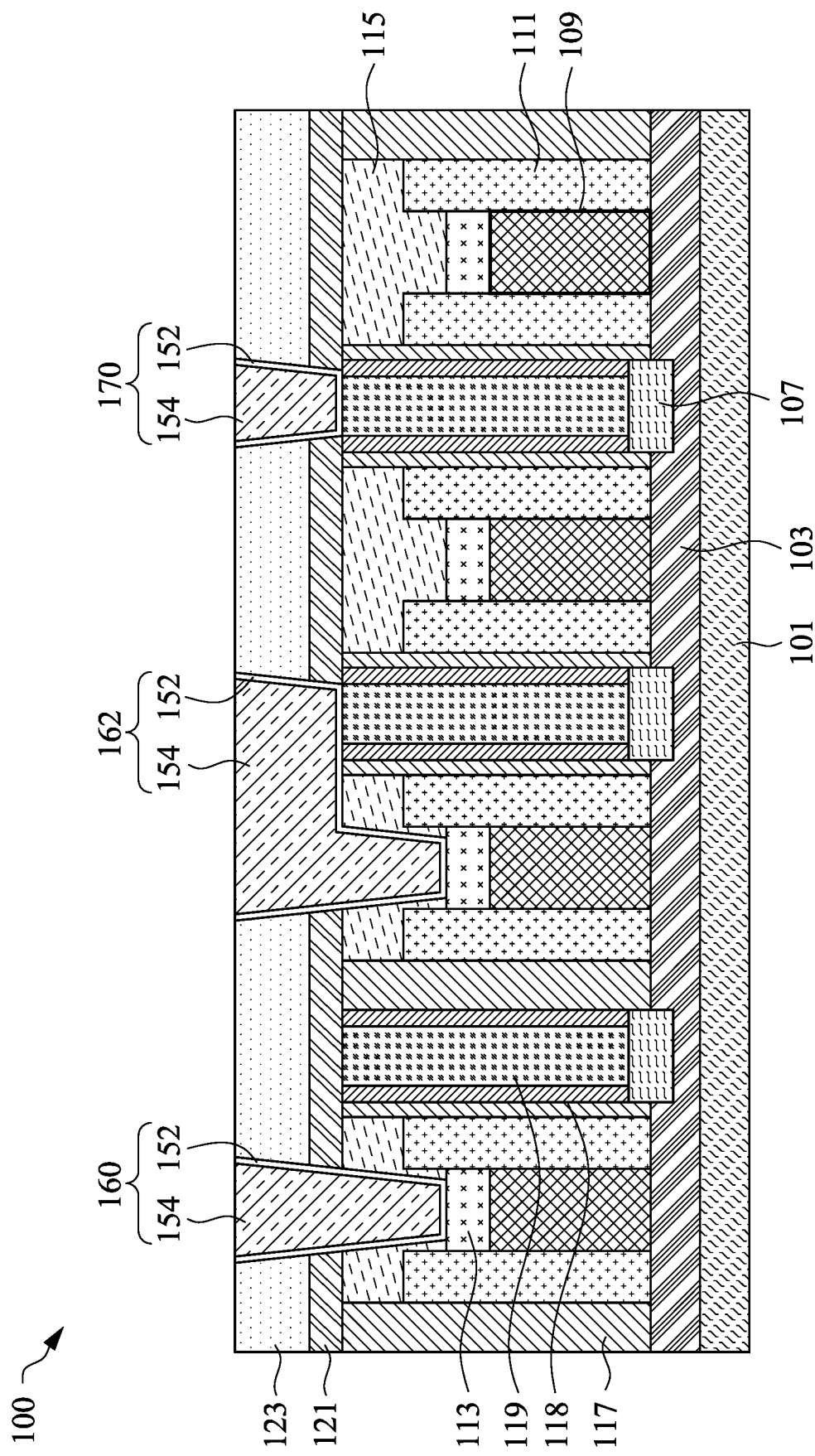

In FIG. 4, gate contacts 160 and conductive structures 170 are formed through the second ILD layer 123 and the ESL 121 in accordance with some embodiments. In some embodiments, the conductive structures 170 are contacts, contact plugs, or vias that make physical and electrical contact with respective contact plugs 119. In some embodiments, butted contacts 162 are also formed through the second ILD layer 123, the ESL 121, and the mask layer 115 (if present). Openings for the conductive structures 170 are formed through the second ILD layer 123 and the ESL 121, and openings for the gate contacts 160 and the butted contacts 162 (if present) are formed through the second ILD layer 123, the ESL 121, and the mask layer 115 (if present). The openings may be formed using acceptable photolithography and etching techniques. A liner 152, such as a diffusion barrier layer, an adhesion layer, or the like, and a conductive material 154 are formed in the openings. The liner 152 may include titanium, titanium nitride, tantalum, tantalum nitride, or the like. The conductive material 154 may be copper, a copper alloy, silver, gold, tungsten, cobalt, aluminum, nickel, or the like. A planarization process, such as a CMP, may be performed to remove excess material from a top surface of the second ILD layer 123. The remaining liner 152 and conductive material 154 form the gate contacts 160, butted contacts 162 (if present), and conductive structures 170 in the openings. The conductive structures 170 are electrically coupled to the source/drain regions 107 through the contact plugs 119, the gate contacts 160 are electrically coupled to respective gate electrodes of the gate structures 109 (including the capping layer 113, if present), and the butted contacts 162 (if present) are electrically coupled to respective gate electrodes of the gate structures 109 (including the capping layer 113, if present) and to source/drain regions 107 through the contact plug 119. The gate contacts 160, the conductive structures 170, and the butted contacts 162 may be formed in different processes, or may be formed in the same process. Although shown as being formed in the same cross-sections, it should be appreciated that each of the gate contacts 160, conductive structures 170, and butted contacts 162 may be formed in different cross-sections, which may avoid shorting of the contacts.

Figure 5:
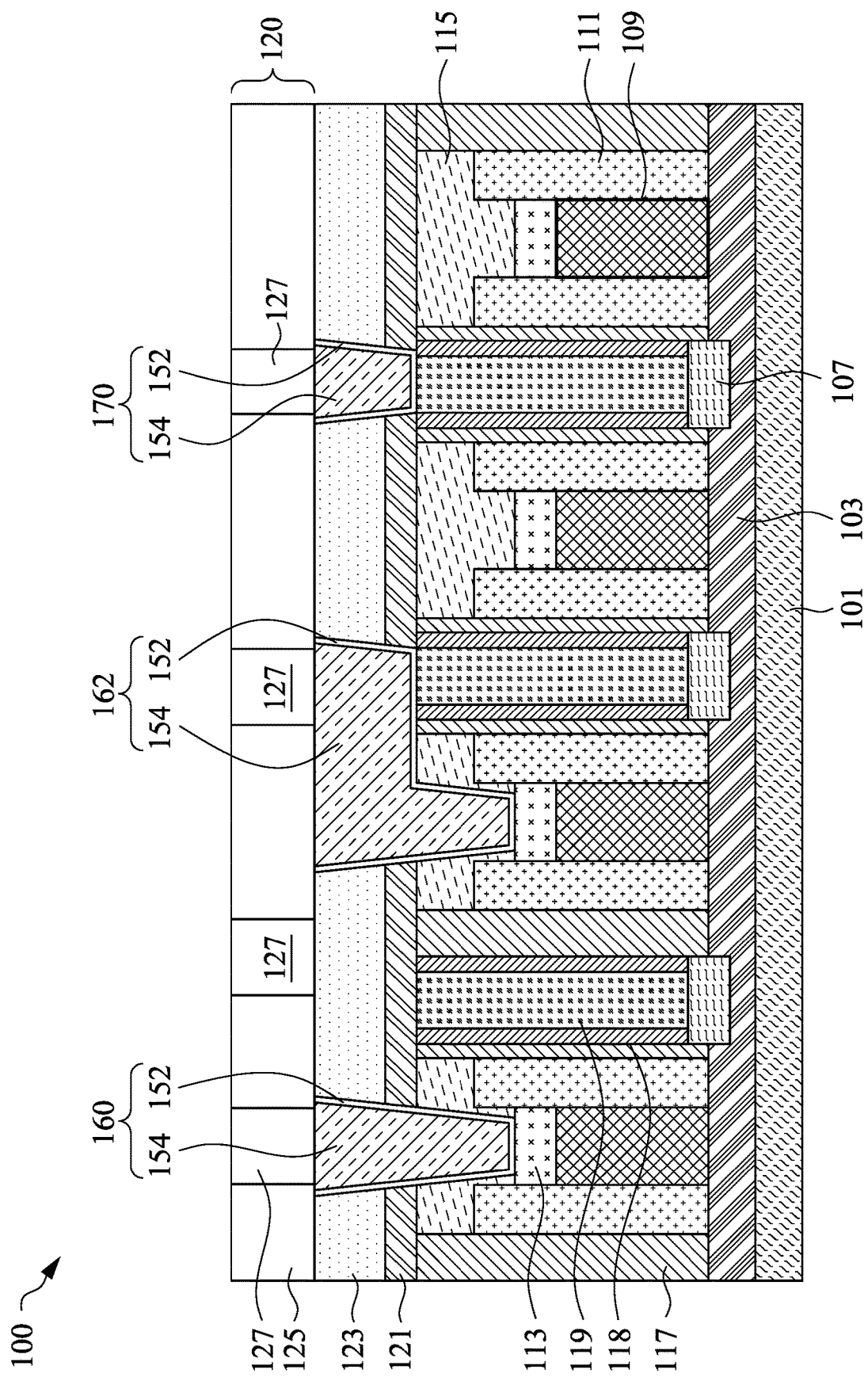

In FIG. 5, a first interconnect level 120 is formed, stacked vertically above the gate contacts 160, butted contacts 162 (if present), and conductive structures 170 formed in the second ILD layer 123 in accordance with a back end of line (BEOL) scheme adopted for the integrated circuit design. The first interconnect level 120 comprises conductive features 127 (e.g. vias or lines) embedded in an inter-metal dielectric (IMD) layer 125. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level.

Still referring to FIG. 5, the first interconnect level 120 is formed using, for example, a single damascene process flow, a dual damascene process flow, or the like. First, a dielectric stack used to form IMD layer 125 may be deposited using one or more layers of the dielectric materials listed in the descriptions of the first ILD layer 117 and the second ILD layer 123 (e.g., a low-k dielectric material). In some embodiments, IMD layer 125 includes an etch stop layer (not shown) positioned at the bottom of the dielectric stack. The etch stop layer comprises one or more insulator layers (e.g., silicon oxide, silicon oxycarbide, silicon carbonitride, silicon oxynitride, silicon nitride, carbon nitride, aluminum oxide, aluminum nitride, aluminum yttrium oxide, zirconium oxide, yttrium oxide, combinations thereof, or the like) having an etch rate different than an etch rate of an overlying material. The techniques used to deposit the dielectric stack for the IMD layer 125 may be the same as those used in forming the first ILD layer 117 and the second ILD layer 123 as described above with respect to FIGS. 1 and 2, respectively.

Appropriate photolithography and etching techniques (e.g., anisotropic RIE employing fluorocarbon chemicals) may be used to pattern the IMD layer 125 to form openings for vias or lines. The openings for vias may be vertical holes extending through IMD layer 125 to expose top conductive surfaces of gate contacts 160, butted contacts 162 (if present), and conductive structures 170, and openings for lines may be longitudinal trenches formed in an upper portion of the IMD layer. The etching techniques may utilize multiple steps. For example, a first main etch step may remove a portion of the dielectric material of IMD layer 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle (not illustrated).

One or more conductive materials may be deposited to fill the holes or trenches forming the conductive features 127 of the first interconnect level 120. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The conductive diffusion barrier liner in the conductive features 127 may comprise one or more layers of cobalt, ruthenium, titanium, tantalum, titanium nitride, tantalum nitride, or the like, or combinations thereof. The conductive fill layer in conductive features 127 may comprise metals such as tungsten, copper, cobalt, ruthenium, copper manganese, molybdenum, aluminum, or the like, or combinations thereof, or multi-layers thereof. The conductive materials used in forming the conductive features 127 may be deposited by any suitable method, for example, CVD, PECVD, PVD, ALD, PEALD, electrochemical plating (ECP), electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD layer 125 outside of the openings may be removed by a planarizing process (e.g., CMP) thereby forming a top surface comprising dielectric regions of IMD layer 125 that are substantially coplanar with top surfaces of the conductive features 127. The planarization step completes fabrication of the first interconnect level 120 comprising conductive features 127 embedded in IMD layer 125, as illustrated in FIG. 5.

FIGS. 6 through 12 illustrate the formation of a second interconnect level 130 over the first interconnect level 120, in accordance with some embodiments. The second interconnect level 130 includes selective formation of etch-resistant layers 131 on exposed surfaces of the IMD layer 125 and the formation of air caps 155 over the conductive features 127. The etch-resistant layer 131 prevents the underlying IMD layer 125 from being damaged by the etching processes to form conductive vias 182 (see below, FIGS. 11-12), which reduces leakage and reliability issues, such as time-dependent dielectric breakdown (TDDB), electromigration (EM), and stress migration (SM). The air caps 155 can increase the contact area between the conductive features 127 and subsequently formed conductive vias 182 by providing additional space to be filled by conductive material. This can solve issues with shrinking of the contact area that may occur without air caps 155. Remaining unfilled space of the air caps 155 can reduce coupling capacitance between adjacent conductive features by 5% or greater.

Although the structures of FIGS. 6 through 12 are illustrated as a second interconnect level 130, it should be appreciated that the structures of the second interconnect level 130 may be placed at any interconnect layer suitable in a particular design, such as e.g. the first interconnect layer, the second interconnect layer, and/or the fifth interconnect layer. In some embodiments, the structures of the second interconnect level 130 are formed directly on the gate contacts 160, butted contacts 162 (if present), and conductive structures 170 and the second ILD layer 123 in place of the conductive features 127 and the IMD layer 125, respectively.

Figure 6:
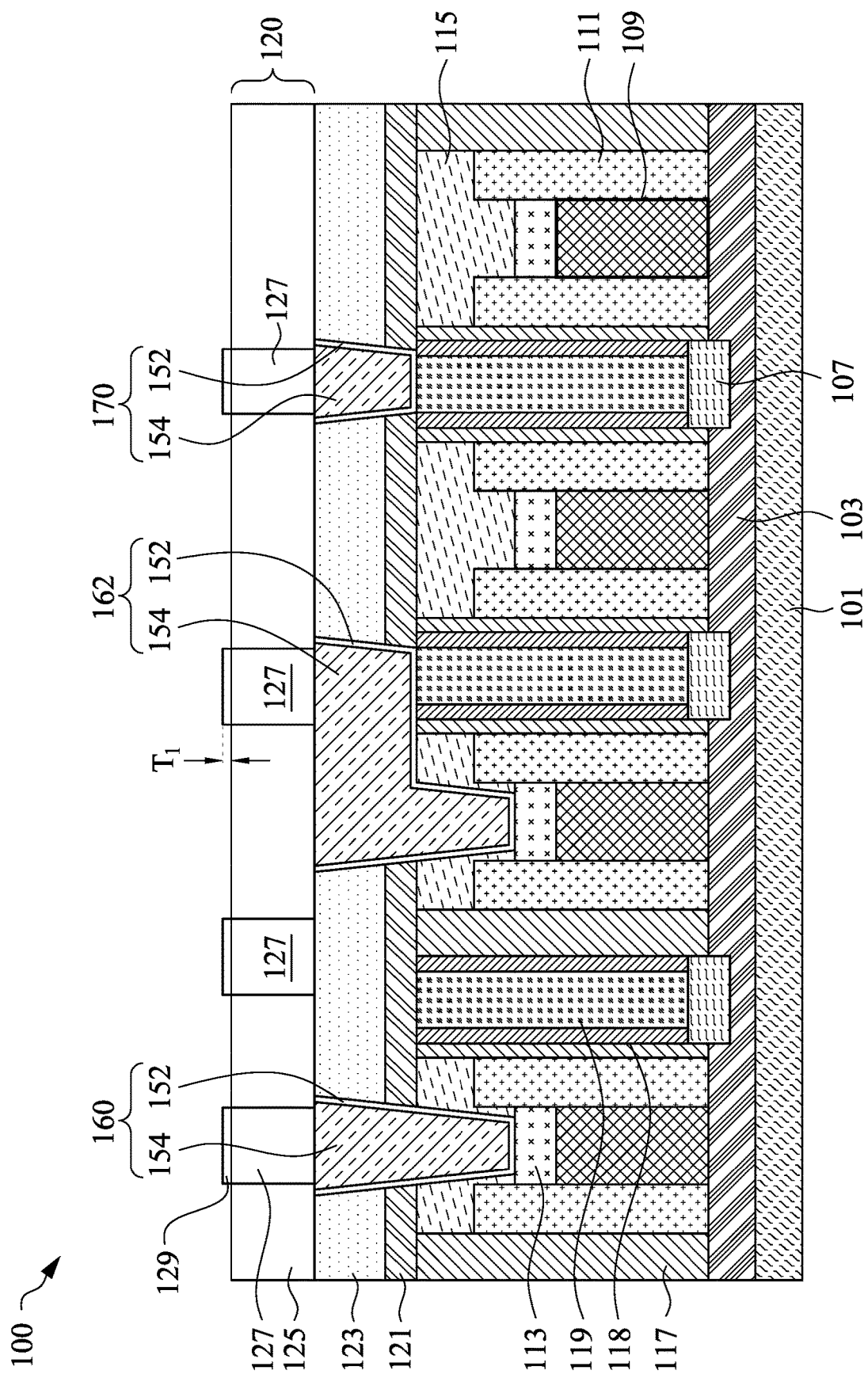

In FIG. 6, sacrificial inhibitor caps 129 are selectively grown on top surfaces of the conductive features 127. The inhibitor caps 129 reduce formation of a subsequently formed etch stop layer (see below, FIG. 7) on top surfaces of the conductive features 127 and are subsequently removed to form air caps 155 (see below, FIG. 9). The material of the inhibitor caps 129 is chosen to have deposition selectivity with a conductive material (e.g., the material of the conductive features 127) over a dielectric material (e.g., the material of the IMD layer 125). As such, the inhibitor caps 129 are formed on top surfaces of the conductive features 127 at a faster rate than on top surfaces of the IMD layer 125.

In some embodiments, the inhibitor caps 129 comprise organic materials such as: organosilanes having eight to twenty carbon atoms (e.g., dodecylsilane); organophosphoric acid having eight to twenty carbon atoms (e.g., octadecylphosphonic acid), low-k dielectric polyethylene, or an organic polymer such as polyimide (e.g, pyromellitic dianhydride+1,6-diaminohexane), polyamide (e.g., ethylene diamine and adipoyl chloride), or the like; the like, or a combination thereof. The inhibitor caps 129 may be formed with a wet growth process such as spin-on coating, wet dipping, or the like, or with a dry growth process such as CVD, ALD, or the like.

In some embodiments, the inhibitor caps 129 are formed to a first thickness $T_1$ in a range of 1 nm to 5 nm, which is advantageous for forming the inhibitor caps 129 to cover the conductive features 127 without extending over adjacent surfaces of the IMD layer 125. This may lead to improved subsequent formation of the air caps 155 (see below, FIG. 9). Forming the inhibitor caps 129 to a thickness less than 1 nm may be disadvantageous by insufficiently inhibiting the subsequent deposition of etch stop material (see below, FIGS. 7 and 8) on the conductive features 127, which may cause the air caps 155 to be poorly formed. Forming the inhibitor caps 129 to a thickness greater than 5 nm may be disadvantageous by causing the inhibitor material to laterally extend over the adjacent surfaces of the IMD layer 125, which may lead to poor subsequent selective deposition of etch stop material (see below, FIGS. 7 and 8) on the IMD layer 125.

In some embodiments, the inhibitor caps 129 are formed at a temperature in a range of 40° C. to 300° C., at a pressure (dry) in a range of 1 torr to 10 torr, and for a duration in a range of 30 seconds to 30 minutes. Growing the inhibitor caps 129 at a temperature, at a pressure, and for a duration in these ranges allows inhibitor caps 129 to have a desired first thickness $T_1$ in the previously described range. Growing the inhibitor caps 129 at a temperature, at a pressure, or for a duration less than these ranges may lead the inhibitor caps 129 to have a thickness less than 1 nm. This may be disadvantageous by insufficiently inhibiting the subsequent deposition of etch stop material (see below, FIGS. 7 and 8) on the conductive features 127, which may cause the air caps 155 to be poorly formed. Growing the inhibitor caps 129 at a temperature, at a pressure, or for a duration more than these ranges may lead the inhibitor caps 129 to have a thickness more than 5 nm. This may be disadvantageous by causing the inhibitor material to laterally extend over the adjacent surfaces of the IMD layer 125.

Figure 7:
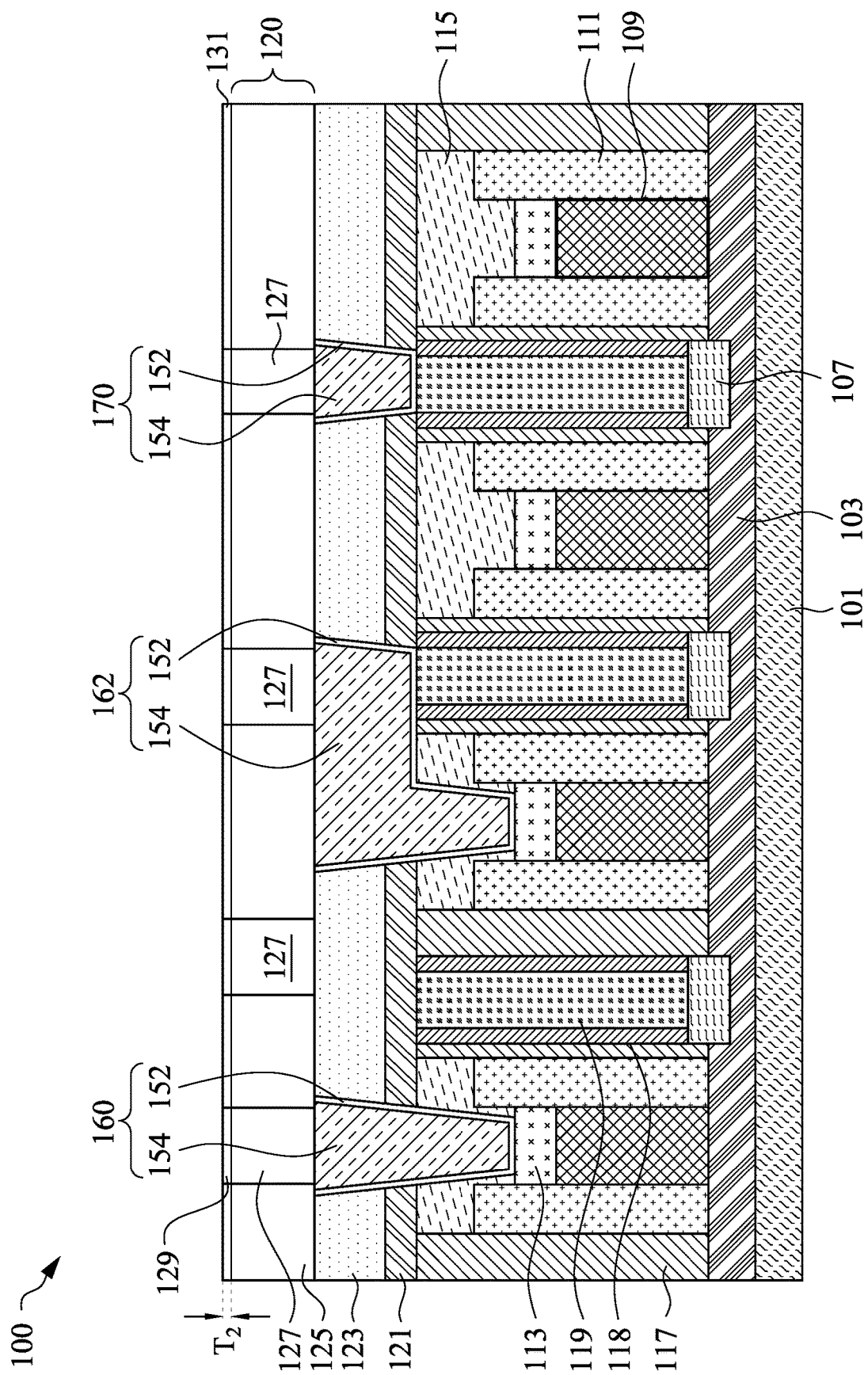

In FIG. 7, an etch-resistant layer 131 is selectively grown on exposed surfaces of the IMD layer 125. The etch-resistant layer 131 serves as an etch stop layer and prevents the underlying IMD layer 125 from being damaged by the etching processes to form conductive features in interconnect layers formed above the first interconnect level 120 (see below, FIGS. 11-12). This reduces leakage and reliability issues, such as time-dependent dielectric breakdown (TDDB), electromigration (EM), and stress migration (SM). Protecting the IMD layer 125 with the etch-resistant layer 131 further allows subsequently formed dielectric and etch stop layers to be sufficiently etched to expose the conductive features 127 without damaging the IMD layer 125. This allows for better contact to be made between subsequently formed conductive features and the conductive features 127, reducing RC delay and improving device performance. The material of the etch-resistant layer 131 is chosen to have deposition selectivity with a dielectric material (e.g., the material of the IMD layer 125) over an organic material (e.g., the material of the inhibitor caps 129). As such, the material of the inhibitor caps 129 inhibits the formation of the etch-resistant layer 131 over the inhibitor caps 129, and the etch-resistant layer 131 is formed on exposed surfaces of the IMD layer 125 at a faster rate than on exposed surfaces of the inhibitor caps 129. In some embodiments, top surfaces of the etch-resistant layer 131 are deposited to be substantially coplanar with top surfaces of the inhibitor caps 129. In some embodiments, the inhibitor caps 129 extend above top surfaces of the etch-resistant layer 131.

In some embodiments, the etch-resistant layer 131 comprises aluminum oxide ($Al_2O_3$), silicon oxide ($SiO_2$), silicon nitride (SiN), silicon carbonitride (SiCN), silicon oxycarbide (SiOC), boron nitride (BN), silicon boron nitride (SiBN), yttrium oxide ($Y_2O_3$), zirconium oxide ($ZrO_2$), the like, or a combination thereof. The etch-resistant layer 131 may be formed with a suitable process such as ALD, PECVD, LPCVD, PVD, or the like.

In some embodiments, the etch-resistant layer 131 is formed to a second thickness $T_2$ in a range of 10 Å to 30 Å, which is advantageous for controlling etching processes to form conductive vias 182 (see below, FIG. 12). Forming the etch-resistant layer 131 to a thickness less than 10 Å may be disadvantageous by having poor etching stop ability, which may lead to damage from overetching. Forming the inhibitor caps 129 to a thickness greater than 30 Å may be disadvantageous by leading to subsequent etching of openings 180 (see below, FIG. 11) for conductive vias 182 to not penetrate the etch-resistant layer 131. This may cause the subsequently formed conductive vias 182 to not connect to the conductive features 127, leading to undesirable high capacitance.

In some embodiments, the etch-resistant layer 131 is formed at a temperature in a range of 40° C. to 300° C., at a pressure (dry) in a range of 1 torr to 10 torr, and for a duration in a range of 30 seconds to 30 minutes. Growing the etch-resistant layer 131 at a temperature, at a pressure, and for a duration in these ranges allows the etch-resistant layer 131 to have a desired second thickness $T_2$ in the previously described range. Growing the etch-resistant layer 131 at a temperature, at a pressure, or for a duration less than these ranges may lead the etch-resistant layer 131 to have a thickness less than 1 nm. This may be disadvantageous by having poor etching stop ability, which may lead to damage from overetching. Growing the etch-resistant layer 131 at a temperature, at a pressure, or for a duration more than these ranges may lead the etch-resistant layer 131 to have a thickness more than 30 Å. This may be disadvantageous by leading to subsequent etching of openings 180 for conductive vias 182 (see below, FIGS. 11-12) to not penetrate the etch-resistant layer 131.

Figure 8:
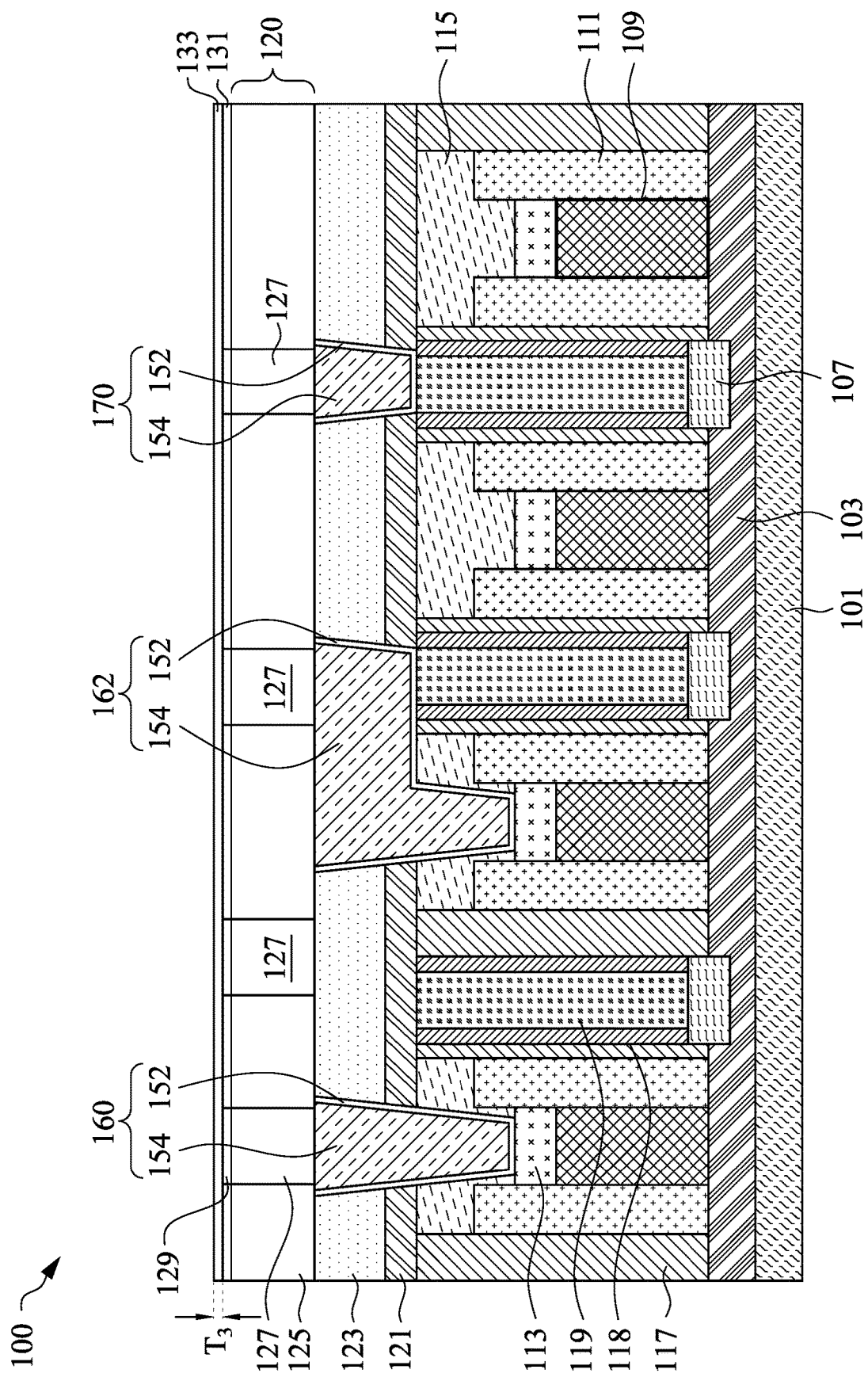

In FIG. 8, an etch stop layer (ESL) 133 is formed over the etch-resistant layer 131 and the inhibitor caps 129. The ESL 133 covers the inhibitor caps 129 during a subsequent plasma treatment to form air caps 155 (see below, FIG. 9). In some embodiments, the ESL 133 comprises aluminum oxide ($Al_2O_3$), silicon oxide ($SiO_2$), silicon nitride (SiN), silicon carbonitride (SiCN), silicon oxycarbide (SiOC), boron nitride (BN), silicon boron nitride (SiBN), yttrium oxide ($Y_2O_3$), zirconium oxide ($ZrO_2$), the like, or a combination thereof. The ESL 133 may be formed with a suitable process such as ALD, PECVD, LPCVD, PVD, or the like. In some embodiments, the etch-resistant layer 131 is a first material and the ESL 133 is a second material different from the first material of the etch-resistant layer 131.

In some embodiments, the ESL 133 is formed to a third thickness $T_3$ in a range of 5 Å to 20 Å, which is advantageous for controlling etching processes to form conductive features in interconnect layers formed above the first interconnect level 120 (see below, FIGS. 11-12). Forming the ESL 133 to a thickness less than 5 Å may be disadvantageous by having poor etching stop ability, which may lead to damage from overetching. Forming the inhibitor caps 129 to a thickness greater than 20 Å may be disadvantageous by blocking a subsequent plasma treatment (see below, FIG. 9) from removing the inhibitor caps 129 and forming air caps 155.

In some embodiments, the ESL 133 is formed at a temperature in a range of 40° C. to 300° C., at a pressure (dry) in a range of 1 torr to 10 torr, and for a duration in a range of 30 seconds to 30 minutes. Growing the ESL 133 at a temperature, at a pressure, and for a duration in these ranges allows the ESL 133 to have a desired third thickness $T_3$ in the previously described range. Growing the ESL 133 at a temperature, at a pressure, or for a duration less than these ranges may lead the ESL 133 to have a thickness less than 0.5 nm. This may be disadvantageous by having poor etching stop ability, which may lead to damage from overetching. Growing the ESL 133 at a temperature, at a pressure, or for a duration more than these ranges may lead the ESL 133 to have a thickness more than 10 Å. This may be disadvantageous by blocking a subsequent plasma treatment (see below, FIG. 9) from removing the inhibitor caps 129 and forming air caps 155.

In some embodiments, the ESL 133 is formed with a density in a range of 1.5 $g/cm^3$ to 3.5 $g/cm^3$, which is advantageous for allowing a subsequent plasma treatment (see below, FIG. 9) to remove the inhibitor caps 129 and form air caps 155 while retaining good etching stop ability. The ESL 133 having a density less than 1.5 $g/cm^3$ may be disadvantageous by having poor etching stop ability, which may lead to damage from overetching. The ESL 133 having a density greater than 3.5 $g/cm^3$ may be disadvantageous by blocking the subsequent plasma treatment from removing the inhibitor caps 129 and forming air caps 155.

Figure 9:
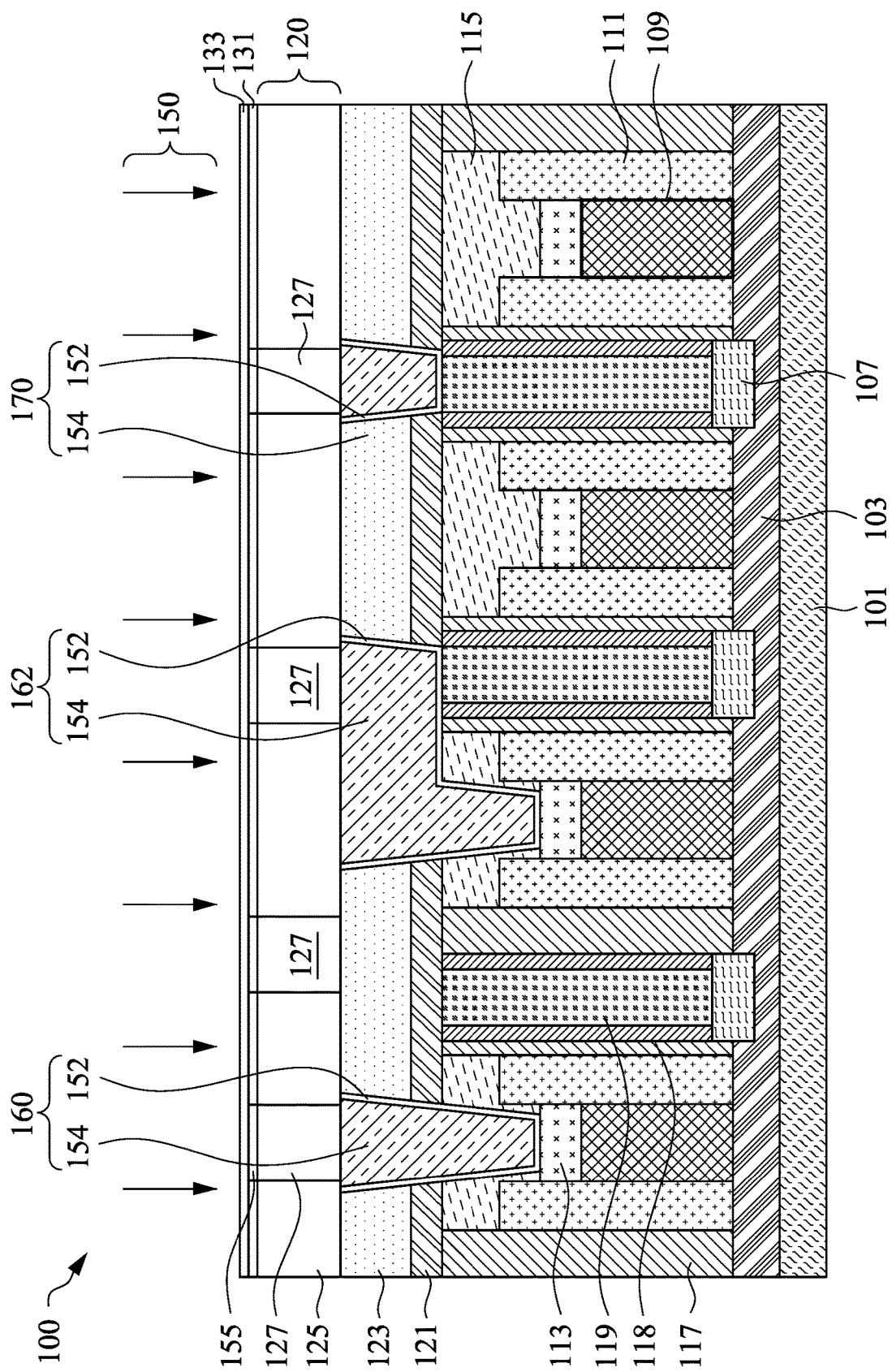

In FIG. 9, a plasma treatment 150 is performed to remove the inhibitor caps 129 and form air caps 155. The air caps 155 provide additional space to be filled by conductive material and increase the contact area between the conductive features 127 and subsequently formed conductive vias 182 (see below, FIG. 12). This can solve issues with shrinking of the contact area that may occur without the air caps 155. Remaining unfilled space of the air caps 155 may reduce coupling capacitance between adjacent conductive features by 5% or greater. Radicals and ions from the plasma treatment 150 penetrate through the ESL 133 and react with the material of the inhibitor caps 129, converting the organic material of the inhibitor caps 129 to gas which may diffuse through the adjacent etch-resistant layer 131 and ESL 133.

In some embodiments, the plasma treatment 150 includes oxygen ($O_2$), a combination of nitrogen and oxygen ($N_2$+ $O_2$), nitrous oxide ($N_2O$), nitric oxide (NO), nitrogen dioxide ($NO_2$), dioxohydrazine ($N_2O_2$), the like, or a combination thereof. The plasma treatment 150 may be performed with a plasma generation power in a range of 50 W to 500 W, at a temperature in a range of 50° C. to 400° C., and for a duration in a range of 5 s to 30 s.

Oxygen radicals and ions from the plasma treatment 150 can penetrate films (e.g., the ESL 133) depending on the film density and type. As an example, for a film of aluminum oxide ($Al_2O_3$), the oxygen radicals and ions can penetrate a film thickness in a range of 10 Å to 30 Å, depending on the film density. As another example, for a film of organic low-k dielectric polyethylene, the oxygen radicals and ions can penetrate a film thickness in a range of 10 nm to 40 nm, depending on the film density.

The oxygen radicals and ions from the plasma treatment 150 penetrate through the ESL 133 and react with the organic material of the inhibitor caps 129. In some embodiments, the reaction may be described by Eq. 1 below:

$$C_xH_y \xrightarrow{O^*+O^-} CO_2 + H_2O \qquad \text{Eq. (1)}$$

In Eq. 1 above, oxygen radicals O* and ions O⁻ from the plasma treatment 150 react with the organic material $C_xH_y$ of the inhibitor caps 129 to form reaction products such as carbon dioxide and water (e.g., water vapor). The gaseous reaction products may diffuse out through the ESL 133, leaving the space previously occupied by the inhibitor caps 129 as air caps 155, which may be filled with air or gases such as the previously mentioned reaction products of carbon dioxide and water vapor. The ESL 133 having a third thickness $T_3$ in a range of 5 Å to 30 Å and a density in a range of 1.5 g/cm³ to 3.5 g/cm³ may allow the gaseous reaction products to diffuse out through the ESL 133. The ESL 133 having a third thickness $T_3$ greater than 30 Å and a density greater than 3.5 g/cm³ may be disadvantageous by reducing the diffusion of the gaseous reaction products out through the ESL 133, which may impede the formation of the air caps 155.

Figure 10:
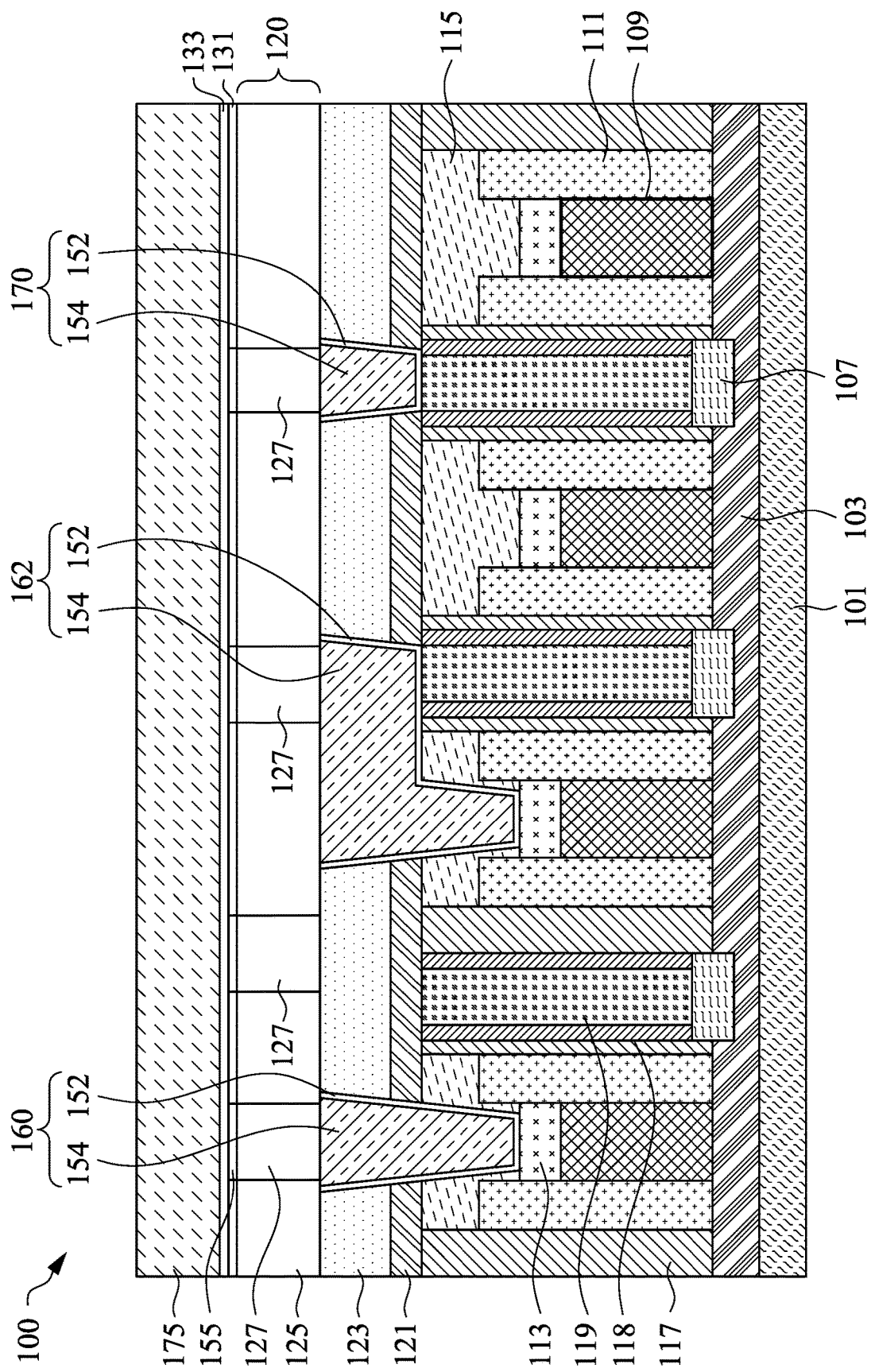

In FIG. 10, an IMD layer 175 is formed over the ESL 133. The IMD layer 175 is formed using one or more layers of the dielectric materials listed in the descriptions of the first ILD layer 117 and the second ILD layer 123 (e.g., a low-k dielectric material). The techniques used to deposit the dielectric stack for the IMD layer 175 may be the same as those used in forming the first ILD layer 117 and the second ILD layer 123 as described above with respect to FIGS. 1 and 2, respectively.

Figure 11:
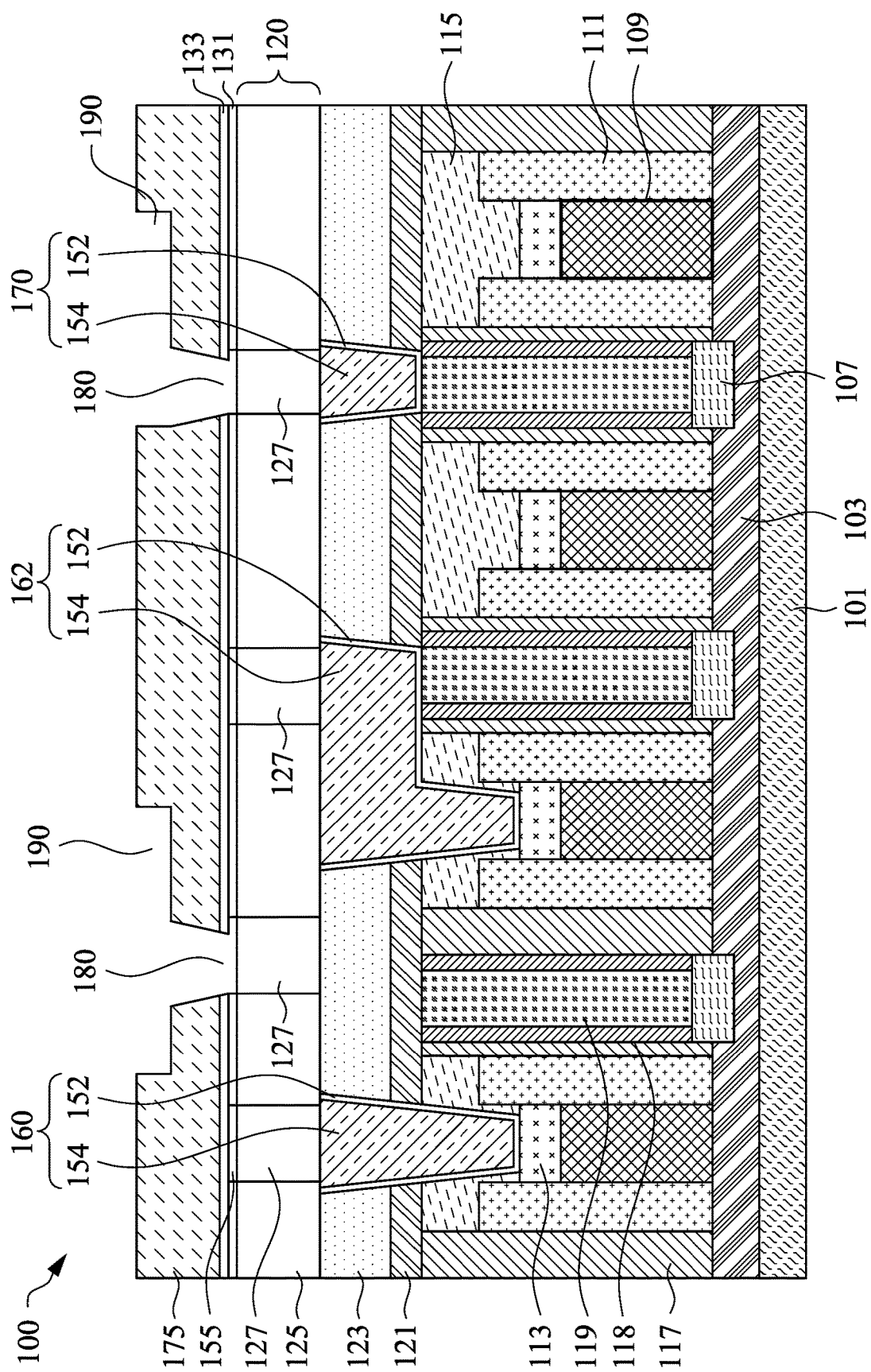

In FIG. 11, openings 180 for vias and openings 190 for lines are formed in the IMD layer 175. Appropriate photolithography and etching techniques (e.g., anisotropic RIE employing fluorocarbon chemicals) may be used to pattern the IMD layer 175 to form the openings 180 and 190. The openings 180 for vias may be vertical holes extending through IMD layer 175 and ESL 133 and into the air caps 155 to expose top conductive surfaces of conductive features 127. The openings 190 for lines may be longitudinal trenches formed in an upper portion of the IMD layer 175. In some embodiments, the method used to pattern holes and trenches in IMD layer 175 utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 175 and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Figure 12:
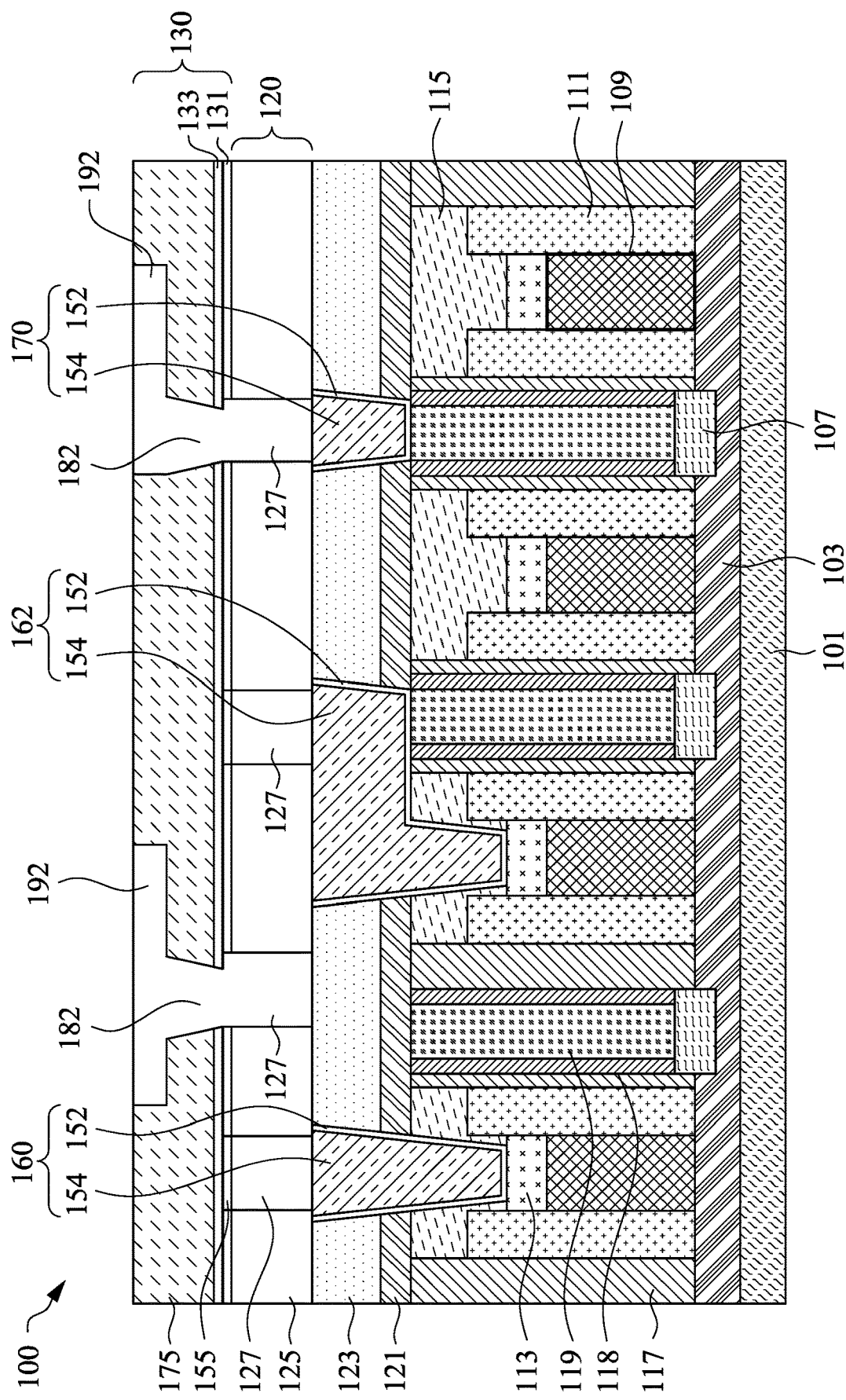

In FIG. 12, conductive vias 182 are formed in the openings 180 and conductive lines 192 are formed in the openings 190, so that the conductive vias 182 are physically and electrically coupled to underlying conductive features 127. The openings 180 and 190 may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an ECP deposition step that completely fills the openings with a conductive fill material.

The conductive diffusion barrier liner in the conductive vias 182 and conductive lines 108A may comprise one or more layers of cobalt, ruthenium, titanium, tantalum, titanium nitride, tantalum nitride, or the like, or combinations thereof. The conductive fill layer in the conductive vias 182 and the conductive lines 192 may comprise metals such as tungsten, copper, cobalt, ruthenium, copper manganese, molybdenum, aluminum, or the like, or combinations thereof, or multi-layers thereof. The conductive materials used in forming the conductive vias 182 and lines 192 may be deposited by any suitable method, for example, CVD, PECVD, PVD, ALD, PEALD, electrochemical plating (ECP), electroless plating and the like. In some embodiments, the conductive seed layer may be of the same conductive material as the conductive fill layer and deposited using a suitable deposition technique (e.g., CVD, PECVD, ALD, PEALD, or PVD, or the like).

As shown in FIG. 12, the conductive materials used in forming the conductive vias 182 may fill portions of the air caps 155 exposed by the openings 180 (see above, FIG. 11). The additional space provided by the air caps 155 that is filled with conductive material can increase the contact area between the conductive features 127 and the conductive vias 182. This can solve issues with shrinking of the contact area that may occur without air caps 155. The portions of the air caps 155 not filled by conductive materials remain filled by air, which can reduce coupling capacitance between adjacent conductive features by 5% due to the low dielectric constant of air (e.g., around 1).

Any excess conductive material over the IMD layer 175 outside of the openings may be removed by a planarizing process (e.g., CMP) thereby forming a top surface comprising dielectric regions of IMD layer 175 that are substantially coplanar with conductive lines 192. The planarization step completes fabrication of the second interconnect level 130 comprising conductive vias 182 and conductive lines 192 embedded in IMD layer 175, as illustrated in FIG. 12.

Figure 13A:
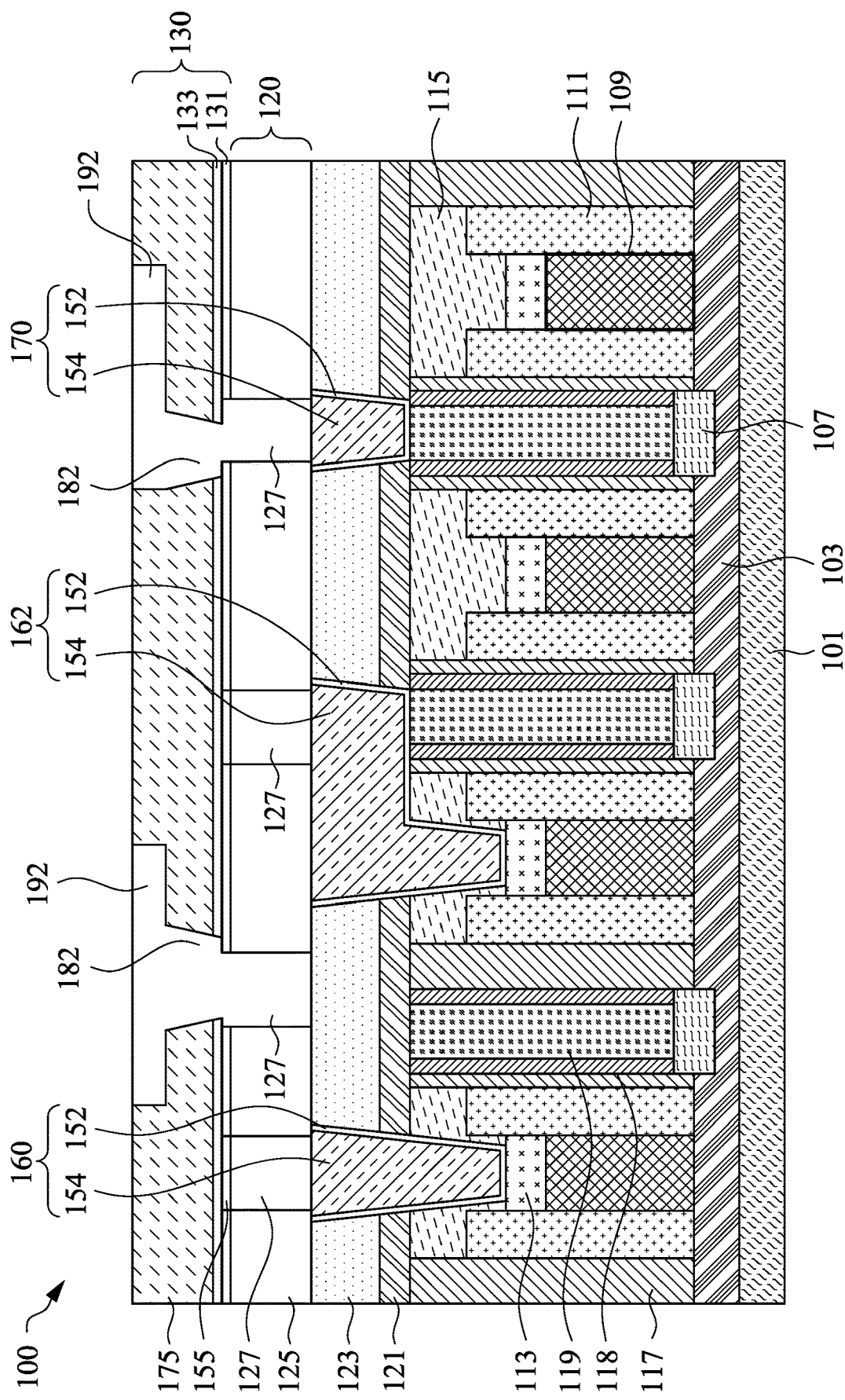
FIG. 13A illustrates a cross-sectional view of a semiconductor device at an intermediate stage of manufacturing, in accordance with some embodiments.
Figure 13B:
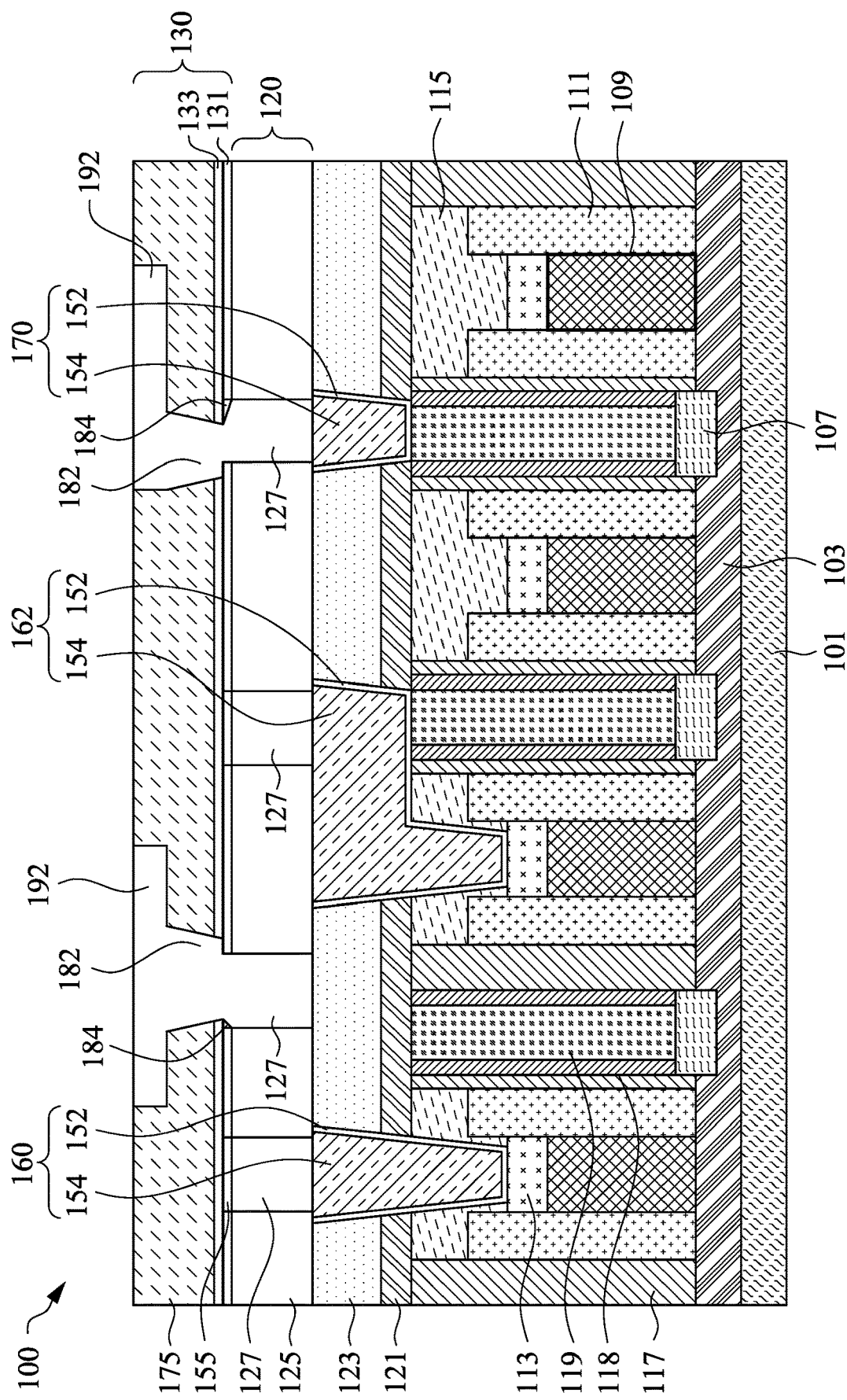
FIG. 13B illustrates a cross-sectional view of a semiconductor device at an intermediate stage of manufacturing, in accordance with some embodiments.
Figure 13C:
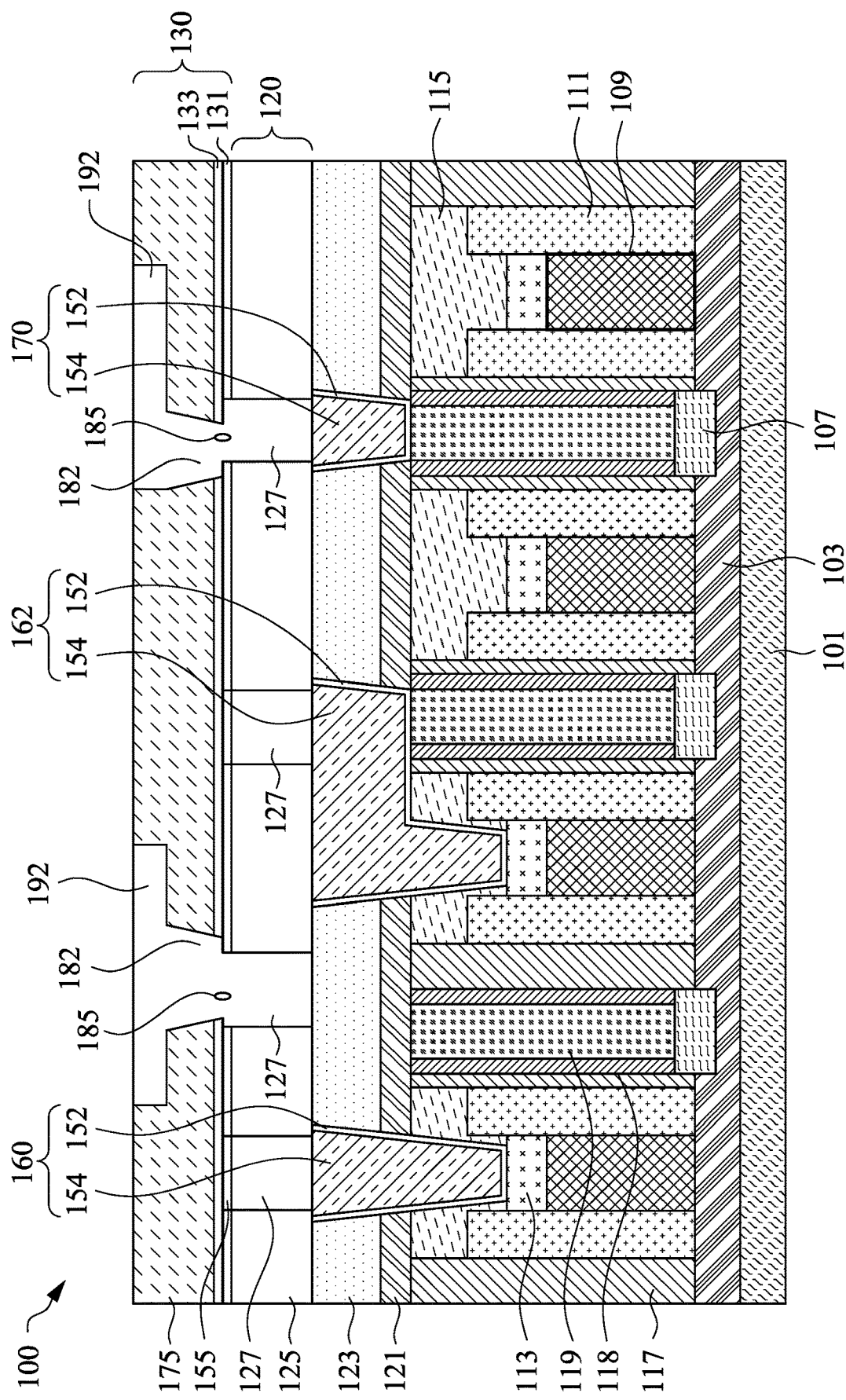
FIG. 13C illustrates a cross-sectional view of a semiconductor device at an intermediate stage of manufacturing, in accordance with some embodiments.

FIGS. 13A, 13B, and 13C illustrate embodiments of the semiconductor device 100 in which the conductive vias 182 are misaligned with respect to the conductive features 127. As pitch shrinks with increased miniaturization, edge placement error during the formation of vias (e.g., conductive vias 182) may become more common. FIG. 13A illustrates conductive vias 182 being misaligned with respect to the underlying conductive features 127, with bottom surfaces of the conductive vias 182 extending beyond top surfaces of the conductive features 127 and covering portions of the etch-resistant layer 131. The air caps 155 are filled with conductive material from the filling of the conductive vias 182 and the etch-resistant layer 131 forms a bottom boundary for the conductive vias 182, reducing over-etching of the IMD layer 125 adjacent to the conductive features 127. This can further increase time-dependent dielectric breakdown (TDDB) life by maintaining the spacing between adjacent conductive features 127. FIG. 13B illustrates an embodiment in which voids 184 are formed between the etch-resistant layer 131, the ESL 133, respective conductive features 127, and respective conductive vias 182 during the filling of the conductive vias 182 due to misalignment. The size of the voids 184 may be decreased by the air caps 155 not extending above the top surface of the etch-resistant layer 131, which may reduce reliability issues. FIG. 13C illustrates an embodiment in which voids 185 are formed and encapsulated in respective conductive vias 182 during the filling of the conductive vias 182 due to imperfections in the filling process.

Figure 14:
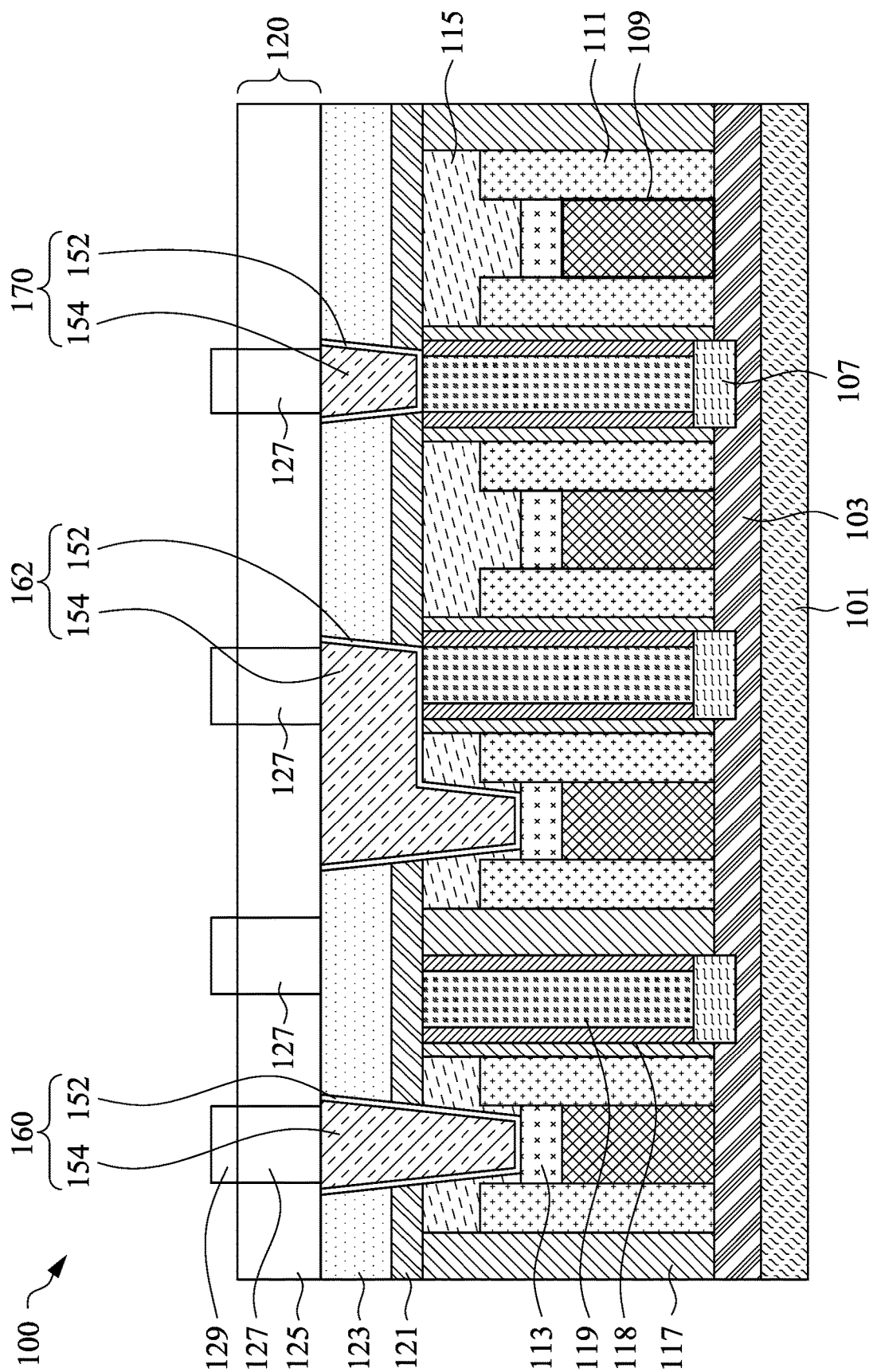
FIGS. 14 through 20 illustrate cross-sectional views of a semiconductor device at intermediate stages of manufacturing, in accordance with some embodiments.

FIGS. 14 through 20 illustrate an embodiment of the semiconductor device 100 in which the air caps 155 extend above top surfaces of the etch-resistant layer 131. FIG. 14 follows from FIG. 5 and illustrates sacrificial inhibitor caps 129 being selectively grown on top surfaces of the conductive features 127. The inhibitor caps 129 may be formed of similar materials and by similar methods as described above with respect to FIG. 6, except that the inhibitor caps 129 may be formed to a larger thickness, e.g. in a range of 2 nm to 5 nm.

Figure 15:
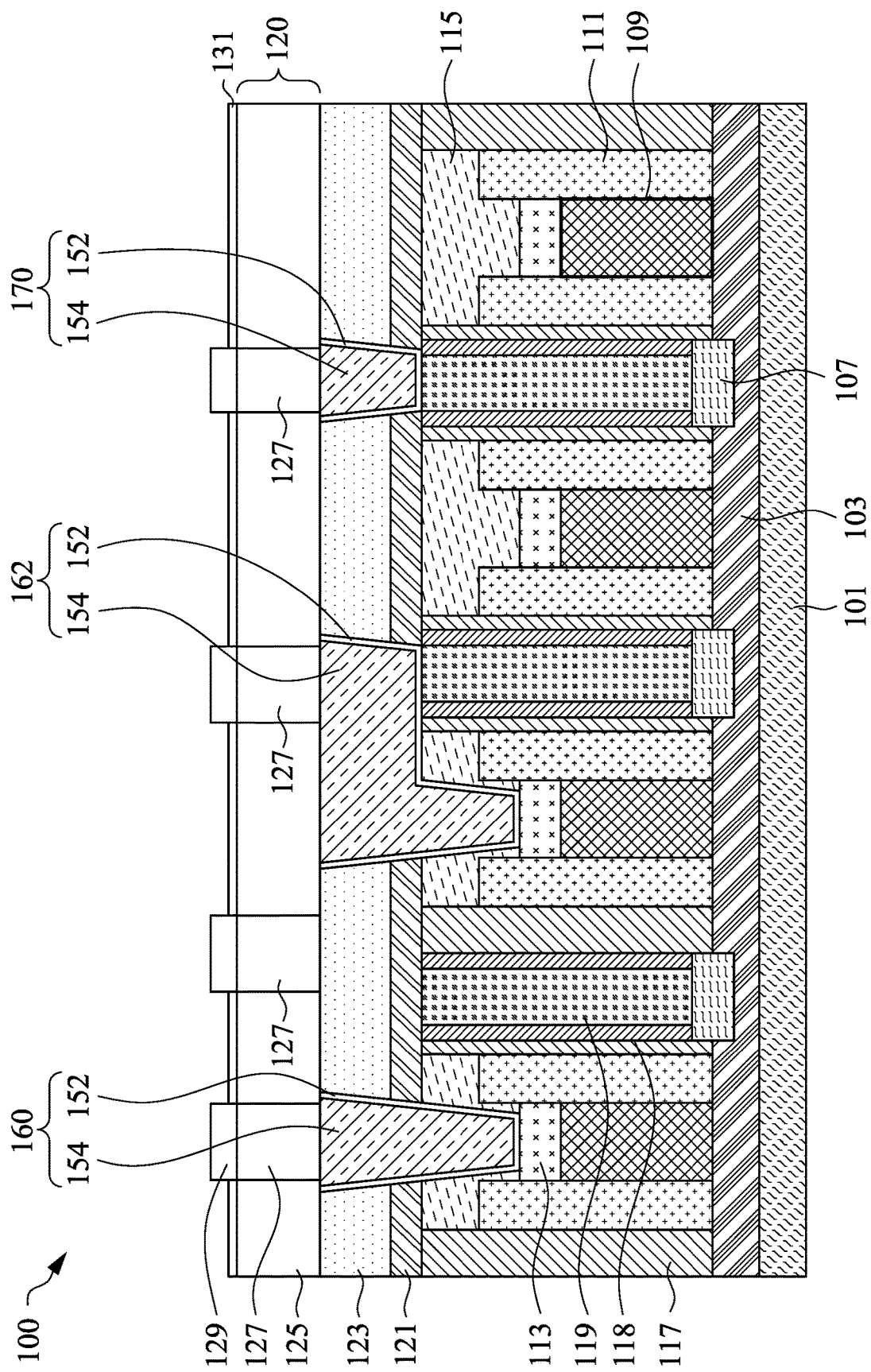

In FIG. 15, an etch-resistant layer 131 is selectively grown on exposed surfaces of the IMD layer 125. The etch-resistant layer 131 may be formed of similar materials and by similar methods as described above with respect to FIG. 7, except that the etch-resistant layer 131 is formed to a thickness smaller than the thickness of the inhibitor caps 129, e.g. in a range of 1 nm to 3 nm.

Figure 16:
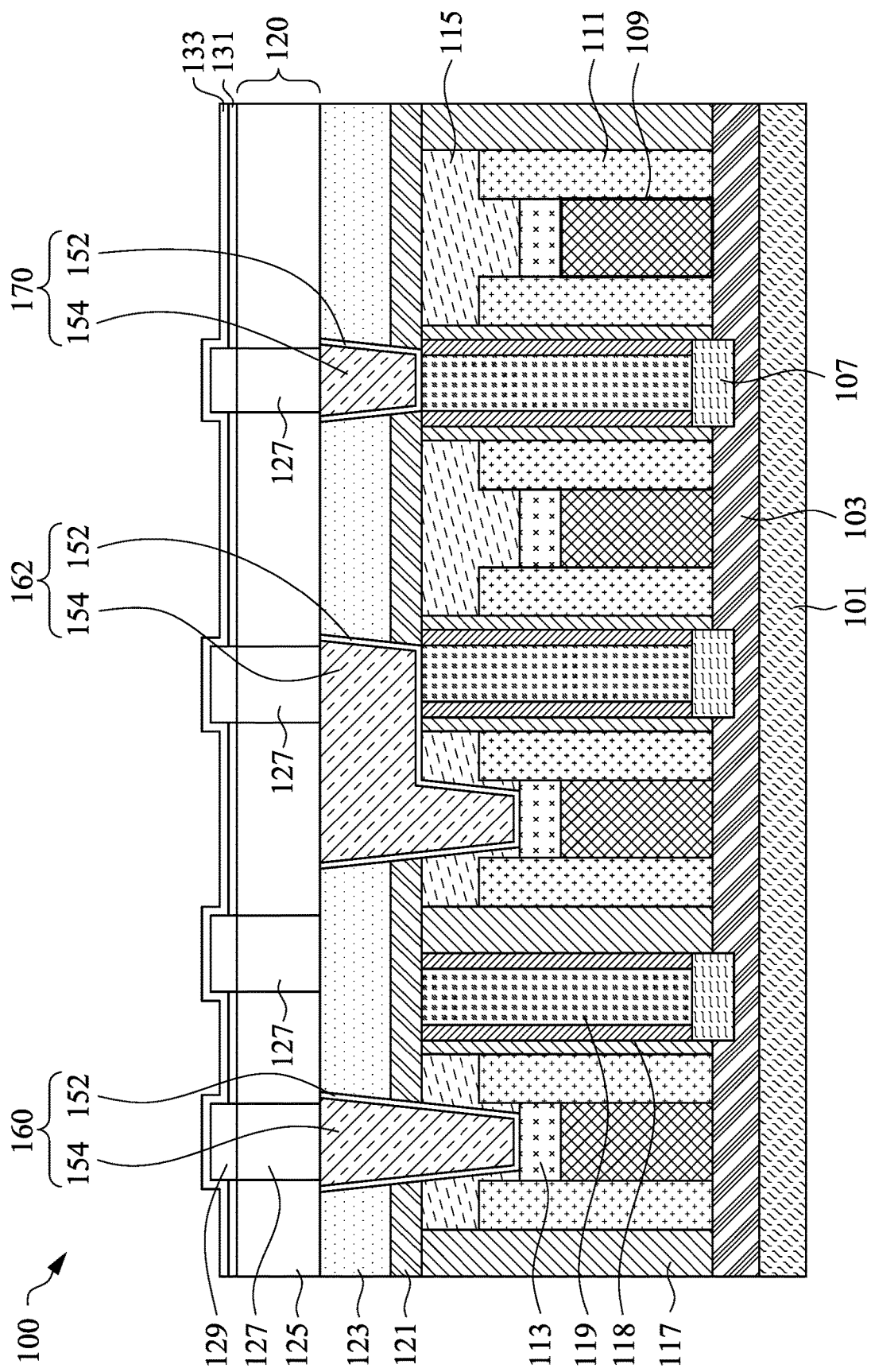

In FIG. 16, an etch stop layer (ESL) 133 is formed over the etch-resistant layer 131 and the inhibitor caps 129. The ESL 133 may be formed of similar materials and by similar methods as described above with respect to FIG. 8. Upper portions of the ESL 133 over the inhibitor caps 129 are located further from the substrate 101 than lower portions of the ESL 133 over the etch-resistant layer 131, so that the ESL 133 has a square wave profile in a cross-sectional view.

Figure 17:
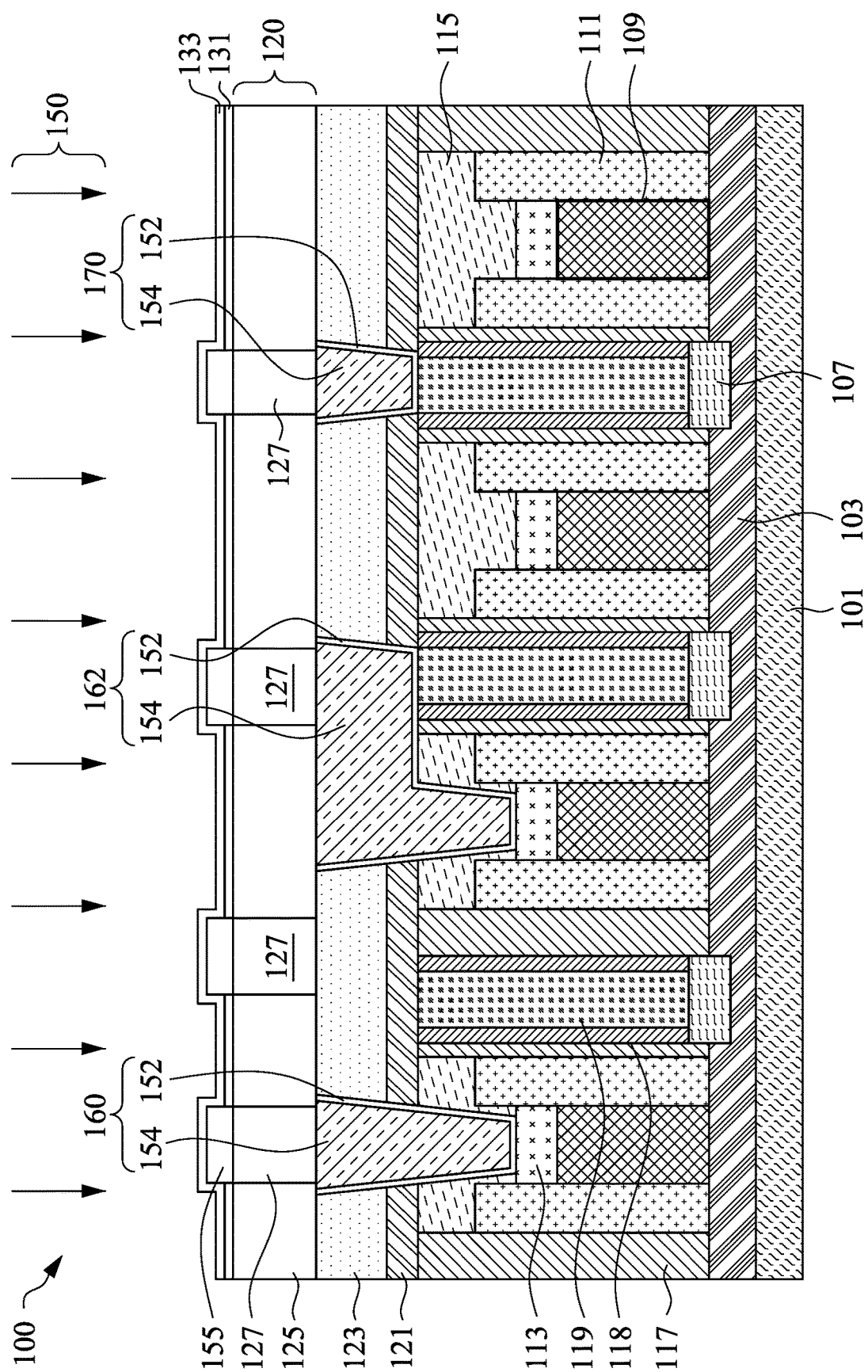

In FIG. 17, a plasma treatment 150 is performed to remove the inhibitor caps 129 and form air caps 155. The plasma treatment 150 may be performed with similar methods as described above with respect to FIG. 9. The air caps 155 extend above upper surfaces of the ESL 133 over the etch-resistant layer 131, and the air caps 155 illustrated in FIG. 17 have larger volumes that the air caps illustrated above in FIG. 9.

Figure 18:
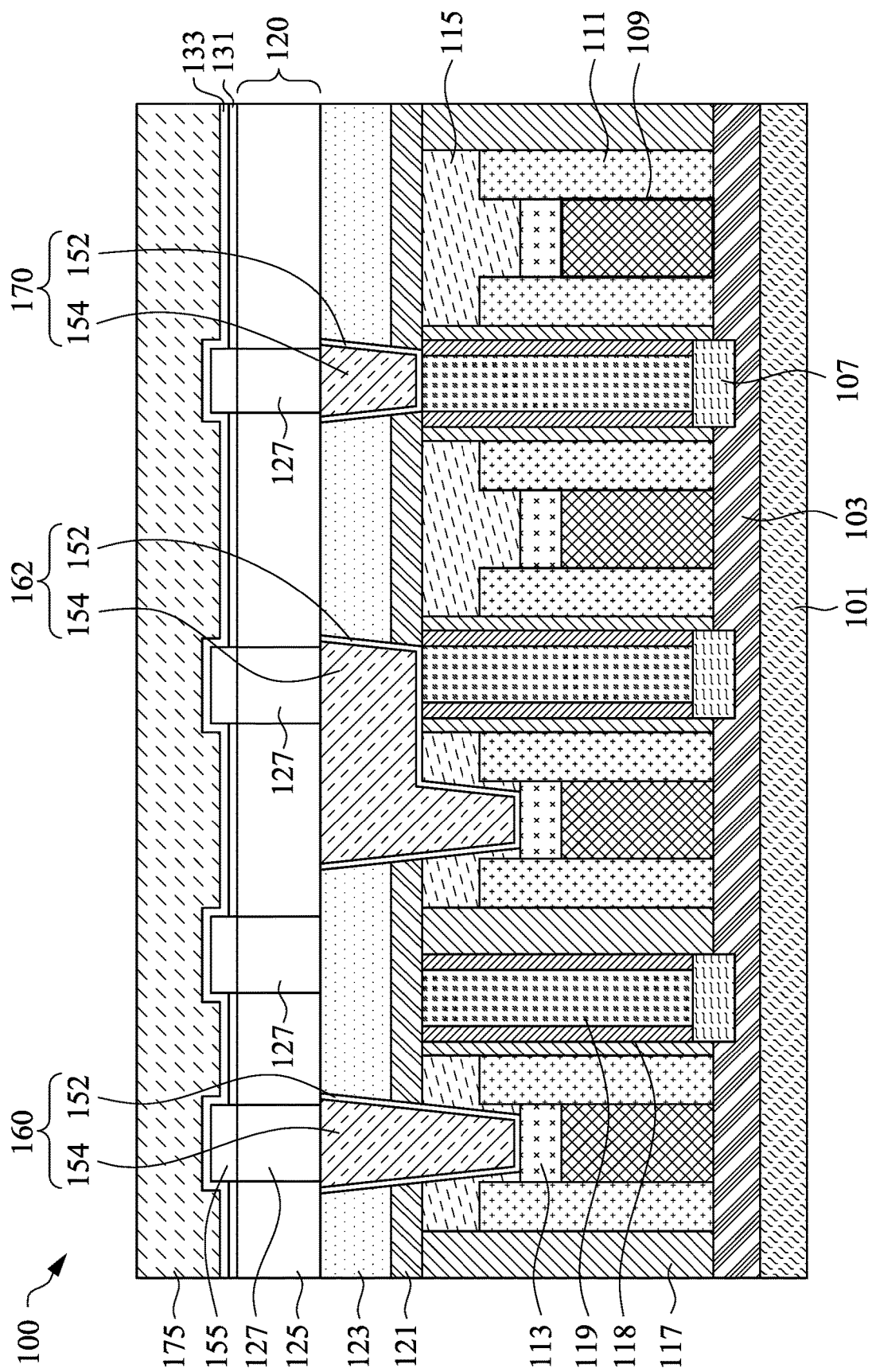

In FIG. 18, an IMD layer 175 is formed over the ESL 133. The IMD layer 175 may be formed of similar materials and by similar methods as the first ILD layer 117 and the second ILD layer 123 as described above with respect to FIGS. 1 and 2, respectively.

Figure 19:
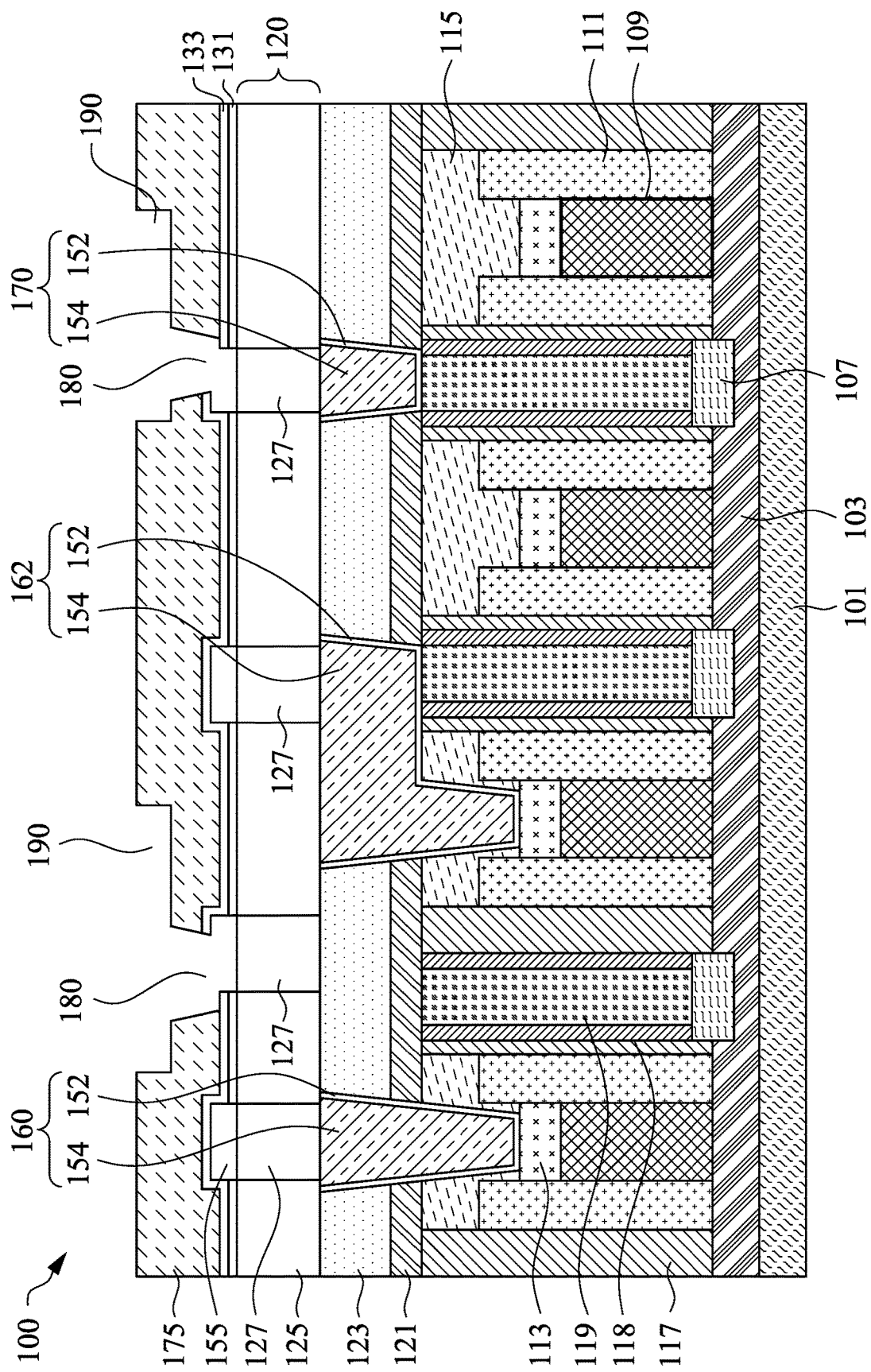

In FIG. 19, openings 180 for vias and openings 190 for lines are formed in the IMD layer 175. The openings 180 and 190 may be formed with similar methods as described above with respect to FIG. 11.

Figure 20:
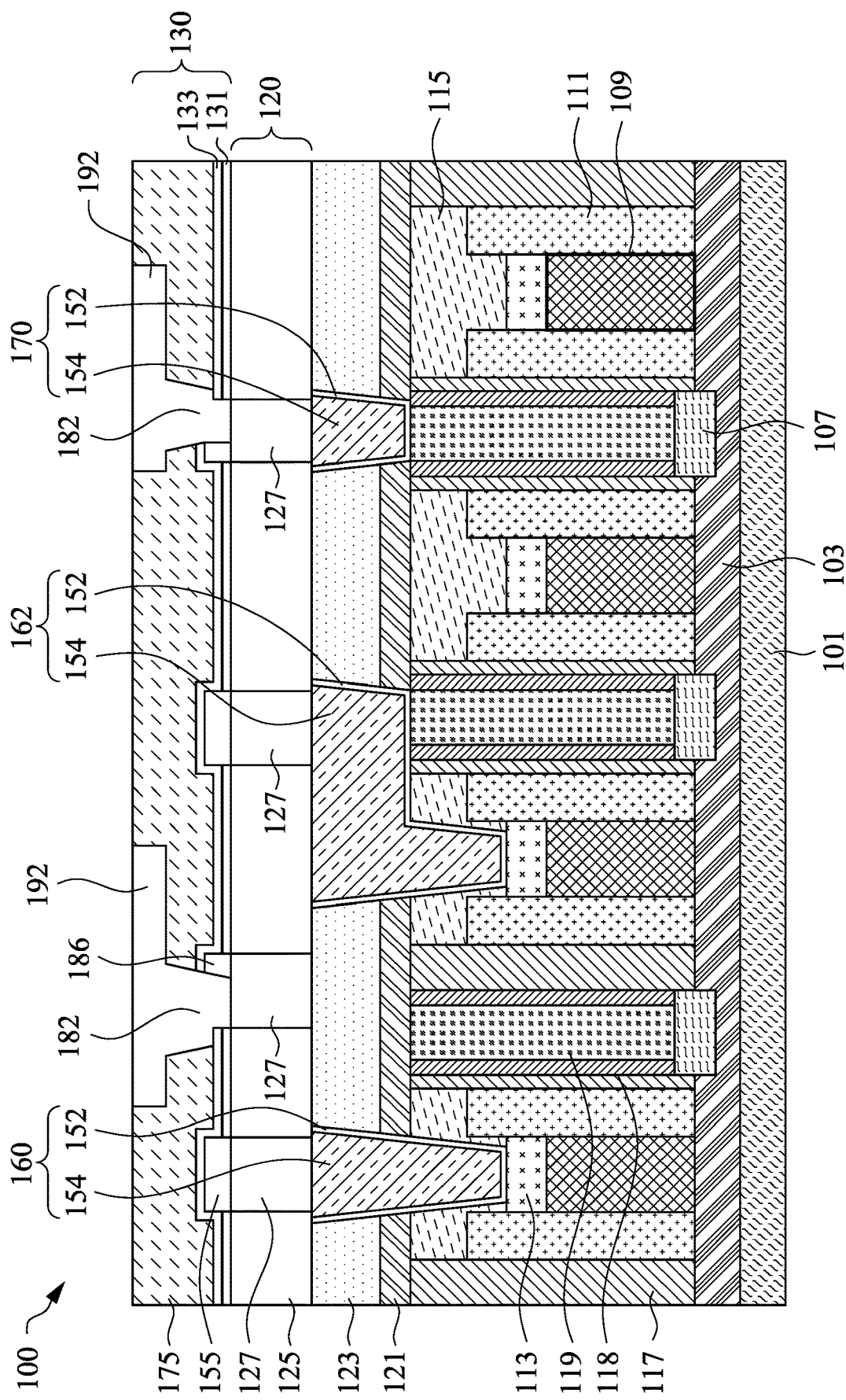

In FIG. 20, conductive vias 182 are formed in the openings 180 and conductive lines 192 are formed in the openings 190. The conductive vias 182 and conductive lines 192 may be formed of similar materials and by similar methods as described above with respect to FIG. 12. Voids 186 may be formed between top surfaces of the conductive features 127 and lower surfaces of the ESL 133 with larger volumes than the voids 184 illustrated above in FIG. 13B due to the larger vertical thickness and larger volumes of the air caps 155 (see above, FIG. 17) leading to the filling process pinching off the voids 186 with larger volumes.

FIGS. 21 through 35 are cross-sectional views of intermediate steps during a process for forming a semiconductor device 200. In this embodiment, the semiconductor device 200 is similar to the semiconductor device 100 described above with reference to FIGS. 1A through 12, where like reference numerals indicate like elements formed using like processes. Embodiments of the semiconductor device 200 and the manufacturing thereof may differ from embodiments of the semiconductor device 100 and the manufacturing thereof by, e.g., a first interconnect level 220 having air gaps 218 adjacent to conductive features 215.

As feature sizes and spaces between them shrink with increasing miniaturization, coupling capacitance between adjacent conductive features (e.g., conductive lines) may increase as the volume of dielectric material volume decreases. This can lead to increased RC delay, which may decrease device performance. It is beneficial to include air gaps between adjacent conductive features, as the dielectric constant of air (e.g., around 1) is significantly less than the dielectric constant of solid low-k dielectric materials (e.g., around 3 to 4). The inclusion of air gaps 218 adjacent to conductive features 215 may decrease coupling capacitance between the adjacent conductive features 215 by 10% or greater.

Although the structures of FIGS. 21 through 35 are illustrated as a first interconnect level 220, it should be appreciated that the structures of the first interconnect level 220 may be placed at any interconnect layer suitable in a particular design, such as e.g. the first interconnect layer, the second interconnect layer, and/or the fifth interconnect layer.

Figure 21:
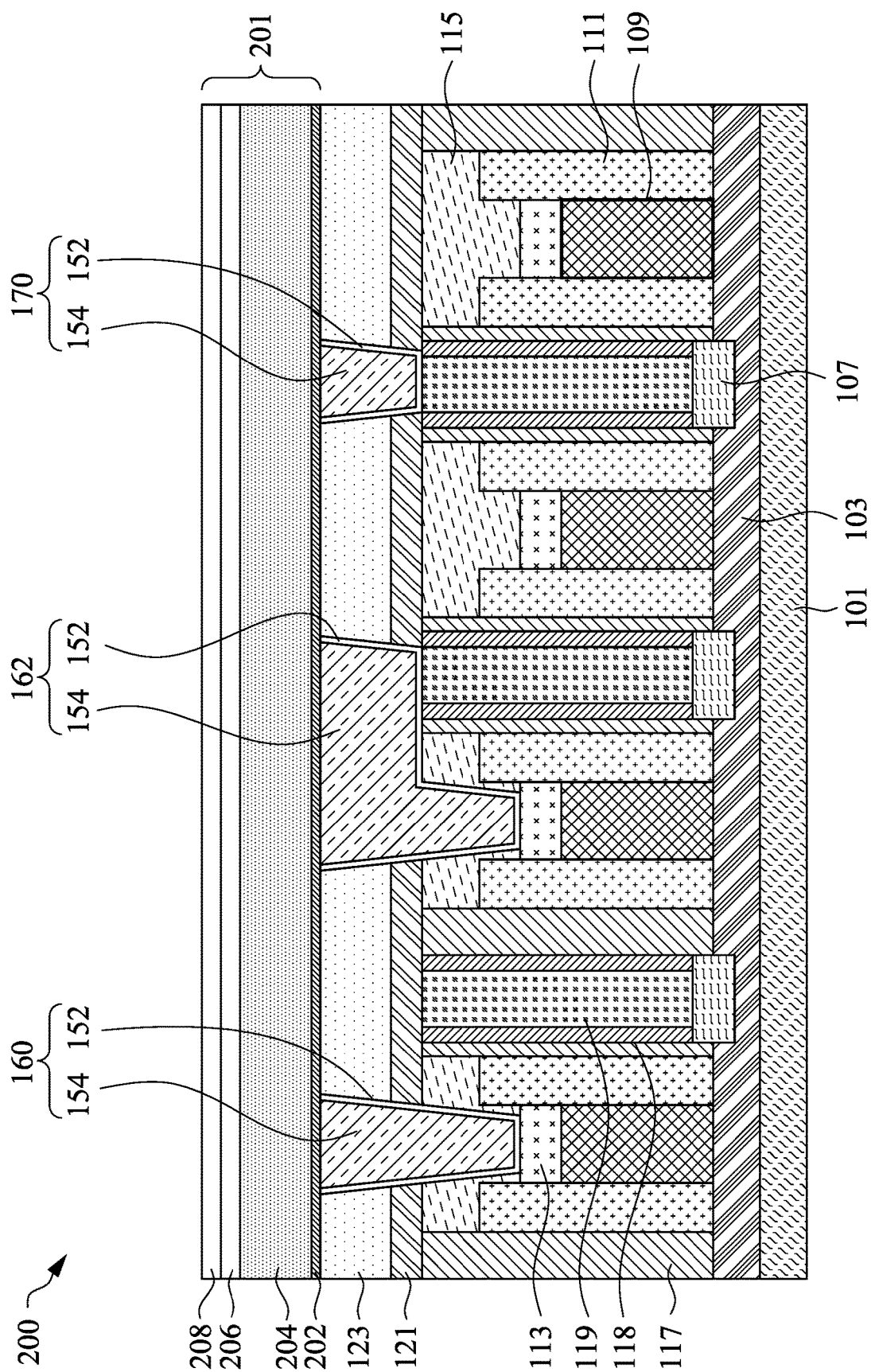
FIGS. 21 through 35 illustrate cross-sectional views of a semiconductor device at intermediate stages of manufacturing, in accordance with some embodiments.

FIG. 21 illustrates an embodiment, similar to the embodiment shown above in FIG. 4, in which a dielectric stack 201 including an etch stop layer (ESL) and dielectric layers is formed over the gate contacts 160, butted contacts 162 (if present), conductive structures 170, and second ILD layer 123. The dielectric stack 201 is used for the subsequent formation of conductive features in a first interconnect level 220 (see below, FIG. 33). In some embodiments in accordance with FIG. 21, the dielectric stack 201 includes an ESL 202, a dielectric layer 204 on the ESL 202, a first mask layer 206 on the dielectric layer 204, and a second mask layer 208 on the first mask layer 206.

The ESL 202 is formed over the gate contacts 160, butted contacts 162 (if present), conductive structures 170, and second ILD layer 123. The ESL 202 may be formed of similar materials and by similar methods as the ESL 121 as described above with respect to FIG. 3 or the ESL 133 as described above with respect to FIG. 8. The ESL 202 is used for controlling subsequent etching processes to form openings for conductive features (see below, FIGS. 22-23 and 27).

Next, the dielectric layer 204 is formed over the ESL 202. The dielectric layer 204 is used for providing structural and electrical isolation of conductive structures within or near the layer. The dielectric layer 204 comprises one or more insulator layers such as (but not limited to) silicon oxide, silicon oxynitride, silicon oxycarbonitride, silicon carbide, silicon oxycarbide, or silicon nitride. In some embodiments, the dielectric layer 204 is formed using PECVD, FCVD, spin-on coating, or the like.

Still referring to FIG. 21, the first mask layer 206 is formed over the dielectric layer 204. In some embodiments, the first mask layer 206 is formed of a dielectric material such as silicon oxide, which may be formed, for example, using tetraethylorthosilicate (TEOS) as a precursor. The dielectric material of the first mask layer 210 has a high etching selectivity from the second mask layer 208 (described below), which may be useful for controlling subsequent etch processes for trench patterning (see below, FIGS. 22-23). The formation methods of the material of the first mask layer 206 may include Chemical Vapor Deposition (CVD), Plasma Enhance Chemical Vapor Deposition (PECVD), Sub Atmosphere Chemical Vapor Deposition (SACVD), or the like.

Next, the second mask layer 208 is formed over the first mask layer 206. The second mask layer 208 is formed of a tungsten-containing mask material, such as tungsten carbide, which has a strong physical modulus for subsequent trench patterning (see below, FIGS. 22-23). Because the tungsten-containing mask material has a strong physical modulus, the line width roughness (LWR) of the subsequently patterned trenches may be reduced. The material of the second mask layer 208 may be formed using PECVD, Atomic Layer Deposition (ALD), CVD, Physical Vapor Deposition (PVD), or the like.

Figure 22:
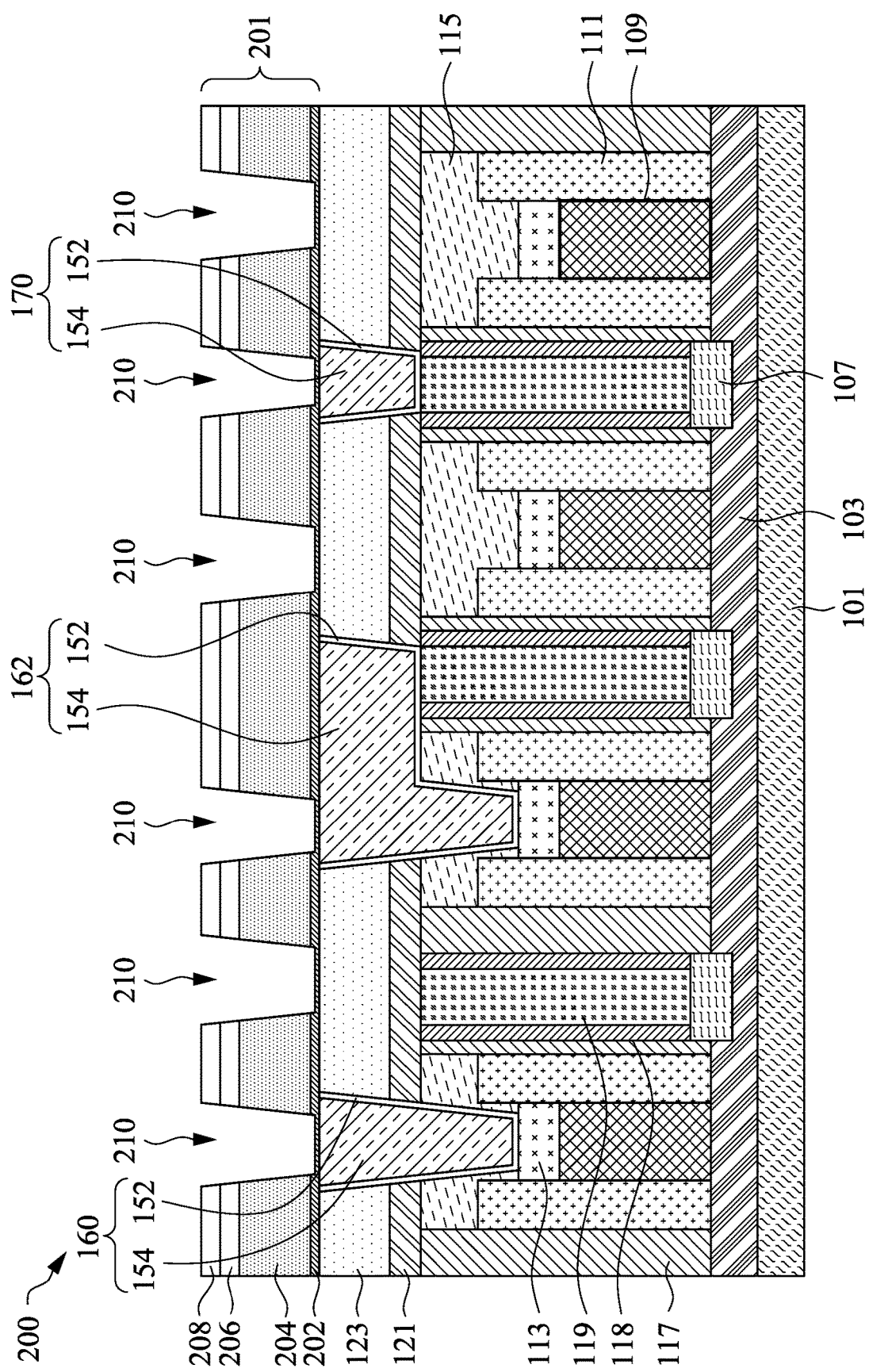

In FIG. 22, openings 210 are formed into the dielectric stack 201 for the subsequent formation of conductive features (see below, FIG. 29). Appropriate photolithography and etching techniques may be used to pattern the second mask layer 208 and transfer that pattern to the underlying first mask layer 206 and the dielectric layer 204. In some embodiments, the openings 210 are longitudinal trenches extending through the dielectric layer 204 to expose a top surface of the ESL 202.

Figure 23:
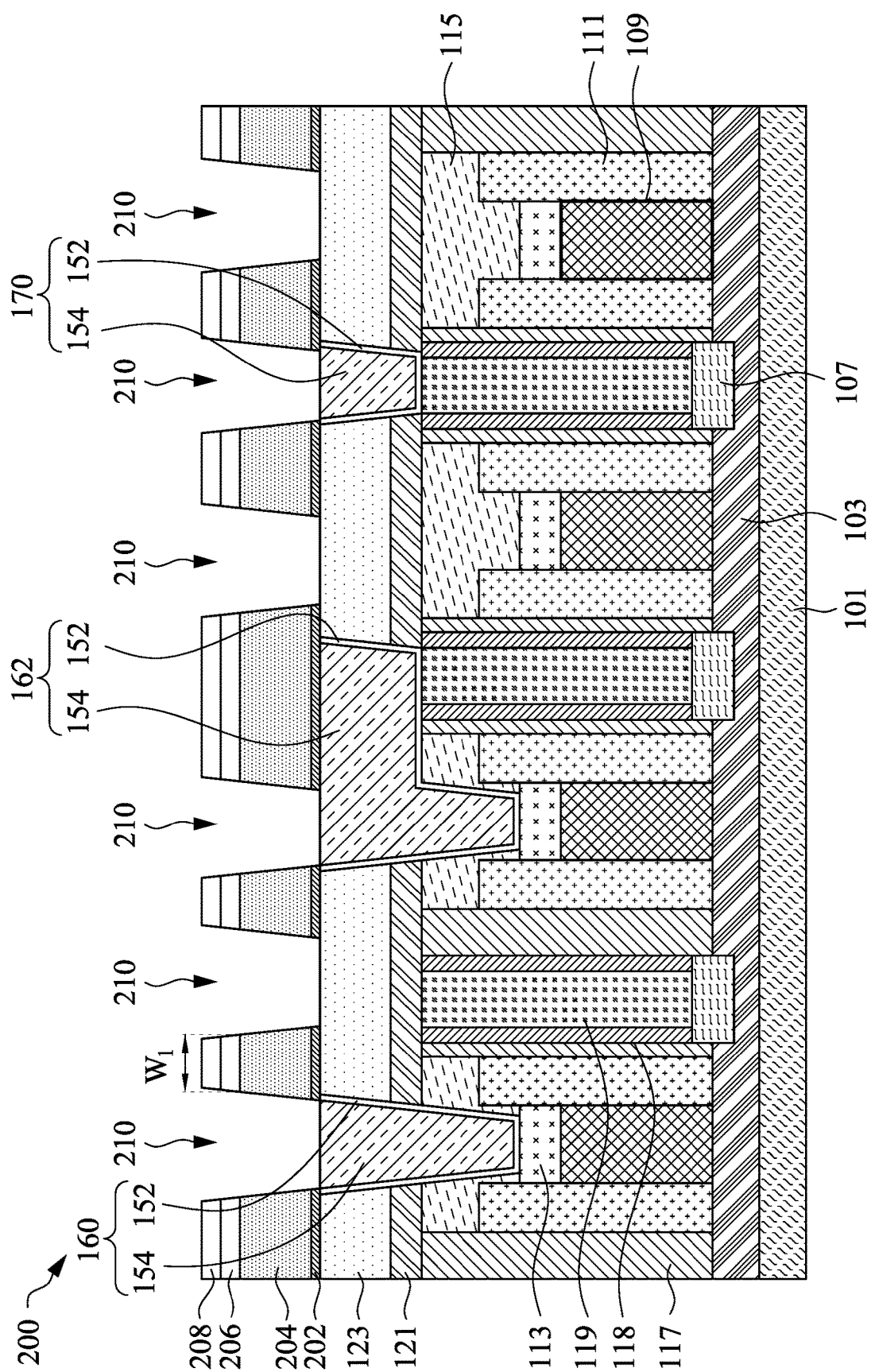

In FIG. 23, an etch back of the ESL 202 is performed to remove portions of the ESL 202 along bottom surfaces of the openings 210 and expose top surfaces of the gate contacts 160, butted contacts 162 (if present), and conductive structures 170. In some embodiments, the etch back is performed with a dry etch followed by a wet etch. The dry etch may be performed using an etching gas or plasma comprising carbon tetrafluoride ($CF_4$), hydrogen ($H_2$), argon, nitrogen trifluoride ($NF_3$), nitrogen ($N_2$), the like, or a combination thereof. The dry etch may be performed using a plasma generation power in a range of 200 W to 800 W and at a temperature in a range of 100° C. to 300° C. The wet etch may be performed using a cleaning solution comprising a cleaning aluminum oxide solution, ammonium fluoride ($NH_4F$), hydrogen peroxide ($H_2O_2$), isopropyl alcohol, nitric acid ($HNO_3$), the like, or a combination thereof, at a temperature in a range of 30° C. to 50° C.

In some embodiments, the etch back of the ESL 202 also trims the sidewalls of the openings 210. Sidewalls of the openings 210 may be trimmed back by a range of 2 nm to 5 nm. Portions of the dielectric layer 204 between adjacent openings 210 may have first widths $W_1$ in a range of 5 nm to 50 nm after the etch back of the ESL 202.

Figure 24:
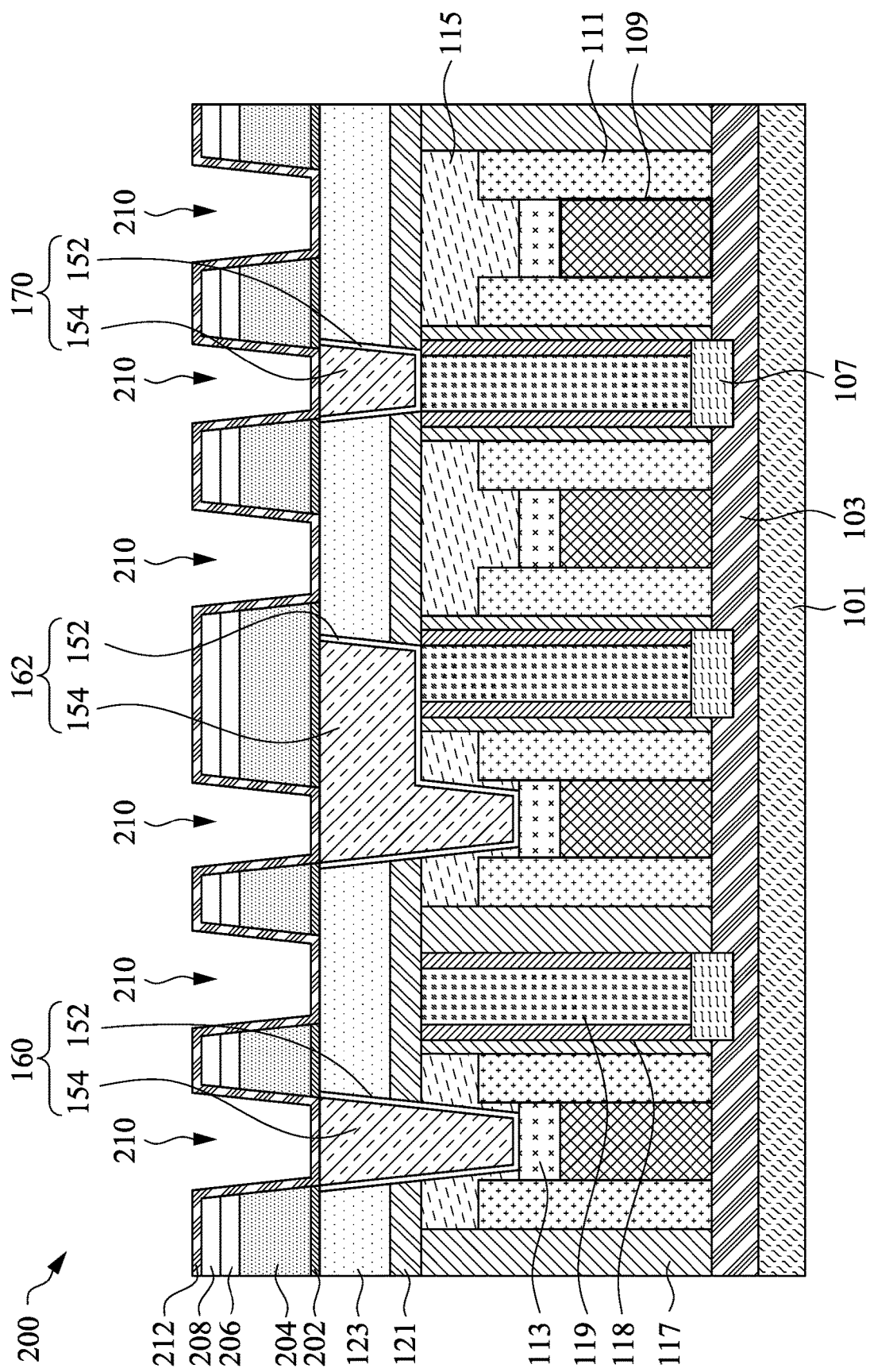

In FIG. 24, a sacrificial layer 212 is formed over exposed surfaces of the structure, covering sidewalls and bottom surfaces of the openings 210. The sacrificial layer 212 will be subsequently removed to form air gaps adjacent to subsequently formed conductive features (see below, FIG. 28). The sacrificial layer 212 may be formed to a thickness in a range of 2 nm to 5 nm. In some embodiments, the sacrificial layer 212 comprises silicon nitride, silicon carbonitride, silicon oxycarbide, silicon boron nitride, silicon boron carbonitride, the like, or a combination thereof. The sacrificial layer 212 may be formed using one or more precursors such as silane ($SiH_4$), ammonia ($NH_3$), tetramethylsilane ($Si(CH_3)_4$), diborane ($B_2H_6$), or the like, with a suitable process such as PECVD, Atomic Layer Deposition (ALD), CVD, Physical Vapor Deposition (PVD), or the like. In some embodiments, the sacrificial layer 212 is formed at a temperature in a range of 40° C. to 300° C., under a pressure in a range of 1 torr to 10 torr, for a duration in a range of 30 seconds to 30 minutes.

Figure 25:
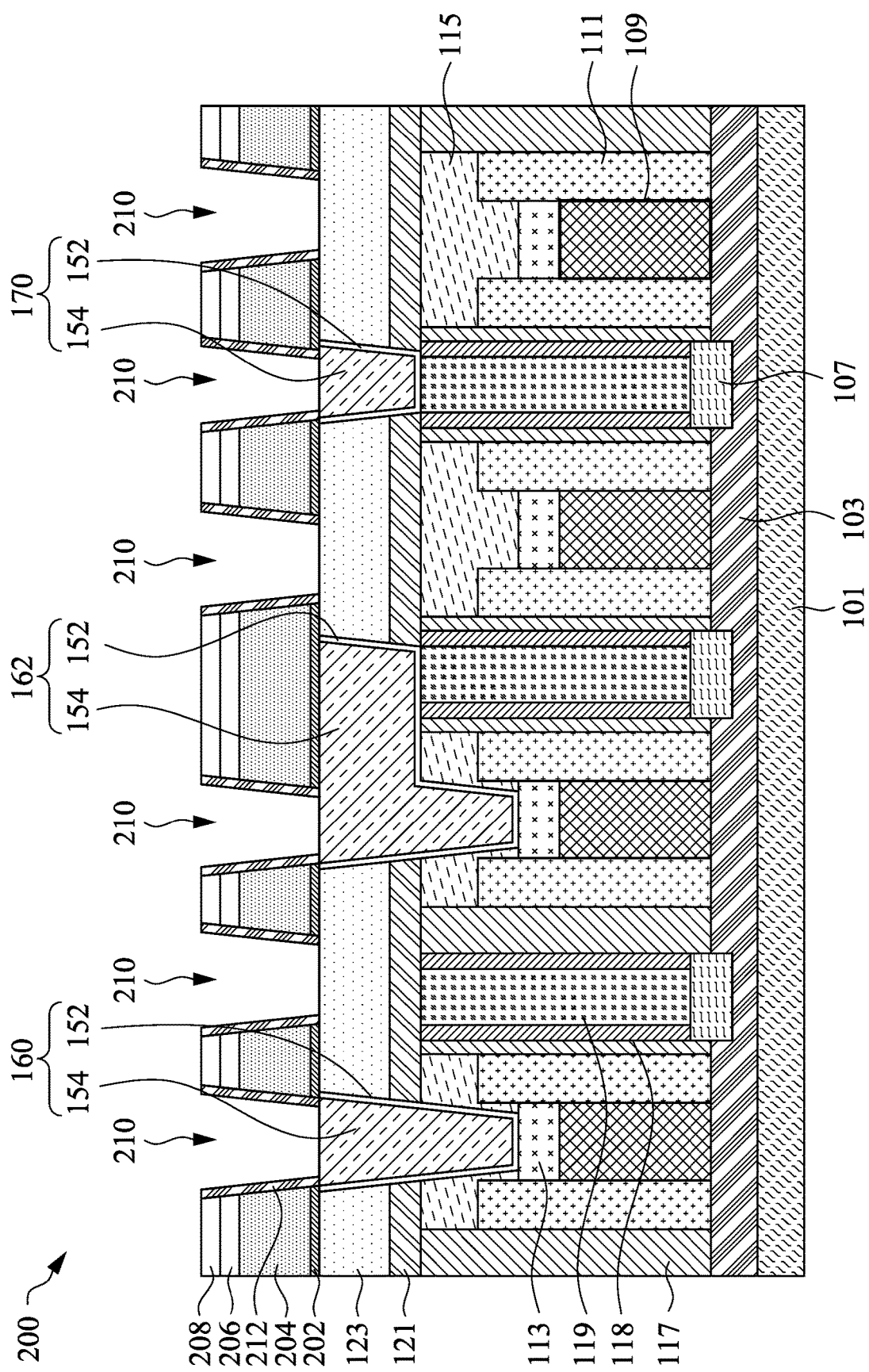

In FIG. 25, the sacrificial layer 212 is etched back to expose top surfaces of the second mask layer 208 and bottom surfaces of the openings 210. Remaining portions of the sacrificial layer 212 on the sidewalls of the openings 210 will be subsequently removed to form air gaps adjacent to subsequently formed conductive features (see below, FIG. 28). In some embodiments, the etch back process is an anisotropic process, such as a dry etch using an etching gas or plasma comprising carbon tetrafluoride ($CF_4$), hydrogen ($H_2$), argon, nitrogen trifluoride ($NF_3$), nitrogen ($N_2$), the like, or a combination thereof. The dry etch may be performed using a plasma generation power in a range of 200 W to 800 W and at a temperature in a range of 100° C. to 300° C.

Figure 26:
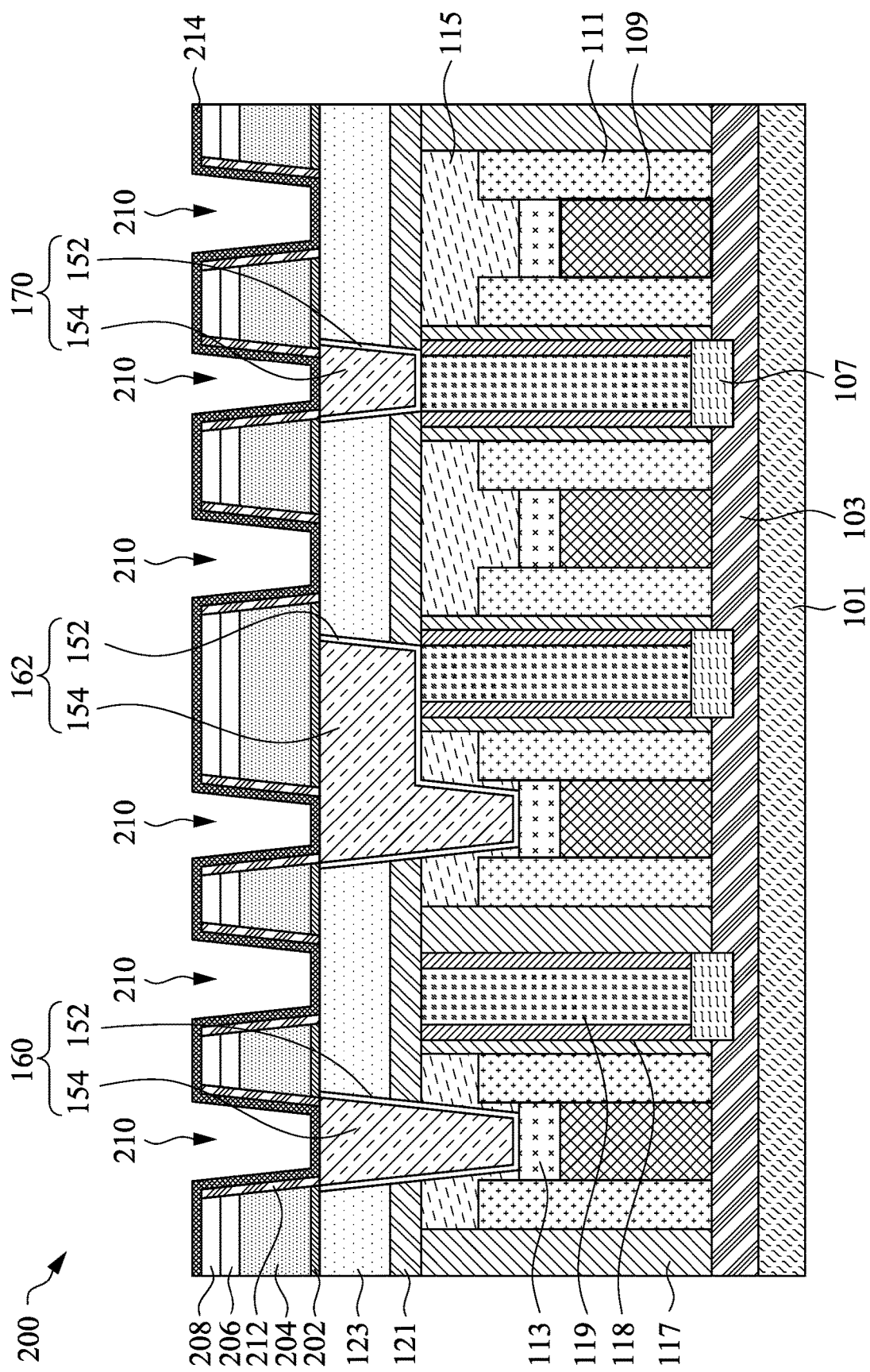

In FIG. 26, a liner layer 214 is formed over exposed surfaces of the second mask layer 208 and the openings 210. The liner layer 214 will subsequently form sidewall and bottom portions of conductive features 215 (see below, FIG. 29). The liner layer 214 may include multiple layers, such as an outer barrier layer and an inner liner layer. In some embodiments, the outer barrier layer comprises tantalum nitride, tantalum, titanium nitride, the like, or a combination thereof, and is formed to a thickness in a range of 10 Å to 30 Å with a suitable technique such as CVD, ALD, PEALD, PECVD, PVD, ECP, electroless plating, or the like, or any combination thereof. The inner liner layer is then formed over the outer barrier layer. In some embodiments, the inner liner layer comprises cobalt, ruthenium, copper, tungsten, aluminum, nickel, alloys of these, the like, or combinations thereof, and is formed to a thickness in a range of 10 Å to 30 Å with a suitable technique such as CVD, ALD, PEALD, PECVD, PVD, ECP, electroless plating, or the like, or any combination thereof.

Figure 27:
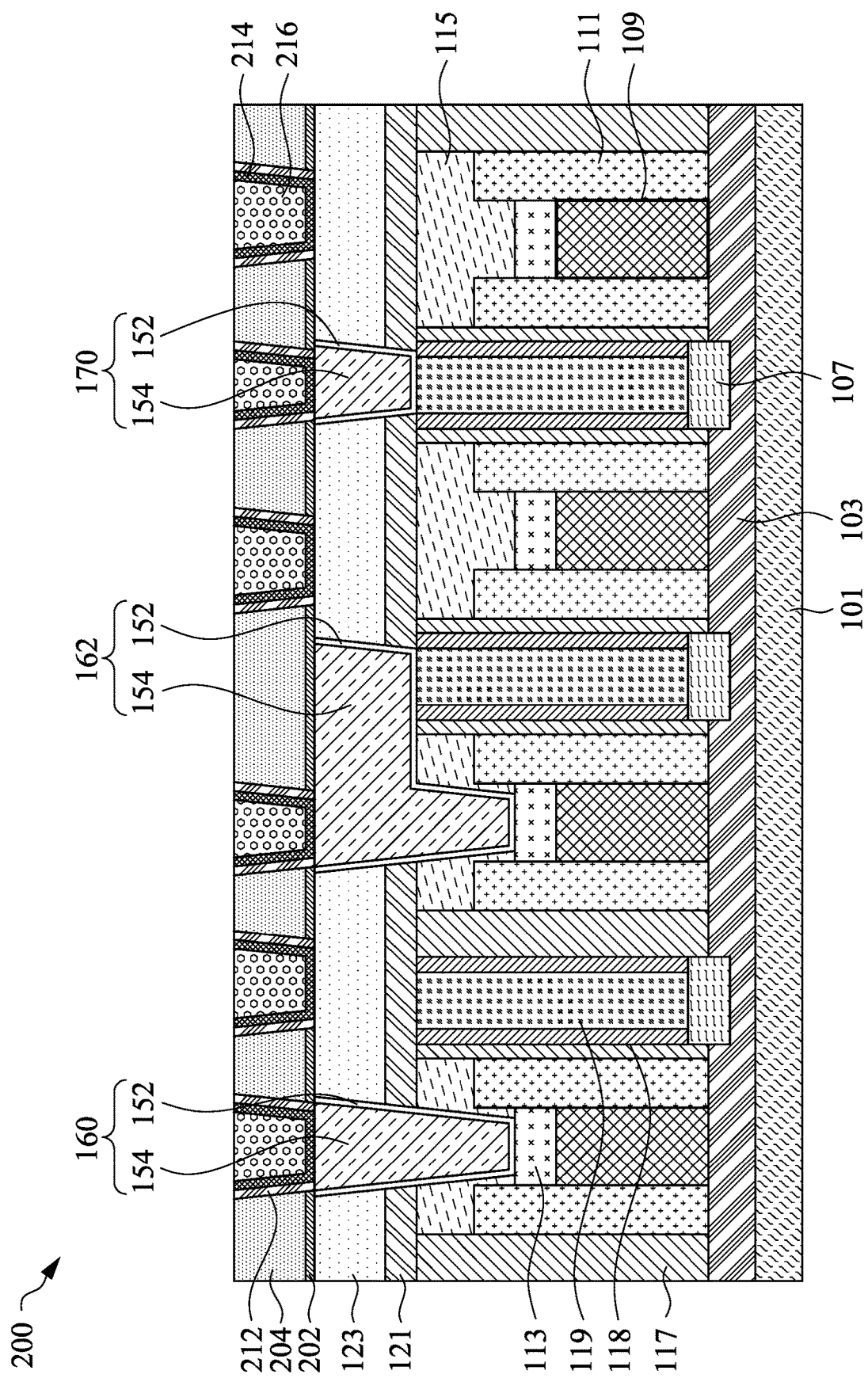

In FIG. 27, the openings 210 are completely filled with a conductive fill material 216 deposited over the liner layer 214. In some embodiments, a thin conductive seed layer may be deposited over the liner layer 214 to help initiate an ECP deposition step that completely fills the openings with a conductive fill material. In some embodiments, the conductive fill material 216 comprises metals such as tungsten, copper, cobalt, ruthenium, copper manganese, molybdenum, aluminum, or the like, or combinations thereof, or multilayers thereof. The conductive fill material 216 is deposited by any suitable method, for example, CVD, PECVD, ALD, PEALD, electrochemical plating (ECP), electroless plating and the like. In some embodiments, the conductive seed layer is of the same conductive material as the conductive fill material 216 and deposited using a suitable deposition technique (e.g., CVD, PECVD, ALD, PEALD, ECP, electroless plating, or the like). After the openings 210 are completely filled, the first mask layer 206, the second mask layer 208, and any excess conductive material over the second mask layer 208 are removed by a planarizing process (e.g., CMP) thereby forming a top surface comprising dielectric regions of the dielectric layer 204 that are substantially coplanar with top surfaces of the sacrificial layer 212, the liner layer 214, and the conductive fill material 216.

Figure 28:
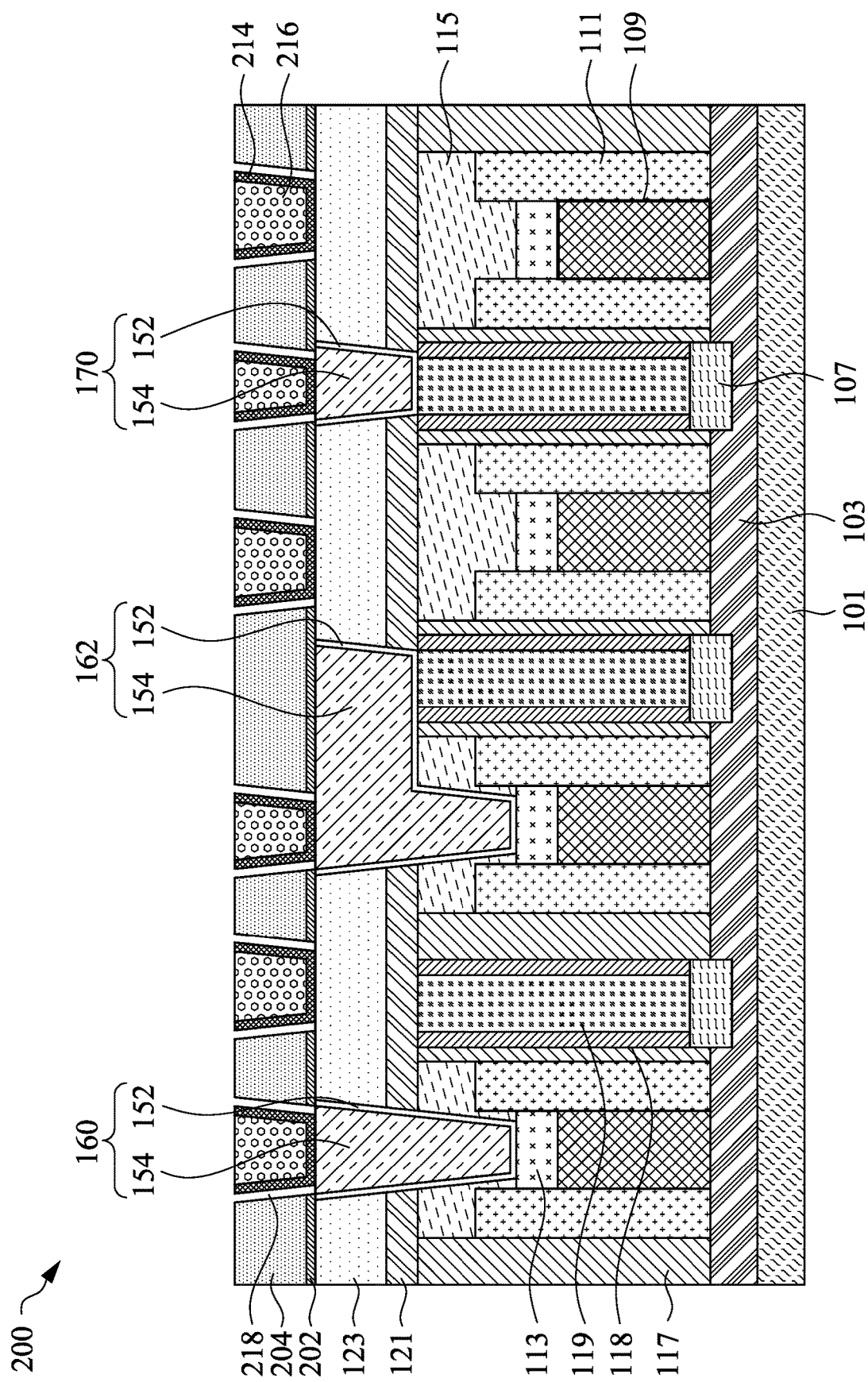

In FIG. 28, the remaining portions of the sacrificial layer 212 are removed to form air gaps 218 between the dielectric layer 204 and the liner layer 214. The remaining portions of the sacrificial layer 212 are removed with a process selective to the material of the sacrificial layer 212 over the material of the dielectric layer 204, the liner layer 214, and the conductive fill material 216. In some embodiments, the removal process is a wet etch with an etchant comprising phosphoric acid ($H_3PO_4$), ammonium fluoride ($NH_4F$), hydrogen peroxide ($H_2O_2$), the like, or a combination thereof. The wet etch may be performed at a temperature in a range of 100° C. to 150° C. and for a duration in a range of 5 minutes to 20 minutes. However, any suitable removal process selective to the material of the sacrificial layer 212 over the material of the dielectric layer 204, the liner layer 214, and the conductive fill material 216 may be used. The inclusion of air gaps 218 adjacent to subsequently formed conductive features may decrease coupling capacitance between the adjacent conductive features by 10% or greater, which may decrease RC delay and improve device performance.

Figure 29:
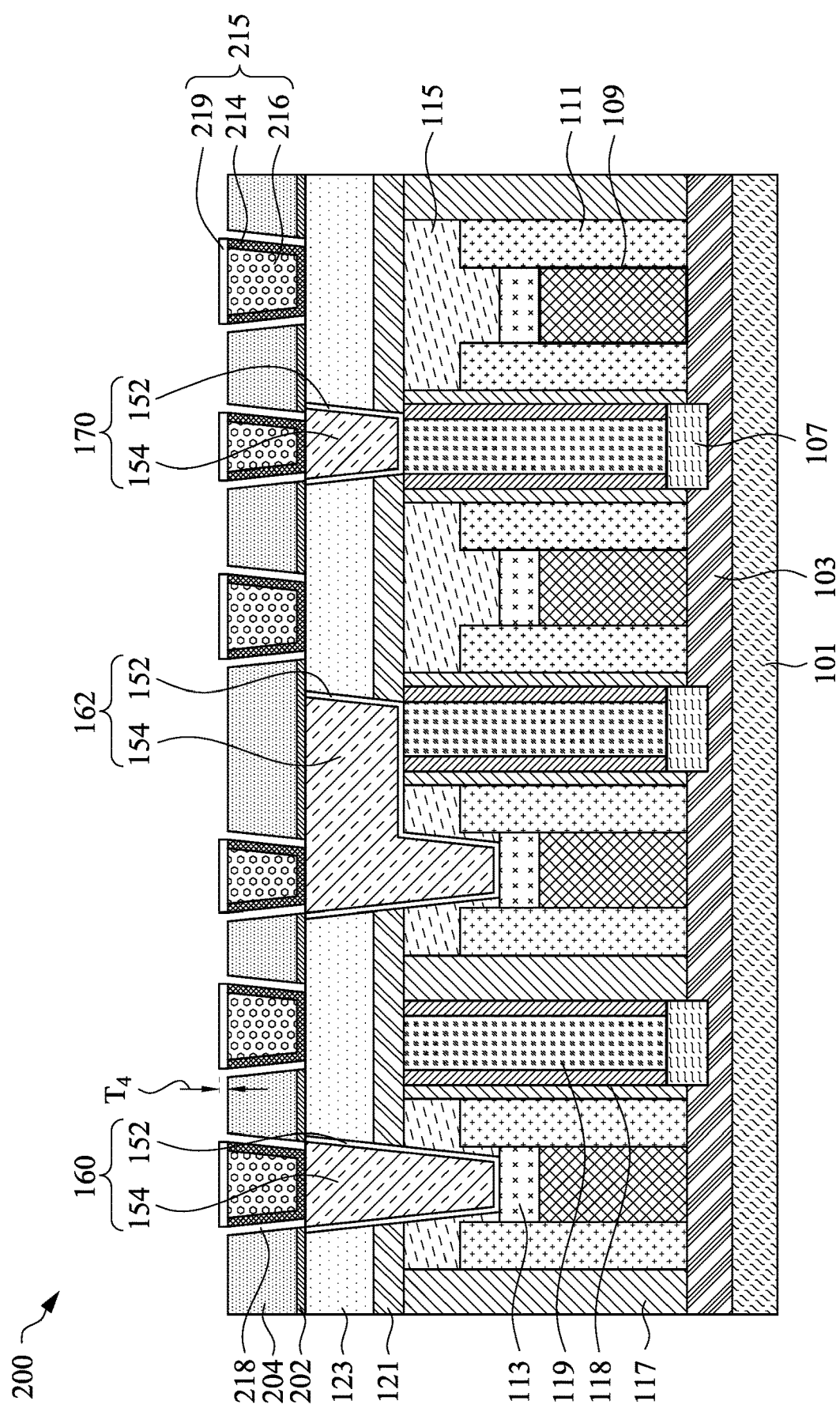

In FIG. 29, a capping layer 219 is formed over top surfaces of the liner layer 214 and the conductive fill material 216 to form conductive features 215. In some embodiments, the conductive features 215 are conductive lines. The capping layer 219 may provide electromigration protection for the conductive features 215. In some embodiments, the capping layer 219 is formed by a selective deposition (e.g., an ALD process) of a metal such as cobalt, ruthenium, the like, or a combination thereof, on the top surfaces of the liner layer 214 and the conductive fill material 216. When the capping layer 219 comprises cobalt, the selective deposition may be performed with precursors such as cyclopentadienylcobalt dicarbonyl ($CpCo(CO)_2$), bis(cyclopentadienly)cobalt, the like, or a combination thereof. When the capping layer 219 comprises ruthenium, the selective deposition may be performed with precursors such as triruthenium dodecacarbonyl, bis(ethylcyclopentadienyl)ruthenium(II), cyclopentadienylethyl (dicarbonyl)ruthenium, the like, or a combination thereof. In some embodiments, the selective deposition of the capping layer 219 is performed temperature in a range of 150° C. to 550° C., under a pressure in a range of 1 torr to 20 torr, and for a duration in a range of 5 minutes to 30 minutes.

In some embodiments, the capping layer 219 has a fourth thickness $T_4$ in a range of 10 Å to 30 Å, which is advantageous for providing electromigration protection for the conductive features 215. A capping layer 219 with a thickness less than 10 Å may be disadvantageous by providing poor electromigration protection. A capping layer 219 with a thickness greater than 30 Å may be disadvantageous by leading to increased RC delay.

Figure 30:
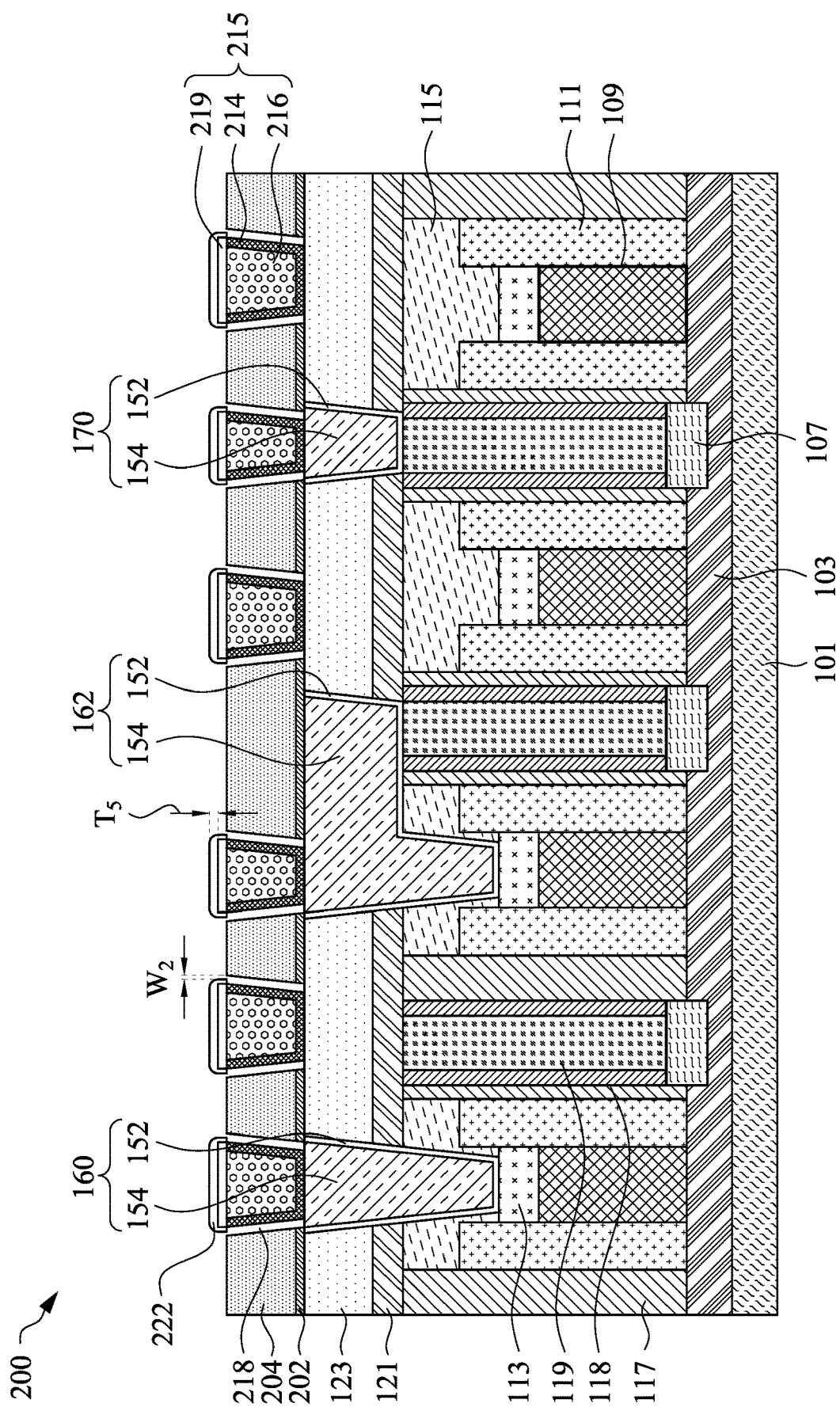

In FIG. 30, inhibitor caps 222 are selectively grown on top surfaces of the conductive features 215. The inhibitor caps 222 may be formed to extend at least partially over the air gaps 218, which is useful for protecting the air gaps 218 from being filled by etch stop layer material in subsequent processes. The inhibitor caps 222 reduce formation of a subsequently formed etch stop layer (see below, FIG. 32) on top surfaces of the conductive features 127. The material of the inhibitor caps 129 is chosen to have selectivity with a conductive material (e.g., the material of the capping layer 219) over a dielectric material (e.g., the material of the dielectric layer 204). As such, the inhibitor caps 222 are formed on top surfaces of the conductive features 215 at a faster rate than on top surfaces of the dielectric layer 204.

In some embodiments, a gap is formed between the inhibitor caps 222 and the dielectric layer 204 with a second width $W_2$ less than 5 Å, which may be advantageous for maintaining the air gaps 218 during subsequent deposition processes (e.g., of etch stop layer material; see below, FIGS. 31 and 33). The gap having a width greater than 5 Å may lead to subsequent filling of the air gaps 218, thus increasing device capacitance.

In some embodiments, the inhibitor caps 222 comprise organic materials such as: organosilanes having eight to twenty carbon atoms (e.g., dodecylsilane); organophosphoric acid having eight to twenty carbon atoms (e.g., octadecylphosphonic acid), low-k dielectric polyethylene, or an organic polymer such as polyimide (e.g, pyromellitic dianhydride+1,6-diaminohexane), polyamide (e.g., ethylene diamine and adipoyl chloride), or the like; the like, or a combination thereof. The inhibitor caps 222 may be formed with a wet growth process such as such as spin-on coating, wet dipping, or the like, or a dry growth process such as CVD, ALD, or the like.

In some embodiments, the inhibitor caps 222 are formed to a fifth thickness $T_5$ in a range of 1 nm to 3 nm, which is advantageous for forming the inhibitor caps 222 to cover the conductive features 215 without extending over adjacent surfaces of the dielectric layer 204. This may lead to improved subsequent formation of the air caps 155 (see below, FIG. 9). Forming the inhibitor caps 222 to a thickness less than 1 nm may be disadvantageous by insufficiently inhibiting the subsequent deposition of etch stop material (see below, FIG. 31) on the conductive features 215, which may cause the air gaps 218 to be filled and increase device capacitance. Forming the inhibitor caps 222 to a thickness greater than 3 nm may be disadvantageous by causing the inhibitor material to laterally extend over the adjacent surfaces of the dielectric layer 204, which may lead to poor subsequent selective deposition of etch stop material (see below, FIGS. 7 and 8) on the dielectric layer 204.

In some embodiments, the inhibitor caps 222 are formed at a temperature in a range of 40° C. to 300° C., at a pressure (dry) in a range of 1 torr to 10 torr, and for a duration in a range of 30 seconds to 30 minutes. Growing the inhibitor caps 222 at a temperature, at a pressure, and for a duration in these ranges allows inhibitor caps 222 to have a desired fifth thickness $T_5$ in the previously described range. Growing the inhibitor caps 129 at a temperature, at a pressure, or for a duration less than these ranges may lead the inhibitor caps 129 to have a thickness less than 1 nm. This may be disadvantageous by insufficiently inhibiting the subsequent deposition of etch stop material (see below, FIG. 31) on the conductive features 215, which may lead to the air gaps 218 being undesirably filled. Growing the inhibitor caps 222 at a temperature, at a pressure, or for a duration more than these ranges may lead the inhibitor caps 222 to have a thickness more than 3 nm. This may be disadvantageous by causing the inhibitor material to laterally extend over the adjacent surfaces of the dielectric layer 204.

Figure 31:
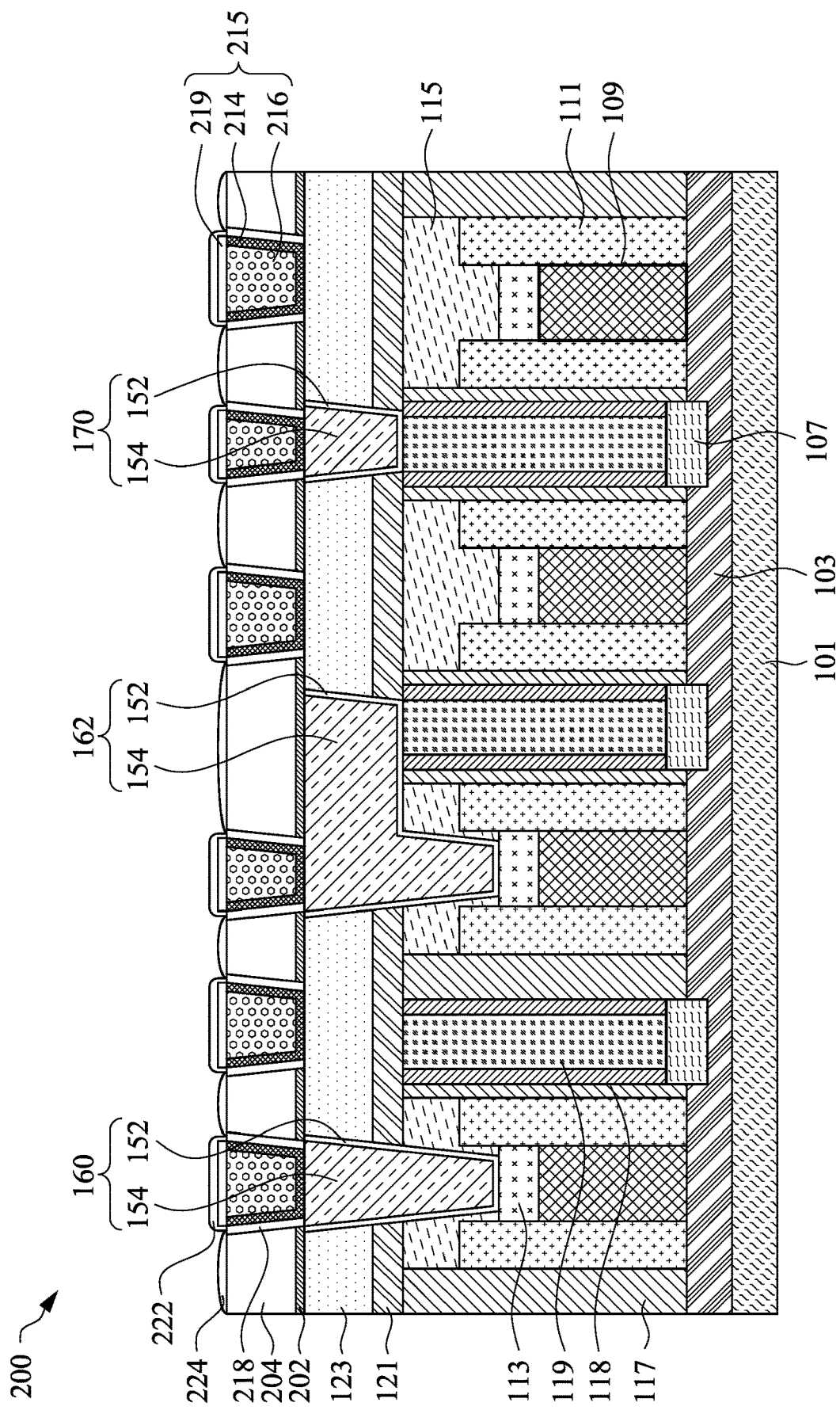

In FIG. 31, an etch stop layer (ESL) 224 is selectively formed over exposed surfaces of the dielectric layer 204. In some embodiments, sidewalls of the ESL 224 contact sidewalls of the inhibitor caps 222 over the air gaps 218. The ESL 224 extends partially over the air gaps 218 to protect them from being filled in a subsequent deposition process of more etch stop layer material (see below, FIG. 33). This may enable the maintenance of larger volume air gaps 218, which may decrease RC delay and thus increase device performance. The material of the ESL 224 is chosen to have deposition selectivity with a dielectric material (e.g., the material of the dielectric layer 204) over an organic material (e.g., the material of the inhibitor caps 222). As such, the material of the inhibitor caps 222 inhibits the formation of the ESL 224 over the inhibitor caps 222, and the ESL 224 is formed on exposed surfaces of the dielectric layer 204 at a faster rate than on exposed surfaces of the inhibitor caps 222. Sidewalls of the ESL 224 over the air gaps 218 may be convex due to the selective growth of the ESL 224.

In some embodiments, the ESL 224 comprises aluminum oxide ($Al_2O_3$), silicon oxide ($SiO_2$), silicon nitride (SiN), silicon carbonitride (SiCN), silicon oxycarbide (SiOC), boron nitride (BN), silicon boron nitride (SiBN), yttrium oxide ($Y_2O_3$), zirconium oxide ($ZrO_2$), the like, or a combination thereof. The ESL 224 may be formed with a suitable process such as ALD, PECVD, LPCVD, PVD, or the like. In some embodiments, the ESL 224 is formed with one or more reaction gases including bis(dimethylaminosilane) (BDMAS), tris(dimethylaminosilane) (TDMAS), bis (ethylmethylaminosilane) (BEMAS), bis(diethylaminosilane) (BDEAS), di(isopropyl-aminosilane) (DIPAS), 1,2-bis (diisopropylamino)disilane (BDIPADS), the like, or a combination thereof. In some embodiments, the ESL 224 is formed at a temperature in a range of 150° C. to 400° C., at a pressure in a range of 1 torr to 10 torr, and for a duration in a range of 5 minutes to 30 minutes.

Figure 32:
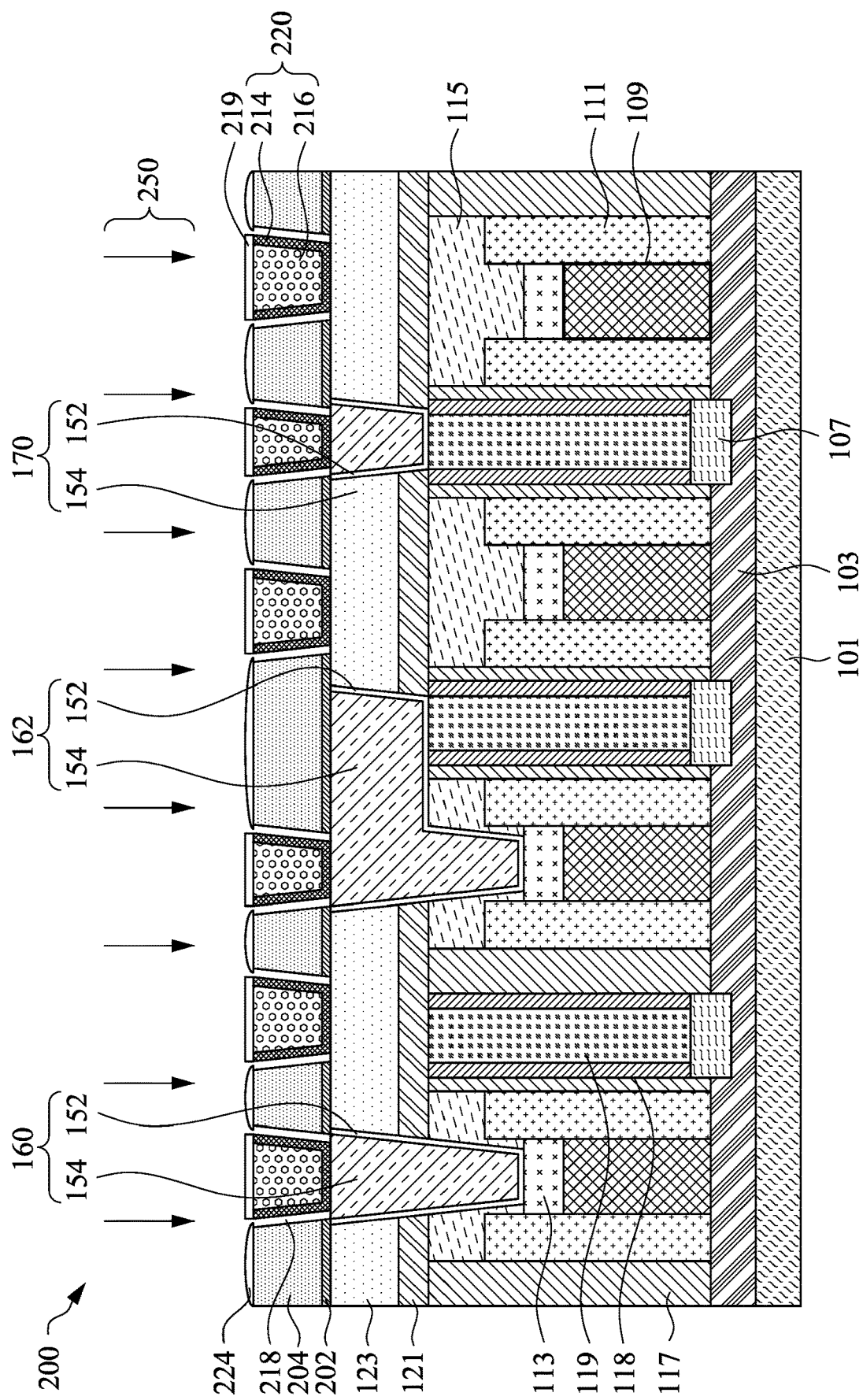

In FIG. 32, the inhibitor caps 222 are removed by a plasma treatment 250. Radicals and ions from the plasma treatment 250 react with the material of the inhibitor caps 222, converting the organic material of the inhibitor caps 222 to gas and/or water.

In some embodiments, the plasma treatment 250 includes oxygen ($O_2$), nitrogen ($N_2$), nitrous oxide ($N_2O$), nitric oxide (NO), nitrogen dioxide ($NO_2$), dioxohydrazine ($N_2O_2$), the like, or a combination thereof. The plasma treatment 250 may be performed with a plasma generation power in a range of 50 W to 500 W, at a temperature in a range of 100° C. to 400° C., and for a duration in a range of 5 seconds to 30 seconds.

The oxygen radicals and ions from the plasma treatment 250 react with the organic material of the inhibitor caps 222. In some embodiments, the reaction may be described by Eq. 1 (see above, FIG. 9). Oxygen radicals O* and ions O⁻ from the plasma treatment 250 react with the organic material $C_xH_y$ of the inhibitor caps 222 to form reaction products such as carbon dioxide and water vapor, thus removing the inhibitor caps 222.

Figure 33:
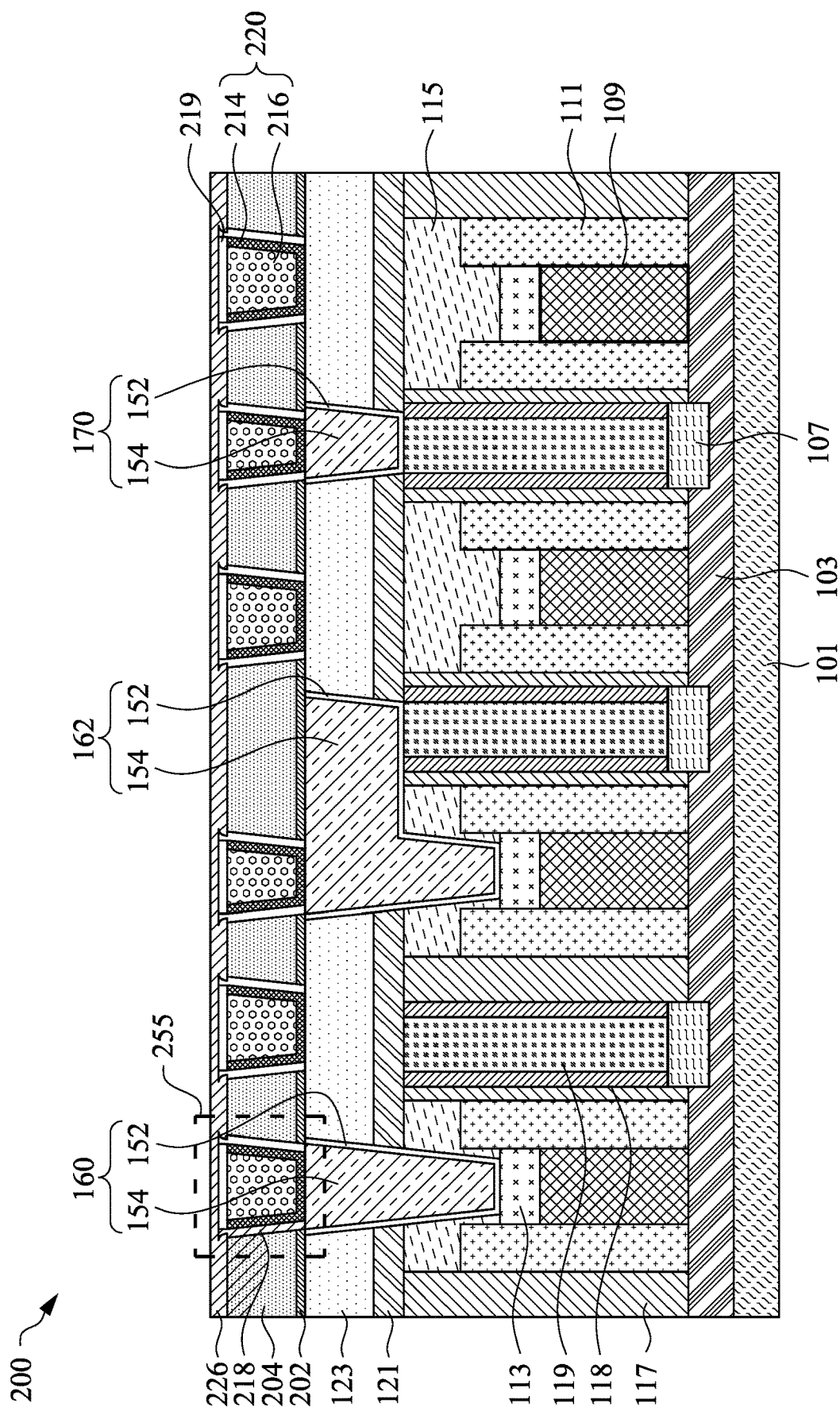

In FIG. 33, additional etch stop layer material is deposited to form, in combination with the material of the ESL 224, an ESL 226 covering top surfaces of the dielectric layer 204 and the conductive features 215 (see above, FIG. 32). The ESL 226 seals the air gaps 218, which can decrease coupling capacitance between adjacent conductive features (e.g., the conductive features 215) by 10% or greater. The ESL 202, dielectric layer 204, conductive features 215, air gaps 218, and ESL 226 together form a first interconnect level 220. The additional etch stop layer material may be formed of similar materials and by similar methods as the ESL 224 as described above with respect to FIG. 31, and the details are not repeated herein. The top surface of the ESL 226 may be flat or wavy, depending on the thickness of the ESL 226. The ESL 226 covers and seals air gaps 218 adjacent to sidewalls of the conductive features 215.

Figure 34:
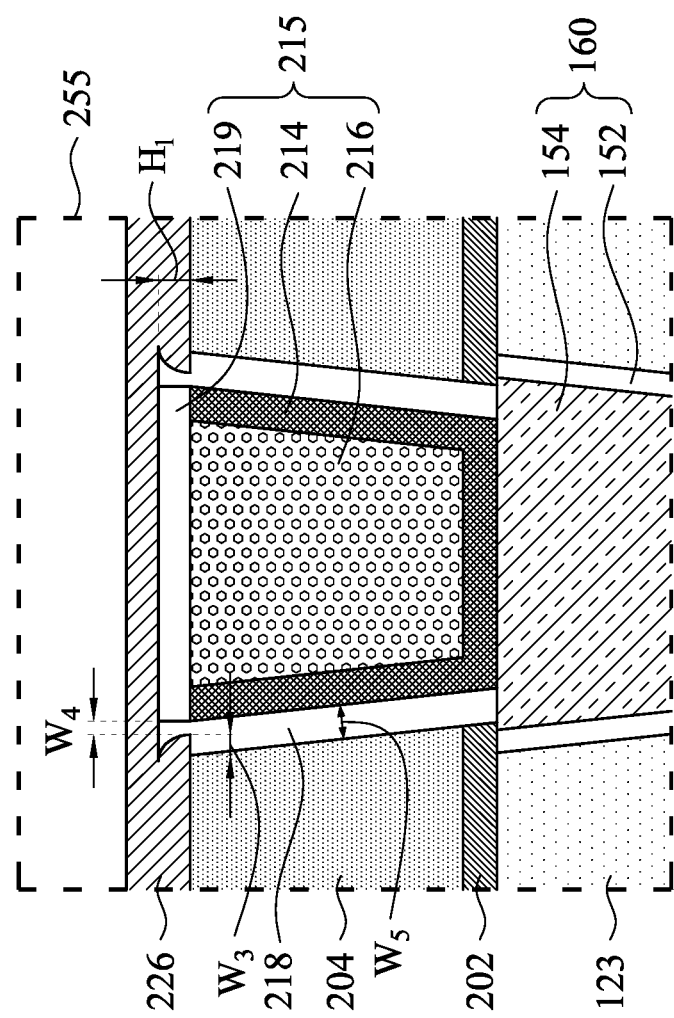

FIG. 34 illustrates a detailed view of region 255 of FIG. 33, in accordance with some embodiments. The air gap 218 extends along a sidewall of a portion of the ESL 226, and the portion of the ESL 226 extends from a sidewall of the dielectric layer 204 to overhang the air gap 218. The portion of the ESL 226 is separated from the conductive feature 215 by the air gap 218. The portion of the ESL 226 may have a convex sidewall due to the selective growth process of the portion of the ESL 226 (see above, FIG. 31). In some embodiments, the portion of the ESL 226 overhangs the air gap 218 by a third width $W_3$ less than 20 Å, such as in a range of 5 Å to 20 Å, which is advantageous for sealing the air gap 218 and decreasing device capacitance. The portion of the ESL 226 overhanging the air gap 218 by more than 20 Å may be disadvantageous by undesirably filling the air gap 218, increasing device capacitance. In some embodiments, the overhanging portion of the ESL 226 has a first height $H_1$ in a range of 10 Å to 20 Å. In some embodiments, the air gap 218 has a narrowest fourth width $W_4$ (e.g., between the overhanging portion of the ESL 226 and the conductive feature 215) in a range of 10 Å to 20 Å and a widest fifth width $W_5$ (e.g., between adjacent sidewalls of the dielectric layer 204 and the conductive feature 215) in a range of 20 Å to 40 Å.

Figure 35:
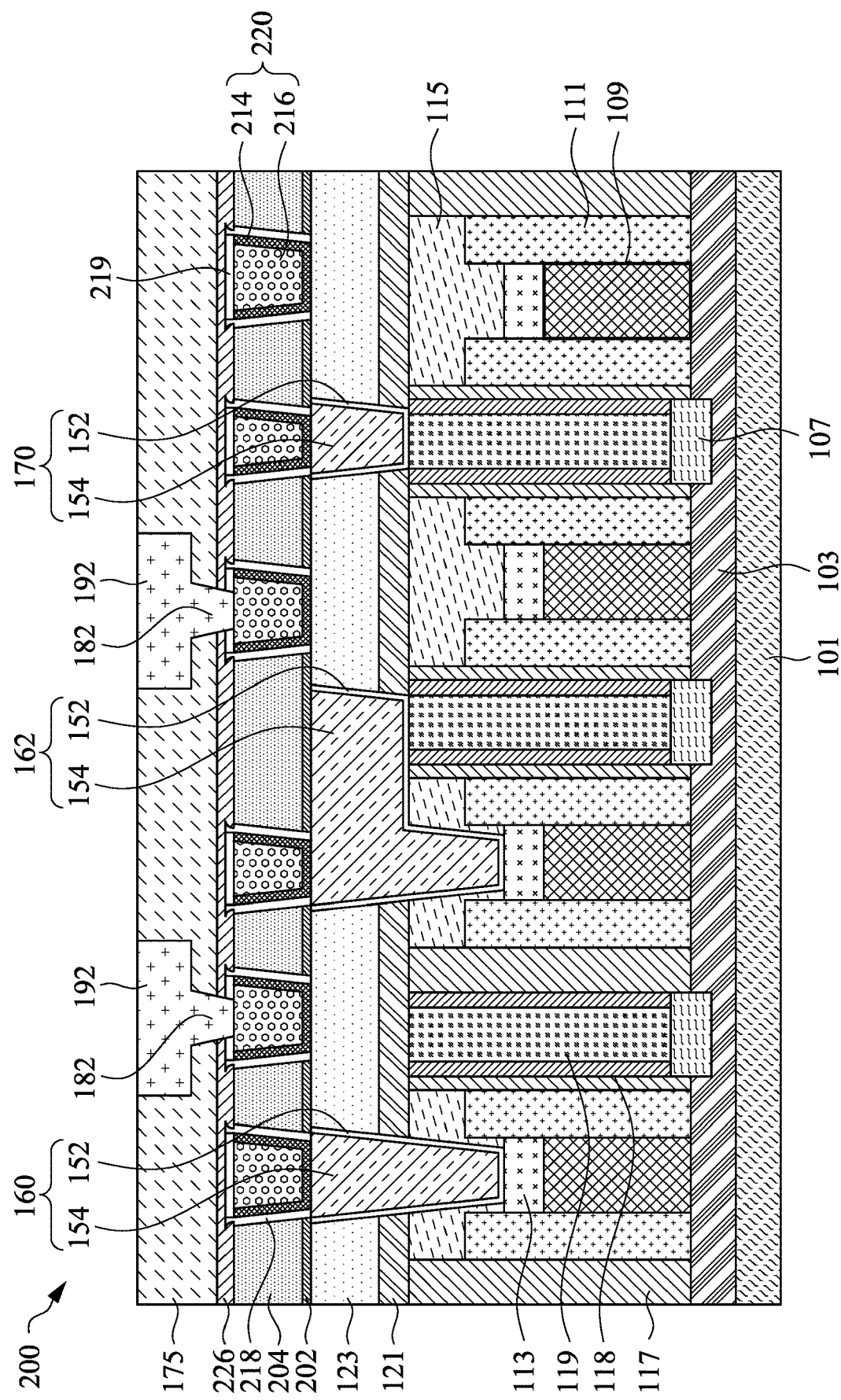

In FIG. 35, an IMD layer 175 is formed over the first interconnect level 220 and conductive vias 182 and conductive lines 192 are formed in the IMD layer 175. The IMD layer 175, conductive vias 182, and conductive lines 192 may be formed of similar materials and by similar methods as described above with respect to FIGS. 10 through 12. The conductive vias 182 extend through the ESL 226 to physically and electrically couple with underlying conductive features 215 (see above, FIG. 34). In some embodiments, additional air gaps may be formed adjacent to sidewalls of the conductive lines 192 or conductive vias 182 to decrease coupling capacitance, such as by the methods described above with respect to FIGS. 24-33.

Figure 36:
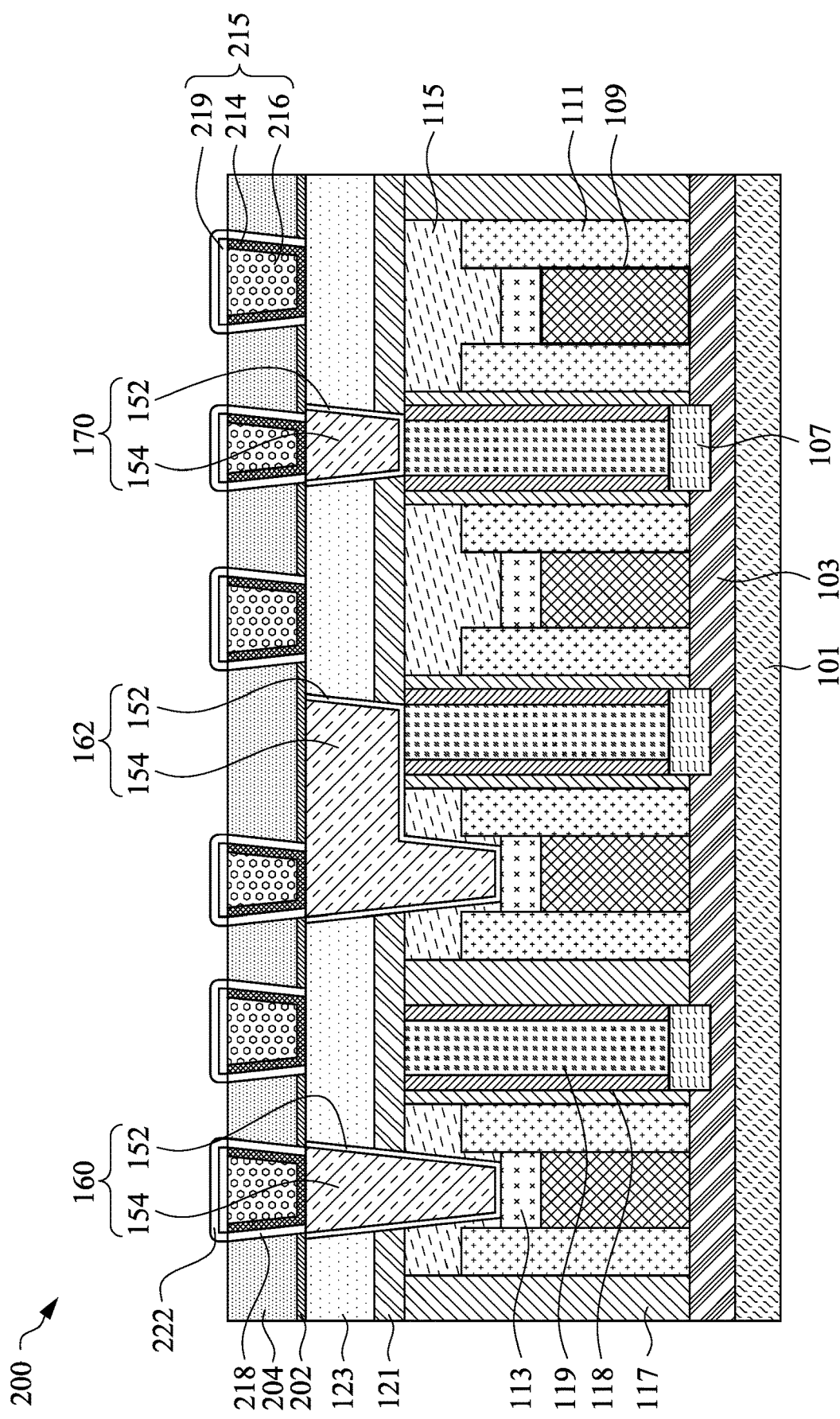
FIGS. 36 through 41 illustrate cross-sectional views of a semiconductor device at intermediate stages of manufacturing, in accordance with some embodiments.

FIGS. 36 through 41 illustrate an embodiment of the semiconductor device 200 in which portions of the ESL 226 on the dielectric layer 204 have narrower widths than the respective portions of the ESL 226 of embodiments in accordance with FIGS. 33 and 34. FIG. 36 follows from FIG. 29 and illustrates inhibitor caps 222 being formed to extend over the top surface of the dielectric layer 204, thereby sealing the air gaps 218. The inhibitor caps 222 may be formed of similar materials and by similar methods as described above with respect to FIG. 30, except that the inhibitor caps 222 are formed to a larger width such as by increasing the duration of the deposition process to a range of 5 minutes to 30 minutes.

Figure 37:
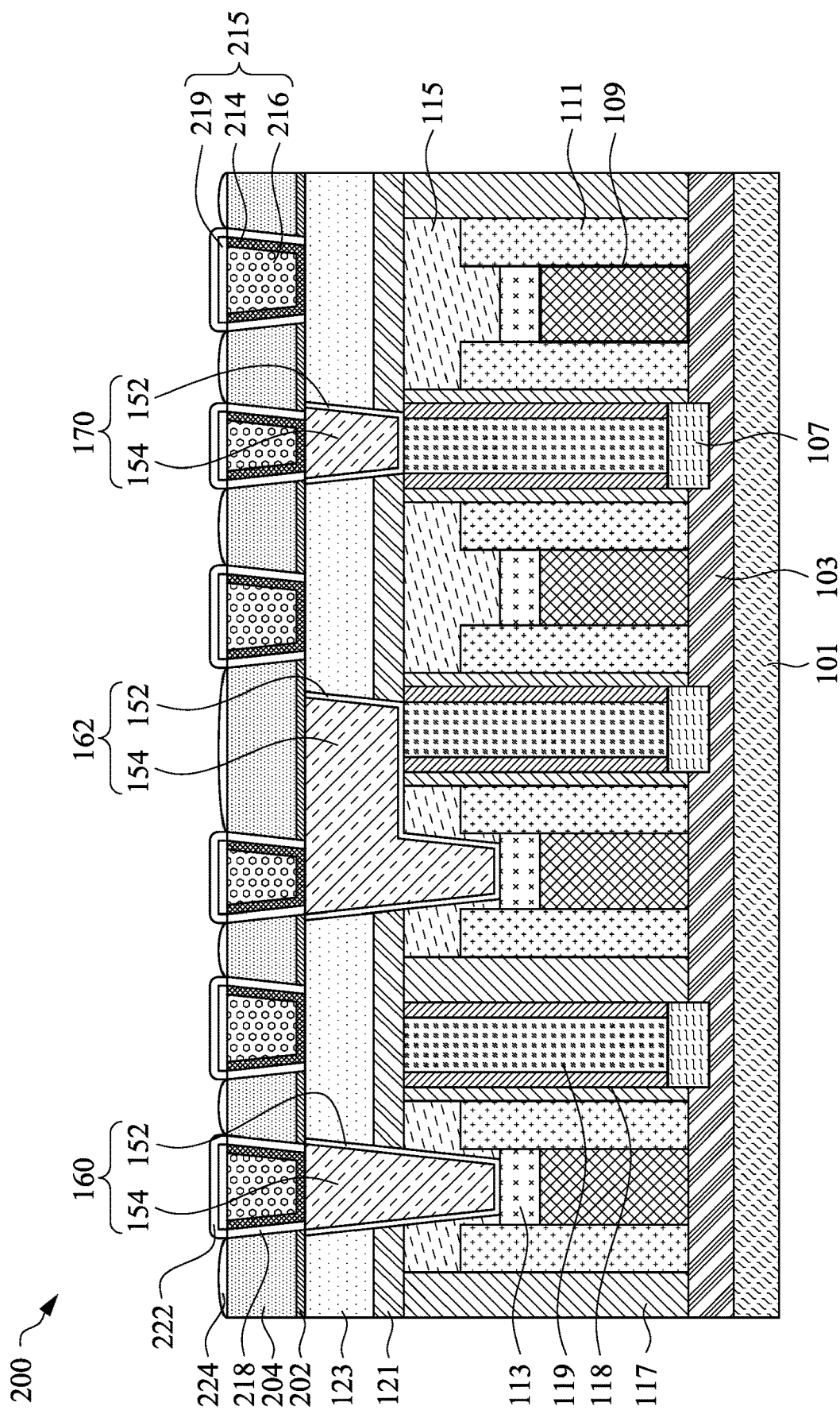

In FIG. 37, an etch stop layer (ESL) 224 is selectively formed over exposed surfaces of the dielectric layer 204. The ESL 224 may be formed of similar materials and by similar methods as described above with respect to FIG. 31, except that the ESL 224 does not extend over the air gaps 218 due to the air gaps 218 being covered by the wider inhibitor caps 222.

Figure 38:
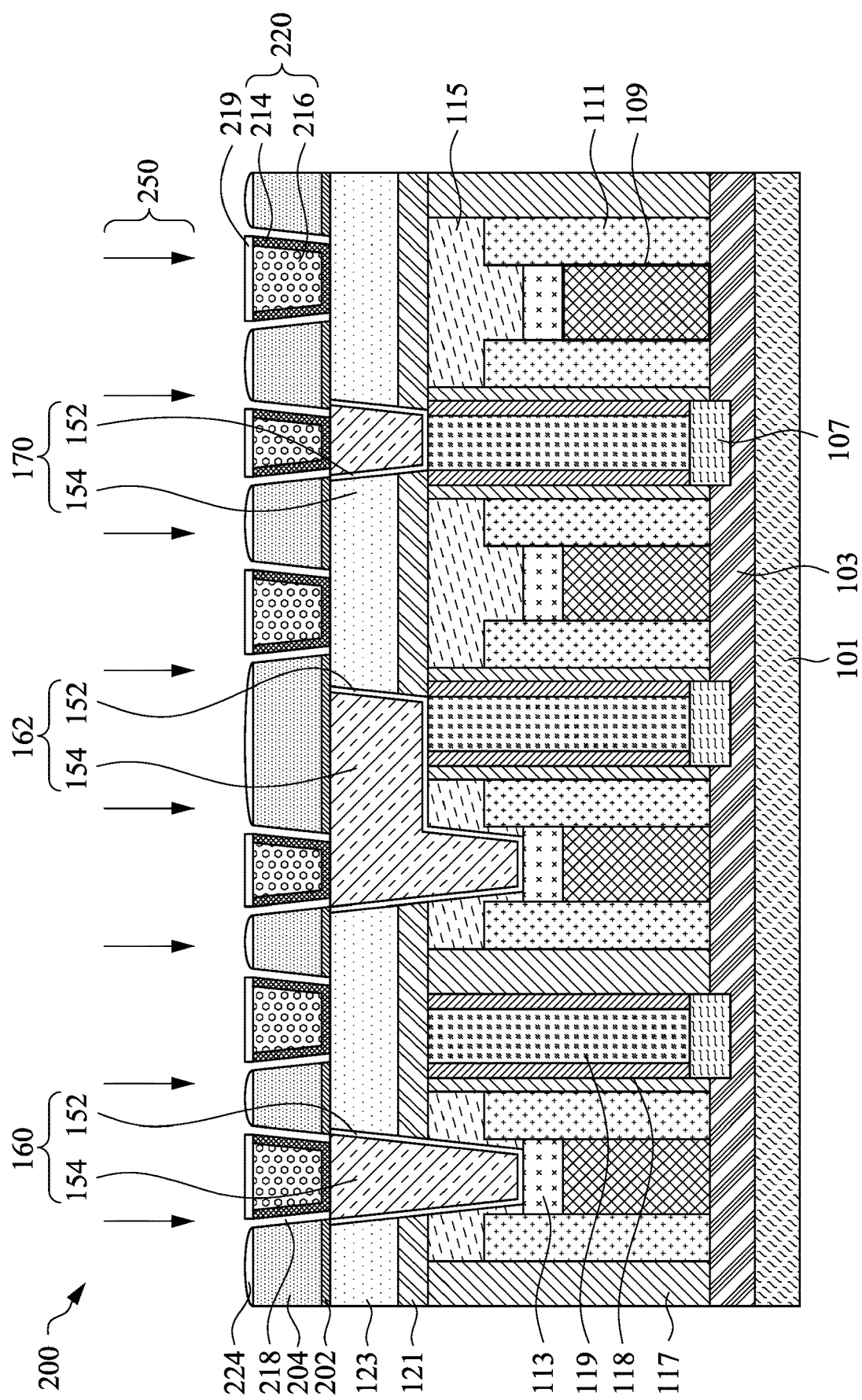

In FIG. 38, the inhibitor caps 222 are removed by a plasma treatment 250. The plasma treatment 250 may be performed by similar methods as described above with respect to FIG. 32.

Figure 39:
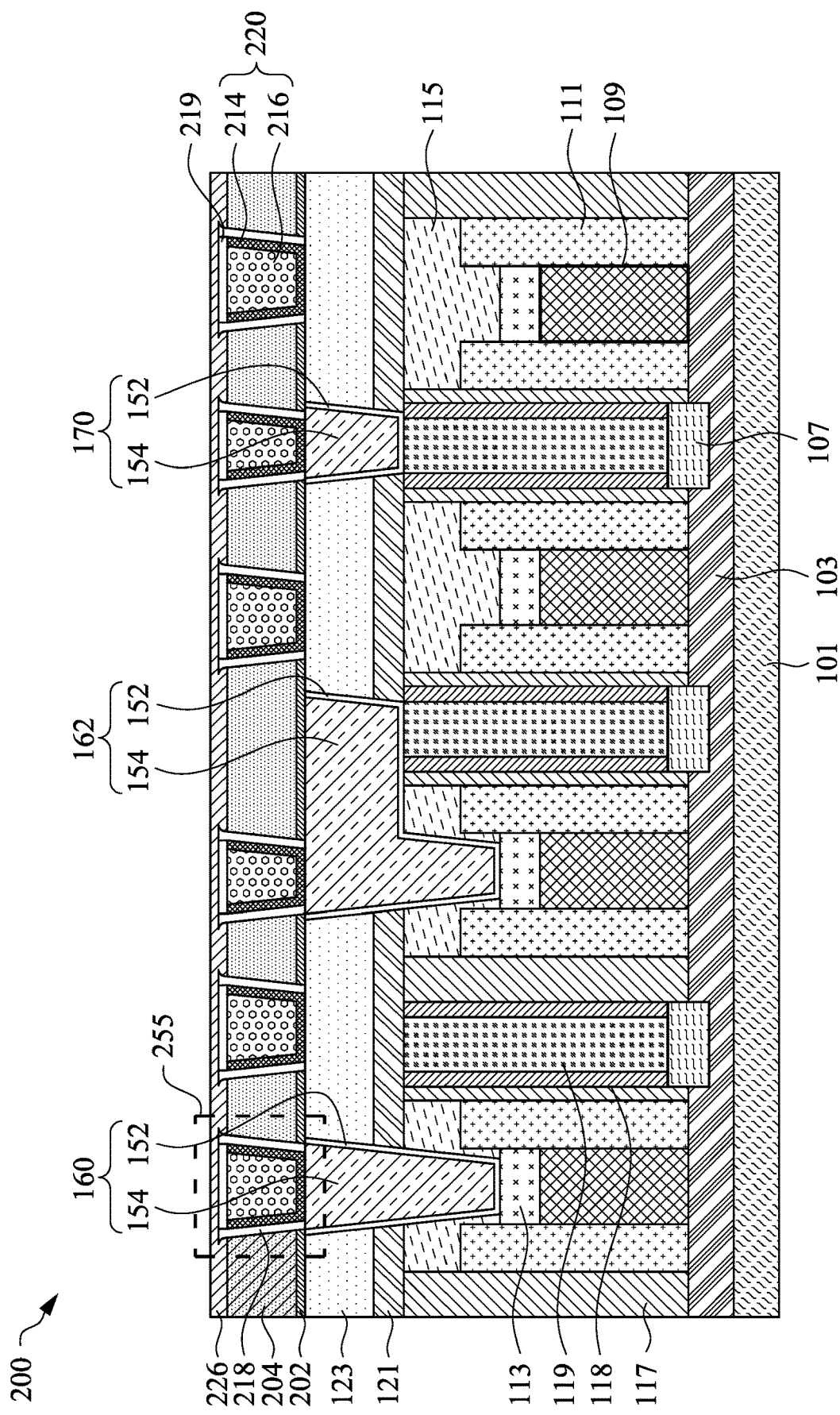

In FIG. 39, additional etch stop layer material is deposited to form, in combination with the material of the ESL 224, an ESL 226 covering top surfaces of the dielectric layer 204 and the conductive features 215 (see above, FIG. 38). The ESL 226 may be formed of similar materials and by similar methods as described above with respect to FIG. 33. The portions of the ESL 226 on the dielectric layer 204 have narrower widths than the respective portions of the ESL 226 of embodiments in accordance with FIG. 33.

Figure 40:
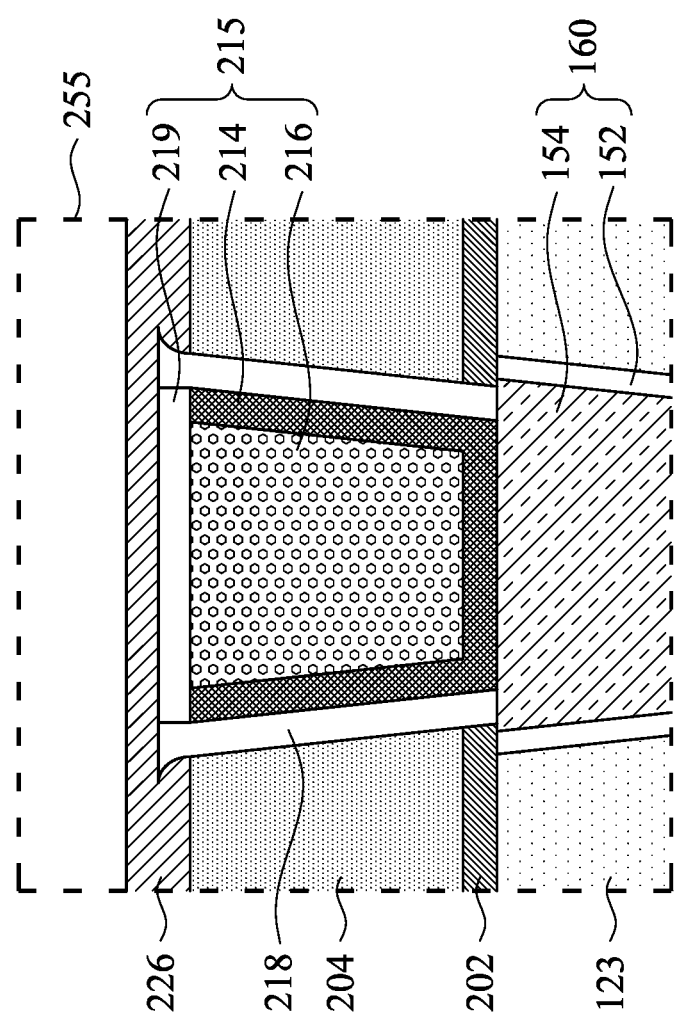

FIG. 40 illustrates a detailed view of region 255 of FIG. 39, in accordance with some embodiments. A portion of the ESL 226 over the dielectric layer 204 does not extend to overhang the air gap 218. The portion of the ESL 226 over the dielectric layer 204 may have a convex sidewall.

Figure 41:
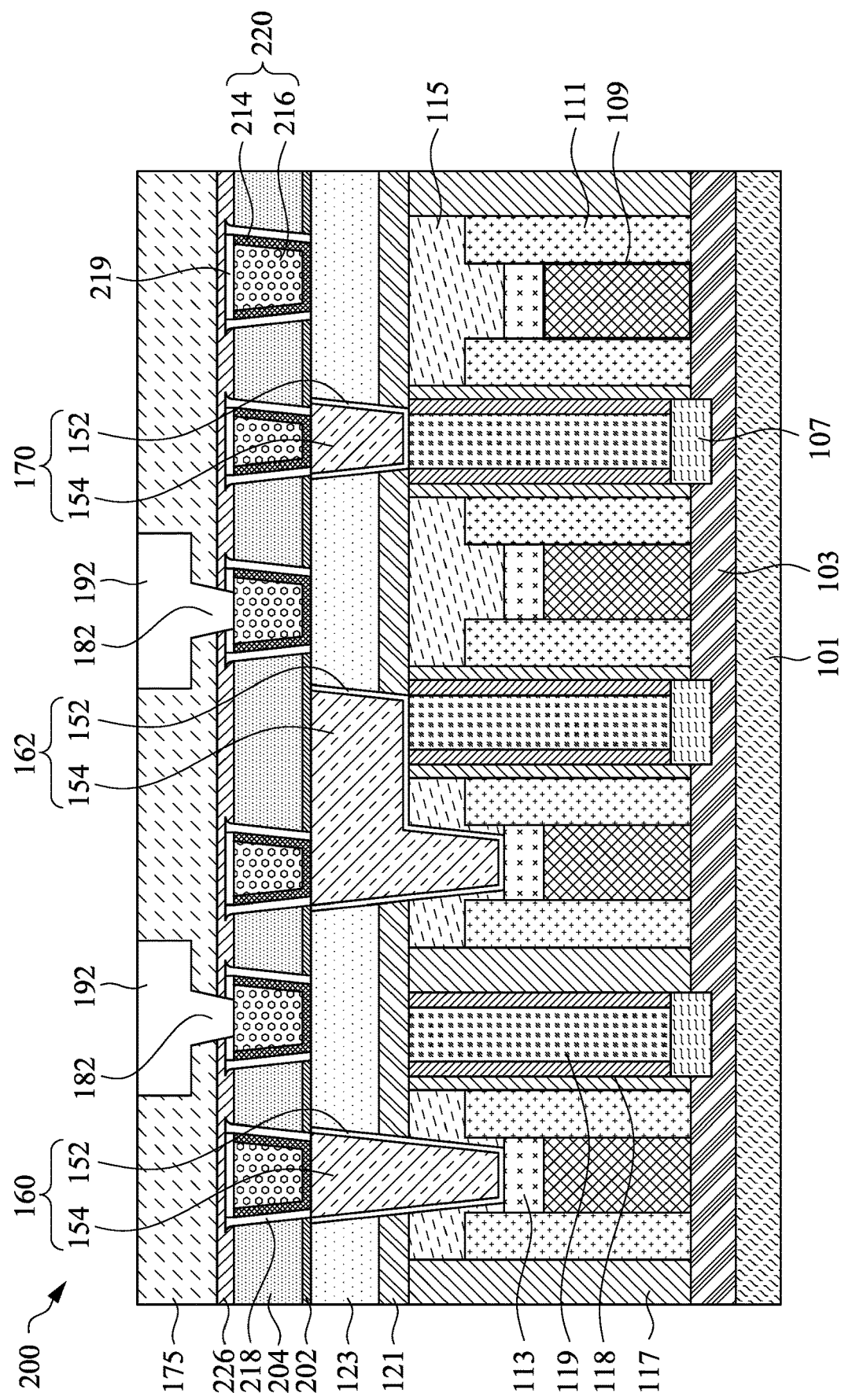

In FIG. 41, an IMD layer 175 is formed over the first interconnect level 220 and conductive vias 182 and conductive lines 192 are formed in the IMD layer 175. The IMD layer 175, conductive vias 182, and conductive lines 192 may be formed of similar materials and by similar methods as described above with respect to FIGS. 10 through 12. The conductive vias 182 extend through the ESL 226 to physically and electrically couple with underlying conductive features 215 (see above, FIG. 38).

Embodiments may achieve advantages. Air caps over conductive features of interconnect structures and/or air gaps adjacent to conductive features of interconnect structures may reduce coupling capacitance and thereby improve device performance by reducing RC delay. Air caps are formed over conductive features by the selective deposition of inhibitor caps on the conductive features that are removed after a subsequent deposition of dielectric material (e.g., etch stop layer material). Air gaps are formed adjacent to conductive features and are sealed by the selective deposition of inhibitor caps, deposition of dielectric material (e.g., etch stop layer material), removal of the inhibitor caps, and deposition of additional dielectric material to seal the air gaps.

In accordance with an embodiment, a semiconductor device includes: a first conductive feature; a first dielectric layer over the first conductive feature; a second conductive feature extending through the first dielectric layer; an air gap between the first dielectric layer and the second conductive feature; and an etch stop layer (ESL) over the second conductive feature and the first dielectric layer, wherein the ESL covers the air gap, and wherein the air gap extends above a bottommost surface of the ESL. In an embodiment, the air gap extends along a sidewall of a portion of the ESL, the portion of the ESL being separated from the second conductive feature by the air gap. In an embodiment, the portion of the ESL has a convex sidewall. In an embodiment, the portion of the ESL extends over the air gap by a width less than 20 Å. In an embodiment, the second conductive feature includes a capping layer, the capping layer being a top surface of the second conductive feature, the capping layer including cobalt or ruthenium. In an embodiment, the capping layer has a thickness in a range of 10 Å to 30 Å.

In accordance with another embodiment, a method of manufacturing a semiconductor device includes: forming a first interconnect level over a substrate, the first interconnect level including a dielectric layer and a first conductive feature through the dielectric layer; depositing an inhibitor cap on a top surface of the first conductive feature, wherein a top surface of the dielectric layer remains exposed after depositing the inhibitor cap; forming an etch-resistant layer on the top surface of the dielectric layer, wherein a top surface of the inhibitor cap remains exposed after forming the etch-resistant layer; depositing an etch stop layer (ESL) over the etch-resistant layer and the inhibitor cap; removing the inhibitor cap with a plasma treatment, wherein after removing the inhibitor cap, an air cap remains between the first conductive feature and the ESL; and forming a second interconnect level over the first interconnect level, wherein a conductive via of the second interconnect level extends through the ESL to a top surface of the first conductive feature. In an embodiment, the inhibitor cap includes an organosilane, polyimide, or polyamide. In an embodiment, the inhibitor cap is deposited at a temperature in a range of 40° C. to 300° C., at a pressure in a range of 1 torr to 10 torr, and for a duration in a range of 30 seconds to 30 minutes. In an embodiment, the etch-resistant layer is formed at a temperature in a range of 40° C. to 300° C., at a pressure in a range of 1 torr to 10 torr, and for a duration in a range of 30 seconds to 30 minutes. In an embodiment, the etch-resistant layer is deposited to a thickness of 30 Å or less. In an embodiment, the ESL includes aluminum oxide. In an embodiment, the ESL is deposited to a thickness of 10 Å or less. In an embodiment, the plasma treatment reacts with material of the inhibitor cap to form carbon dioxide and water. In an embodiment, reaction products of the plasma treatment with the inhibitor cap diffuse through the ESL.

In accordance with yet another embodiment, a method of manufacturing a semiconductor device includes: forming a first dielectric layer over a first conductive feature; forming an opening extending at least through the first dielectric layer, the opening exposing the first conductive feature; forming a sacrificial layer in the opening along sidewalls of the first dielectric layer; filling remaining portions of the opening with a second conductive feature; forming an air gap between the first dielectric layer and the second conductive feature by removing the sacrificial layer; growing an inhibitor cap over the second conductive feature, the inhibitor cap extending partially over the air gap; forming a first ESL over a top surface of the first dielectric layer; removing the inhibitor cap with a plasma treatment; and depositing an additional etch stop material on the first ESL to cover the air gap and the second conductive feature. In an embodiment, growing the inhibitor cap forms a gap between the inhibitor cap and the first dielectric layer, a width of the gap being less than 5 Å. In an embodiment, a portion of the first ESL has a convex sidewall along the air gap. In an embodiment, a top surface of the second conductive feature is a capping layer, the inhibitor cap being grown on the capping layer. In an embodiment, the method further includes forming a second ESL over the first conductive feature prior to forming the first dielectric layer, wherein forming the opening includes forming the opening through the second ESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming a first interconnect level over a substrate, the first interconnect level comprising a dielectric layer and a first conductive feature through the dielectric layer;

depositing an inhibitor cap on a top surface of the first conductive feature, wherein a top surface of the dielectric layer remains exposed after depositing the inhibitor cap;

forming an etch-resistant layer on the top surface of the dielectric layer, wherein a top surface of the inhibitor cap remains exposed after forming the etch-resistant layer;

depositing an etch stop layer (ESL) over the etch-resistant layer and the inhibitor cap;

removing the inhibitor cap with a plasma treatment, wherein after removing the inhibitor cap, an air gap remains between the first conductive feature and the ESL; and forming a second interconnect level over the first interconnect level, wherein a conductive via of the second interconnect level extends through the ESL to the top surface of the first conductive feature.

2. The method of claim 1, wherein the inhibitor cap comprises an organosilane, polyimide, or polyamide.

3. The method of claim 1, wherein the inhibitor cap is deposited at a temperature in a range of 40° C. to 300° C., at a pressure in a range of 1 torr to 10 torr, and for a duration in a range of 30 seconds to 30 minutes.

4. The method of claim 1, wherein the etch-resistant layer is formed at a temperature in a range of 40° C. to 300° C., at a pressure in a range of 1 torr to 10 torr, and for a duration in a range of 30 seconds to 30 minutes.

5. The method of claim 1, wherein the etch-resistant layer is deposited to a thickness of 30 Å or less.

6. The method of claim 1, wherein the ESL comprises aluminum oxide.

7. The method of claim 1, wherein the ESL is deposited to a thickness of 10 Å or less.

8. The method of claim 1, wherein the plasma treatment reacts with material of the inhibitor cap to form carbon dioxide and water.

9. The method of claim 1, wherein reaction products of the plasma treatment with the inhibitor cap diffuse through the ESL.

10. A method of manufacturing a semiconductor device, the method comprising:
forming a first dielectric layer over a first conductive feature;
forming an opening extending at least through the first dielectric layer, the opening exposing the first conductive feature;
forming a sacrificial layer in the opening along sidewalls of the first dielectric layer;
filling remaining portions of the opening with a second conductive feature;
forming an air gap between the first dielectric layer and the second conductive feature by removing the sacrificial layer;
growing an inhibitor cap over the second conductive feature, the inhibitor cap extending partially over the air gap;
forming a first etch stop layer (ESL) over a top surface of the first dielectric layer;
removing the inhibitor cap with a plasma treatment; and
depositing an additional etch stop material on the first ESL to cover the air gap and the second conductive feature.

11. The method of claim 10, wherein growing the inhibitor cap forms a gap between the inhibitor cap and the first dielectric layer, a width of the gap being less than 5 Å.

12. The method of claim 10, wherein a portion of the first ESL has a convex sidewall along the air gap.

13. The method of claim 10, wherein a top surface of the second conductive feature is a capping layer, the inhibitor cap being grown on the capping layer.

14. The method of claim 13, further comprising forming a second ESL over the first conductive feature prior to forming the first dielectric layer, wherein forming the opening comprises forming the opening through the second ESL.

15. A method of manufacturing a semiconductor device, the method comprising:
forming a first dielectric layer over a first conductive feature;
forming an opening extending through the first dielectric layer, wherein the opening exposes the first conductive feature;
forming a second conductive feature in the opening on the first conductive feature;
growing an inhibitor cap over the second conductive feature; and
forming a second dielectric layer over a top surface of the first dielectric layer, wherein forming the second dielectric layer comprises:
forming a first portion of the second dielectric layer over the top surface of the first dielectric layer;
removing the inhibitor cap; and
after removing the inhibitor cap, forming a second portion of the second dielectric layer, wherein an air gap is between the first dielectric layer and the second conductive feature, wherein the second dielectric layer covers the air gap, and wherein the air gap extends above a bottom surface of the first portion of the second dielectric layer.

16. The method of claim 15, wherein the air gap extends along a sidewall of the first portion of the second dielectric layer, and wherein the first portion of the second dielectric layer is separated from the second conductive feature by the air gap.

17. The method of claim 16, wherein the sidewall of the first portion of the second dielectric layer is convex.

18. The method of claim 15, wherein the first portion of the second dielectric layer has a width less than 20 Å over the air gap.

19. The method of claim 15, wherein the second conductive feature comprises a capping layer, wherein the capping layer is a top portion of the second conductive feature, and wherein the capping layer comprises cobalt or ruthenium.

20. The method of claim 19, wherein the capping layer has a thickness in a range from 10 Å to 30 Å.

* * * * *